(12) United States Patent
Horie

(10) Patent No.: US 9,997,677 B2
(45) Date of Patent: *Jun. 12, 2018

(54) ILLUMINATION METHOD AND LIGHT-EMITTING DEVICE

(71) Applicant: CITIZEN ELECTRONICS CO., LTD., Fujiyoshida-shi (JP)

(72) Inventor: Hideyoshi Horie, Odawara (JP)

(73) Assignee: CITIZEN ELECTRONICS CO., LTD., Fujiyoshida-shi (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/582,783

(22) Filed: May 1, 2017

(65) Prior Publication Data

US 2017/0236983 A1   Aug. 17, 2017

Related U.S. Application Data

(63) Continuation of application No. 15/266,377, filed on Sep. 15, 2016, now Pat. No. 9,818,914, which is a (Continued)

(30) Foreign Application Priority Data

Sep. 2, 2011 (JP) .................. 2011-192141
Sep. 2, 2011 (JP) .................. 2011-192143

(51) Int. Cl.
*H01L 33/50* (2010.01)
*H01L 33/32* (2010.01)
(Continued)

(52) U.S. Cl.
CPC ......... *H01L 33/504* (2013.01); *H01L 33/06* (2013.01); *H01L 33/28* (2013.01); *H01L 33/32* (2013.01)

(58) Field of Classification Search
CPC combination set(s) only.
See application file for complete search history.

(56) References Cited

U.S. PATENT DOCUMENTS 5,803,579 A    9/1998 Turnbull et al.
6,132,072 A   10/2000 Turnbull et al.
(Continued)

FOREIGN PATENT DOCUMENTS

CN     1249530 A    4/2000
EP     0 936 682    8/1999
(Continued)

OTHER PUBLICATIONS

Office Action dated May 9, 2017, in Japanese Application No. 2016-128778, (with computer-generated English translation).
(Continued)

*Primary Examiner* — Ratisha Mehta
(74) *Attorney, Agent, or Firm* — Oblon, McClelland, Maier & Neustadt, L.L.P.

(57) ABSTRACT

To provide an illumination method and a light-emitting device which are capable of achieving, under an indoor illumination environment where illuminance is around 5000 lx or lower when performing detailed work and generally around 1500 lx or lower, a color appearance or an object appearance as perceived by a person, will be as natural, vivid, highly visible, and comfortable as though perceived outdoors in a high-illuminance environment, regardless of scores of various color rendition metric. Light emitted from the light-emitting device illuminates an object such that light measured at a position of the object satisfies specific requirements. A feature of the light-emitting device is that light emitted by the light-emitting device in a main radiant direction satisfies specific requirements.

11 Claims, 42 Drawing Sheets

CCT = 5500K
Duv = 0.0000
Ra = 95

Related U.S. Application Data continuation of application No. 14/927,746, filed on Oct. 30, 2015, now Pat. No. 9,490,399, which is a continuation of application No. 14/196,662, filed on Mar. 4, 2014, now Pat. No. 9,305,970, which is a continuation of application No. PCT/JP2012/072143, filed on Aug. 31, 2012.

(51) Int. Cl.
*H01L 33/28* (2010.01)
*H01L 33/06* (2010.01)

(56) References Cited

U.S. PATENT DOCUMENTS

| | | | |
|---|---|---|---|
| 6,459,197 | B1 | 10/2002 | Mori et al. |
| 6,523,976 | B1 | 2/2003 | Turnbull et al. |
| 7,453,195 | B2 | 11/2008 | Radkov |
| 8,373,338 | B2 | 2/2013 | Beers |
| 9,305,970 | B2 * | 4/2016 | Horie |
| 9,373,757 | B2 * | 6/2016 | Horie |
| 9,490,399 | B2 * | 11/2016 | Horie ........................ F21K 9/00 |
| 9,722,150 | B2 * | 8/2017 | Horie .................... H01L 33/504 |
| 2002/0070681 | A1 | 6/2002 | Shimizu et al. |
| 2003/0156425 | A1 | 8/2003 | Turnbull et al. |
| 2008/0106734 | A1 | 5/2008 | Katabe |
| 2008/0297027 | A1 | 12/2008 | Miller et al. |
| 2009/0122530 | A1 | 5/2009 | Beers et al. |
| 2010/0194291 | A1 | 8/2010 | Ishiwata |
| 2010/0244700 | A1 | 9/2010 | Chong et al. |
| 2010/0295464 | A1 | 11/2010 | Kasakura et al. |
| 2011/0068698 | A1 | 3/2011 | Swoboda et al. |
| 2011/0211336 | A1 | 9/2011 | Oshio |
| 2012/0008318 | A1 | 1/2012 | Ishiwata et al. |
| 2012/0112626 | A1 | 5/2012 | Sakuta et al. |
| 2012/0212123 | A1 | 8/2012 | Sakuta et al. |
| 2012/0267999 | A1 | 10/2012 | Sakuta et al. |
| 2012/0286646 | A1 | 11/2012 | Sakuta et al. |
| 2012/0319565 | A1 | 12/2012 | Sakuta et al. |
| 2013/0264937 | A1 | 10/2013 | Sakuta et al. |
| 2013/0277694 | A1 | 10/2013 | Sakuta et al. |
| 2014/0217417 | A1 | 8/2014 | Horie |
| 2016/0072020 | A1 | 3/2016 | Horie |

FOREIGN PATENT DOCUMENTS

| | | |
|---|---|---|
| JP | 3503139 | 12/2003 |
| JP | 2007-141737 A | 6/2007 |
| JP | 2007-299714 A | 11/2007 |
| JP | 2008-112811 A | 5/2008 |
| JP | 2009-048989 | 3/2009 |
| JP | 2009-060094 | 3/2009 |
| JP | 2009-99510 | 5/2009 |
| JP | 2010-232529 A | 10/2010 |
| JP | 2011-9078 A | 1/2011 |
| JP | 2011-072388 | 4/2011 |
| JP | 2011-159809 | 8/2011 |
| JP | 2011-181579 A | 9/2011 |
| JP | 2012-60097 A | 3/2012 |
| JP | 2012-104814 A | 5/2012 |
| JP | 2012-113958 A | 6/2012 |
| JP | 2013-93311 A | 5/2013 |
| WO | WO 2009/063915 A1 | 5/2009 |
| WO | WO 2009/082737 A1 | 7/2009 |
| WO | 2010/126065 | 11/2010 |
| WO | 2011/024818 | 3/2011 |
| WO | WO 2011/070473 A1 | 6/2011 |

OTHER PUBLICATIONS

International Search Report dated Oct. 2, 2012 in PCT/JP2012/072143 filed Aug. 31, 2012.
General-purpose fluorescent light Meat-kun, (online), Prince Electric Co., Ltd., (retrieved on May 16, 2011), Internet http://www.prince-d.co.jp/pdct/docs/pdf/catalog_pdf/f1_nrb_ca2011.pdf.
LEDs Magazine, (retrieved on Aug. 22, 2011), Internet http://www.ledsmagazine.com/news/8/8/2.
European Search Report dated Apr. 20, 2016, in corresponding European patent application No. EP 12 82 7440.
Chinese Search Report dated Apr. 15, 2014 in corresponding Chinese Application No. 201280005134.1 with English Translation.
Notification of Transmittal of Translation of the International Preliminary Report on Patentability dated Mar. 13, 2014 in PCT/JP2012/072143 filed Aug. 31, 2012.
International Search Report dated Oct. 2, 2012 in PCT/JP2012/072144.
English translation of the Written Opinion dated Oct. 2, 2012 in PCT/JP2012/072144.
International Search Report dated Sep. 10, 2013 in PCT/JP2013/066601.
English translation of the Written Opinion dated Sep. 10, 2013 in PCT/JP2013/066601.
International Search Report dated Mar. 31, 2015 in PCT/JP2014/084487.
English translation of the Written Opinion dated Mar. 31, 2015 in PCT/JP2014/084487.
Extended European Search Report dated Oct. 24, 2016 in Patent Application No. 14761235.2.
Rejection Decision in Chinese Patent Application No. 201510756038.6 dated Sep. 4, 2017, with English-language machine translation.

* cited by examiner

ILLUMINATION METHOD AND LIGHT-EMITTING DEVICE

CROSS-REFERENCE TO RELATED APPLICATIONS

This is a continuation of U.S. patent application Ser. No. 15/266,377, filed Sep. 15, 2016, now allowed, which is a continuation of U.S. patent application Ser. No. 14/927,746, filed Oct. 30, 2015, now patented, which is a continuation of U.S. patent application Ser. No. 14/196,662, filed Mar. 4, 2014, now patented, which is a continuation of International Application No. PCT/JP2012/072143, filed Aug. 31, 2012, designating the U.S., the disclosures of which are incorporated herein by reference in their entireties. This application claims priority to Japanese Patent Application No. 2011-192141, filed Sep. 2, 2011, and Japanese Patent Application No. 2011-192143, filed Sep. 2, 2011, the disclosures of which are incorporated herein by reference in their entireties.

TECHNICAL FIELD

The present invention relates to an illumination method by which light emitted from a light-emitting device illuminates an object, and to a light-emitting device in general incorporating a light-emitting element.

BACKGROUND ART

Recent advances toward higher output and higher efficiency in GaN related semiconductor light-emitting elements have been dramatic. In addition, active research is underway to increase efficiency of semiconductor light-emitting elements and various phosphors that use an electron beam as an excitation source. As a result, power-saving capabilities of today's light-emitting devices such as light sources, light source modules including light sources, fixtures including light source modules, and systems including fixtures are advancing rapidly as compared to their conventional counterparts.

For example, it is widely popular to incorporate a GaN related blue light-emitting element as an excitation light source of a yellow phosphor and create a so-called pseudo-white light source from a spectrum of the GaN related blue light-emitting element and a spectrum of the yellow phosphor, use the pseudo-white light source as an illumination light source or create a lighting fixture that incorporates the pseudo-white light source or, further, fabricate a lighting system in which a plurality of such fixtures are arranged in a space (refer to Patent Document 1).

Among packaged LEDs (for example, those that include the GaN related blue light-emitting element, the yellow phosphor, an encapsulant, and the like in a package material) which are a type of an illumination light source that can be incorporated into such modes, there are products with luminous efficacy of a source as a packaged LED exceeding 150 lm/W in a correlated color temperature (CCT) region of around 6000 K (refer to Non-Patent Document 2).

Furthermore, similar advances toward higher efficiency and greater power saving are being made in light sources for liquid crystal display (LCD) backlighting and the like.

However, many have pointed out that such light-emitting devices aiming for higher efficiency do not give sufficient consideration to color appearance. In particular, when used for illumination purposes, "color appearance" when illuminating an object with a light-emitting device such as a light source, fixture, system, or the like is extremely important together with increasing efficiency of the light-emitting device.

Attempts to address this issue include superimposing a spectrum of a red phosphor or a red semiconductor light-emitting element on a spectrum of a blue light-emitting element and a spectrum of a yellow phosphor in order to improve scores of a color rendering index (CRI) (CIE (13.3)) as established by the International Commission on Illumination (Commission Internationale de l'Eclairage/CIE). For example, while an average color rendering index $(R_a)$ and a special color rendering index $(R_9)$ with respect to a vivid red color sample for a typical spectrum (CCT=around 6800 K) that does not include a red source are $R_a=81$ and $R_9=24$ respectively, the scores of the color rendering indices can be improved to $R_a=98$ and $R_9=95$ when a red source is included (refer to Patent Document 2).

In addition, another attempt involves adjusting a spectrum emitted from a light-emitting device particularly for special illumination applications so that color appearance of an object is based on a desired color. For example, Non-Patent Document 1 describes a red-based illumination light source.

Patent Document 1: Japanese Patent Publication No. 3503139
Patent Document 2: WO2011/024818
Non-Patent Document 1: General-purpose fluorescent light Meat-kun, [online], Prince Electric Co., LTD., [retrieved on May 16, 2011], Internet <URL: http://www.prince-d.co.jp/pdct/docs/pdf/catalog_pdf/fl_nrb_ca2011.pdf>
Non-Patent Document 2: LEDs MAGAZINE, [retrieved on Aug. 22, 2011], Internet <URL: http://www.ledsmagazine.com/news/8/8/2>

A color rendering index is an index which indicates how close a color appearance is, when illuminating with light (test light) of a light-emitting device that is an evaluation object, compared to a color appearance when illuminating with a "reference light" that is selected in correspondence with a CCT of the test light. In other words, a color rendering index is an index indicating fidelity of the light-emitting device that is an evaluation object. However, recent studies have made it increasingly clear that a high average color rendering index $(R_a)$ or a high special color rendering index $(R_i$ (where i ranges from 1 to 14 or, in Japan, ranges from 1 to 15 pursuant to JIS) does not necessarily lead to favorable color perception in a person. In other words, there is a problem that the aforementioned methods for improving color rendering index scores do not always achieve favorable color appearance.

Furthermore, the effect of illuminance of an illuminated object causing a variation in color appearance is not included in various color rendition metric that are currently in use. It is an everyday experience that a vivid color of a flower seen outdoors where illuminance is normally around 10000 lx or higher becomes dull once the flower is brought indoors where illuminance is around 500 lx as though the flower itself has changed to a different flower with lower chroma, even though the color is fundamentally the same. Generally, saturation regarding the color appearance of an object is dependent on illuminance, and saturation decreases as illuminance decreases even though a spectral power distribution that is being illuminated is unchanged. In other words, color appearance becomes dull. This effect is known as the Hunt effect.

Despite having a significant effect on color rendering property, as things stand, the Hunt effect is not actively considered for overall evaluation of a light-emitting device such as a light source, a fixture, or a system. In addition, while the simplest way to compensate for the Hunt effect is to dramatically increase indoor illuminance, this causes an unnecessary increase in energy consumption. Furthermore, a specific method of achieving a color appearance or an object appearance that is as natural, vivid, highly visible, and comfortable as perceived outdoors under illuminance comparable to an indoor illumination environment remains to be revealed.

Meanwhile, with light having its spectrum adjusted so as to, for example, increase chroma of red to be used for special illumination in restaurants or for food illumination, there is a problem that hue (angle) deviation increases in comparison to reference light as evidenced by yellow appearing reddish or blue appearing greenish. In other words, the color appearance of colors other than a specific color of an illuminated object becomes unnatural. Another problem is that when a white object is illuminated by such light, the white object itself appears colored and is no longer perceived as being white.

DISCLOSURE OF THE INVENTION

The present invention has been made in order to solve problems such as those described above, and a primary object of the present invention is to provide an illumination method and an overall light-emitting device such as an illumination light source, a lighting fixture, and a lighting system which are capable of achieving, under an indoor illumination environment where illuminance is around 5000 lx or lower including cases where detailed work is performed and generally around 1500 lx or lower, a color appearance or an object appearance as perceived by a person which is as natural, vivid, highly visible, and comfortable as perceived outdoors in a high-illuminance environment regardless of scores of various color rendition metric. Another object of the present invention is to achieve a highly efficient and comfortable illuminated environment. Yet another object of the present invention is to provide a design guideline for such favorable light-emitting devices.

In order to achieve the objects described above, a first embodiment of the present invention relates to the following.

[1] An illumination method comprising: illuminated objects preparation step of preparing illuminated objects; and an illumination step of illuminating the objects by light emitted from light-emitting devices, wherein in the illumination step, when light emitted from the light-emitting devices illuminate the objects, the objects are illuminated so that the light measured at a position of the objects satisfies (1), (2), and (3) below:

(1) a distance $D_{uvSSL}$ from a black-body radiation locus as defined by ANSI C78.377 of the light measured at the position of the objects satisfies $-0.0325 \leq D_{uvSSL} \leq -0.0075$;

(2) if an a* value and a b* value in CIE 1976 L*a*b* color space of 15 Munsell renotation color samples from #01 to #15 listed below when mathematically assuming illumination by the light measured at the position of the objects are respectively denoted by $a^*_{nSSL}$ and $b^*_{nSSL}$ (where n is a natural number from 1 to 15), and if an a* value and a b* value in CIE 1976 L*a*b* color space of the 15 Munsell renotation color samples when mathematically assuming illumination by a reference light that is selected according to a correlated color temperature $T_{SSL}$ (K) of the light measured at the position of the objects are respectively denoted by $a^*_{nref}$ and $b^*_{nref}$ (where n is a natural number from 1 to 15), then each saturation difference $\Delta C_n$ satisfies $-2.7 \leq \Delta C_n \leq 18.6$ (where n is a natural number from 1 to 15), an average saturation difference represented by formula (1) below satisfies formula (2) below and

[Expression 1]

$$\frac{\sum_{n=1}^{15} \Delta C_n}{15} \qquad (1)$$

[Expression 2]

$$1.7 \leq \frac{\sum_{n=1}^{15} \Delta C_n}{15} \leq 7.0 \qquad (2)$$

if a maximum saturation difference value is denoted by $\Delta C_{max}$ and a minimum saturation difference value is denoted by $\Delta C_{min}$, then a difference $|\Delta C_{max} - \Delta C_{min}|$ between the maximum saturation difference value and the minimum saturation difference value satisfies $3.0 \leq (|\Delta C_{max} - \Delta C_{min}|) \leq 19.6$, where $\Delta C_n = \sqrt{\{(a^*_{nSSL})^2 + (b^*_{nSSL})^2\}} - \sqrt{\{(a^*_{nref})^2 + (b^*_{nref})^2\}}$
with the 15 Munsell renotation color samples being:
01 7.5P 4/10
02 10PB 4/10
03 5PB 4/12
04 7.5B 5/10
05 10BG 6/8
06 2.5BG 6/10
07 2.5G 6/12
08 7.5GY 7/10
09 2.5GY 8/10
10 5Y 8.5/12
11 10YR 7/12
12 5YR 7/12
13 10R 6/12
14 5R 4/14
15 7.5RP 4/12

(3) if hue angles in CIE 1976 L*a*b* color space of the 15 Munsell renotation color samples when mathematically assuming illumination by the light measured at the position of the objects are denoted by $\theta_{nSSL}$ (degrees) (where n is a natural number from 1 to 15), and if hue angles in CIE 1976 L*a*b* color space of the 15 Munsell renotation color samples when mathematically assuming illumination by a reference light that is selected according to the correlated color temperature $T_{SSL}$ (K) of the light measured at the position of the objects are denoted by $\theta_{nref}$ (degrees) (where n is a natural number from 1 to 15), then an absolute value of each difference in hue angles $|\Delta h_n|$ satisfies $0 \leq |\Delta h_n| \leq 9.0$ (degrees)

(where n is a natural number from 1 to 15),
where $\Delta h_n = \theta_{nSSL} - \theta_{nref}$

[2] The illumination method according to [1], wherein
if a spectral power distribution of the light measured at the position of the objects is denoted by $\varphi_{SSL}(\lambda)$, a spectral power distribution of the reference light that is selected according to $T_{SSL}$ (K) of the light measured at the position of the objects is denoted by $\varphi_{ref}(\lambda)$, tristimulus values of the light measured at the position of the objects are denoted by $(X_{SSL}, Y_{SSL}, Z_{SSL})$, and tristimulus values of the reference light that is selected according to $T_{SSL}$ (K) of the light measured at the position of the object are denoted by $(X_{ref}, Y_{ref}, Z_{ref})$, a normalized spectral power distribution $S_{SSL}(\lambda)$ of the light measured at the position of the objects, a normalized spectral power distribution $S_{ref}(\lambda)$ of the reference light that is selected according to $T_{SSL}$ (K) of the light measured at the position of the objects, and a difference $\Delta S(\lambda)$ between the normalized spectral power distributions are respectively defined as $$S_{SSL}(\lambda)=\varphi_{SSL}(\lambda)/Y_{SSL},$$

$$S_{ref}(\lambda)=\varphi_{ref}(\lambda)/Y_{ref}$$

and $$\Delta S(\lambda)=S_{ref}(\lambda)-S_{SSL}(\lambda)$$

a wavelength that produces a longest wavelength local maximum value of $S_{SSL}(\lambda)$ in a wavelength range from 380 nm to 780 nm is denoted by $\lambda_R$ (nm), then a wavelength $\Lambda 4$ that assumes $S_{SSL}(\lambda_R)/2$ exists on a longer wavelength-side of $\lambda_R$, and an index $A_{cg}$ represented by formula (3) below of the light measured at the position of the objects satisfies $$-280 \leq A_{cg} \leq -26$$

[Expression 3]

$$A_{cg} = \int_{380}^{495} \Delta S(\lambda) d\lambda + \int_{495}^{590} (-\Delta S(\lambda)) d\lambda + \int_{590}^{\Lambda 4} \Delta S(\lambda) d\lambda \quad (3).$$

[3] The illumination method according to [1], wherein if a spectral power distribution of the light measured at the position of the objects is denoted by $\varphi_{SSL}(\lambda)$, a spectral power distribution of the reference light that is selected according to $T_{SSL}$ (K) of the light measured at the position of the objects is denoted by $\varphi_{ref}(\lambda)$, tristimulus values of the light measured at the position of the objects are denoted by $(X_{SSL}, Y_{SSL}, Z_{SSL})$, and tristimulus values of the reference light that is selected according to $T_{SSL}$ (K) of the light measured at the position of the objects are denoted by $(X_{ref}, Y_{ref}, Z_{ref})$, and if a normalized spectral power distribution $S_{SSL}(\lambda)$ of the light measured at the position of the objects, a normalized spectral power distribution $S_{ref}(\lambda)$ of the reference light that is selected according to $T_{SSL}$ (K) of the light measured at the position of the objects, and a difference $\Delta S(\lambda)$ between the normalized spectral power distributions are respectively defined as $$S_{SSL}(\lambda)=\varphi_{SSL}(\lambda)/Y_{SSL},$$

$$S_{ref}(\lambda)=\varphi_{ref}(\lambda)/Y_{ref}$$

and $$\Delta S(\lambda)=S_{ref}(\lambda)-S_{SSL}(\lambda)$$

and moreover a wavelength that produces a longest wavelength local maximum value of $S_{SSL}(\lambda)$ in a wavelength range from 380 nm to 780 nm is denoted by $\lambda_R$ (nm), then a wavelength $\Lambda 4$ that assumes $S_{SSL}(\lambda_R)/2$ does not exist on a longer wavelength-side of $\lambda_R$, and an index $A_{cg}$ represented by formula (4) below of the light measured at the position of the object satisfies $$-280 \leq A_{cg} \leq -26$$

[Expression 4]

$$A_{cg} = \int_{380}^{495} \Delta S(\lambda) d\lambda + \int_{495}^{590} (-\Delta S(\lambda)) d\lambda + \int_{590}^{780} \Delta S(\lambda) d\lambda \quad (4).$$

[4] The illumination method according to any one of [1] to [3], wherein a luminous efficacy of radiation K (lm/W) in a wavelength range from 380 nm 780 nm as derived from the spectral power distribution $\varphi_{SSL}(\lambda)$ of light measured at the position of the object satisfies $$180(\text{lm/W}) \leq K(\text{lm/W}) \leq 320(\text{lm/W}).$$

[5] The illumination method according to any one of [1] to [4], wherein each of the absolute value of the difference in hue angles $|\Delta h_n|$ satisfies $$0.003 \leq |\Delta h_n| \leq 8.3 \text{ (degrees)}$$

(where n is a natural number from 1 to 15).

[6] The illumination method according to any one of [1] to [5], wherein the average saturation difference represented by the general formula (1) satisfies formula (2)' below

[Expression 5]

$$2.0 \leq \frac{\sum_{n=1}^{15} \Delta C_n}{15} \leq 6.3. \quad (2)'$$

[7] The illumination method according to any one of [1] to [6], wherein each of the saturation difference $\Delta C_n$ satisfies $$-2.4 \leq \Delta C_n \leq 16.8$$

(where n is a natural number from 1 to 15).

[8] The illumination method according to any one of [1] to [7], wherein the difference $|\Delta C_{max} - \Delta C_{min}|$ between the maximum saturation difference value and the minimum saturation difference value satisfies $$3.4 \leq (|\Delta C_{max} - \Delta C_{min}|) \leq 17.8.$$

[9] The illumination method according to any one of [1] to [8], wherein the distance $D_{uvSSL}$ from a black-body radiation locus of the light measured at the position of the objects satisfies $$-0.0250 \leq D_{uvSSL} \leq -0.0100.$$

[10] The illumination method according to [2] or [3], wherein the index $A_{cg}$ represented by the formula (3) or (4) satisfies $$-253 \leq A_{cg} \leq -29.$$

[11] The illumination method according to any one of [1] to [10], wherein the luminous efficacy of radiation K (lm/W) in a wavelength range from 380 nm to 780 nm as derived from the spectral power distribution $\varphi_{SSL}(\lambda)$ of the light measured at the position of the objects satisfies $$210 \text{ (lm/W)} \leq K \text{ (lm/W)} \leq 288 \text{ (lm/W)}.$$

[12] The illumination method according to any one of [1] to [11], wherein the correlated color temperature $T_{SSL}$ (K) of the light measured at the position of the objects satisfies $$2550(\text{K}) \leq T_{SSL}(\text{K}) \leq 5650(\text{K}).$$

[13] The illumination method according to any one of [1] to [12], wherein illuminance at which the objects are illuminated is 150 lx to 5000 lx.

[14] The illumination method according to any one of [1] to [13], wherein the light-emitting devices comprise a semiconductor light-emitting element as a light-emitting element and emits light emitted from one to six light-emitting elements including the light emitted by the semiconductor light-emitting element.

[15] The illumination method according to [14], wherein the peak wavelength of the emission spectrum of the semiconductor light-emitting element is 380 nm or longer and shorter than 495 nm and the full-width at half-maximum of the emission spectrum of the semiconductor light-emitting element is from 2 nm to 45 nm.

[16] The illumination method according to [15], wherein the peak wavelength of the emission spectrum of the semiconductor light-emitting element is 395 nm or longer and shorter than 420 nm.

[17] The illumination method according to [15], wherein the peak wavelength of the emission spectrum of the semiconductor light-emitting element is 420 nm or longer and shorter than 455 nm.

[18] The illumination method according to [15], wherein the peak wavelength of the emission spectrum of the semiconductor light-emitting element is 455 nm or longer and shorter than 485 nm.

[19] The illumination method according to [14], wherein the peak wavelength of the emission spectrum of the semiconductor light-emitting element is 495 nm or longer and shorter than 590 nm and the full-width at half-maximum of the emission spectrum of the semiconductor light-emitting element is 2 nm to 75 nm.

[20] The illumination method according to [14], wherein the peak wavelength of the emission spectrum of the semiconductor light-emitting element is 590 nm or longer and shorter than 780 nm and the full-width at half-maximum of the emission spectrum of the semiconductor light-emitting element is 2 nm to 30 nm.

[21] The illumination method according to any one of [14] to [20], wherein the semiconductor light-emitting element is created on any substrate selected from the group consisting of a sapphire substrate, a GaN substrate, a GaAs substrate, and a GaP substrate.

[22] The illumination method according to any one of [14] to [20], wherein the semiconductor light-emitting element is fabricated on a GaN substrate or a GaP substrate and a thickness of the substrate is 100 μm to 2 mm.

[23] The illumination method according to any one of [14] to [20], wherein the semiconductor light-emitting element is fabricated on a sapphire substrate or a GaAs substrate and the semiconductor light-emitting element is removed from the substrate.

[24] The illumination method according to any one of [14] to [23], comprising a phosphor as a light-emitting element.

[25] The illumination method according to [24], wherein the phosphor includes one to five phosphors each having different emission spectra.

[26] The illumination method according to [24] or [25], wherein the phosphor includes a phosphor having an individual emission spectrum, when photoexcited at room temperature, with a peak wavelength of 380 nm or longer and shorter than 495 nm and a full-width at half-maximum of 2 nm to 90 nm.

[27] The illumination method according to [26], wherein the phosphor includes one or more types of phosphors selected from the group consisting of a phosphor represented by general formula (5) below, a phosphor represented by general formula (5)' below, $(Sr,Ba)_3MgSi_2O_8$:$Eu^{2+}$, and $(Ba,Sr,Ca,Mg)Si_2O_2N_2$:Eu $$(Ba,Sr,Ca)MgAl_{10}O_{17}:Mn,Eu \quad (5)$$

$$Sr_aBa_bEu_x(PO_4)_cX_d \quad (5)'$$

(in the general formula (5)', X is Cl, in addition, c, d, and x are numbers satisfying 2.7≤c≤3.3, 0.9≤d≤1.1, and 0.3≤x≤1.2, moreover, a and b satisfy conditions represented by a+b =5−x and 0≤b/(a+b)≤0.6).

[28] The illumination method according to [24] or [25], wherein the phosphor includes a phosphor having an individual emission spectrum, when photoexcited at room temperature, with a peak wavelength of 495 nm or longer and shorter than 590 nm and a full-width at half-maximum of 2 nm to 130 nm.

[29] The illumination method according to [28], wherein the phosphor includes one or more types of phosphors selected from the group consisting of $Si_{6-z}Al_zO_zN_{8-z}$:Eu (where 0<z<4.2), a phosphor represented by general formula (6) below, a phosphor represented by general formula (6)' below, and $SrGaS_4$:$Eu^{2+}$ $$(Ba_aCa_bSr_cMg_dEu_x)SiO_4 \quad (6)$$

(In the general formula (6), a, b, c, d and x satisfy a+b+c + d+x=2, 1.0≤a≤2.0, 0≤b<0.2, 0.2≤c≤0.8, 0≤d<0.2, and 0<x≤0.5)

$$Ba_{1-x-y}Sr_xEu_yMg_{1-z}Mn_zAl_{10}O_{17} \quad (6)'$$

(In general formula (6)', x, y, and z respectively satisfy 0.1≤x≤0.4, 0.25≤y≤0.6, and 0.05≤z≤0.5).

[30] The illumination method according to [24] or [25], wherein the phosphor includes a phosphor having an individual emission spectrum, when photoexcited at room temperature, with a peak wavelength of 590 nm or longer and shorter than 780 nm and a full-width at half-maximum of 2 to 130 nm.

[31] The illumination method according to [30], wherein the phosphor includes one or more types of phosphors selected from the group consisting of a phosphor represented by general formula (7) below, a phosphor represented by general formula (7)' below, $(Sr,Ca,Ba)_2Al_xSi_{5-x}O_xN_{8-x}$:Eu (where 0≤x≤2), $Eu_y(Sr,Ca,Ba)_{1-y}$:$Al_{1+x}Si_{4-x}O_xN_{7-x}$ (where 0≤x<4, 0≤y<0.2), $K_2SiF_6$:$Mn^{4+}$, $A_{2+x}M_yMn_zF_n$ (where A is Na and/or K; M is Si and Al; −1≤x≤1 and 0.9≤y+z≤1.1 and 0.001≤z≤0.4 and 5≤n≤7), $(Ca,Sr,Ba,Mg)AlSiN_3$:Eu and/or $(Ca,Sr,Ba) AlSiN_3$:Eu, and $(CaAlSiN_3)_{1-x}(Si_2N_2O)_x$:Eu (where x satisfies 0<x<0.5)

$$(La_{1-x-y}Eu_xLn_y)_2O_2S \quad (7)$$

(in the general formula (7), x and y denote numbers respectively satisfying 0.02≤x≤0.50 and 0≤y≤0.50, and Ln denotes at least one trivalent rare-earth element among Y, Gd, Lu, Sc, Sm, and Er)

$$(k-x)MgO.xAF_2.GeO_2:yMn^{4+} \quad (7)'$$

(in the general formula (7)', k, x, and y denote numbers respectively satisfying 2.8≤k≤5, 0.1≤x≤0.7, and 0.005≤y≤0.015, and A is calcium (Ca), strontium (Sr), barium (Ba), zinc (Zn), or a mixture consisting of these elements).

[32] The illumination method according to [14] comprising a phosphor as a light-emitting element, wherein a peak wavelength of an emission spectrum of the semiconductor light-emitting element is 395 nm or longer and shorter than 420 nm, and the phosphor includes SBCA, β-SiAlON, and CASON.
[33] The illumination method according to [14] comprising a phosphor as a light-emitting element, wherein a peak wavelength of an emission spectrum of the semiconductor light-emitting element is 395 nm or longer and shorter than 420 nm, and the phosphor includes SCA, β-SiAlON, and CASON.
[34] The illumination method according to any one of [1] to [33], wherein the light-emitting device is any one selected from the group consisting of a packaged LED, an LED module, an LED lighting fixture, and an LED lighting system.
[35] The illumination method according to any one of [1] to [34], which is for residential uses.
[36] The illumination method according to any one of [1] to [34], which is used for exhibition uses.
[37] The illumination method according to any one of [1] to [34], which is used for presentation purposes.
[38] The illumination method according to any one of [1] to [34], which is used for medical uses.
[39] The illumination method according to any one of [1] to [34], which is for work use.
[40] The illumination method according to any one of [1] to [34], which is used inside industrial devices.
[41] The illumination method according to any one of [1] to [34], which is used in interior of transportation.
[42] The illumination method according to any one of [1] to [34], which is used for works of art.
[43] The illumination method according to any one of [1] to [34], which is used foraged persons.
[44] A light-emitting device incorporating a light-emitting element, wherein
light emitted from the light-emitting device includes, in a main radiant direction thereof, light whose distance $D_{uvSSL}$ from a black-body radiation locus as defined by ANSI C78.377 satisfies $-0.0325 \le D_{uvSSL} \le -0.0075$, and
if a spectral power distribution of light emitted from the light-emitting device in the radiant direction is denoted by $\varphi_{SSL}(\lambda)$, a spectral power distribution of a reference light that is selected according to $T_{SSL}$ (K) of the light emitted from the light-emitting device in the radiant direction is denoted by $\varphi_{ref}(\lambda)$, tristimulus values of the light emitted from the light-emitting device in the radiant direction are denoted by $(X_{SSL}, Y_{SSL}, Z_{SSL})$ and tristimulus values of the reference light that is selected according to $T_{SSL}$ (K) of the light emitted from the light-emitting device in the radiant direction are denoted by $(X_{ref}, Y_{ref}, Z_{ref})$, and
if a normalized spectral power distribution $S_{SSL}(\lambda)$ of light emitted from the light-emitting device in the radiant direction, a normalized spectral power distribution $S_{ref}(\lambda)$ of a reference light that is selected according to $T_{SSL}$ (K) of the light emitted from the light-emitting device in the radiant direction, and a difference $\Delta S(\lambda)$ between these normalized spectral power distributions are respectively defined as $$S_{SSL}(\lambda) = \varphi_{SSL}(\lambda)/Y_{SSL},$$

$$S_{ref}(\lambda) = \varphi_{ref}(\lambda)/Y_{ref}$$

and $$\Delta S(\lambda) = S_{ref}(\lambda) - S_{SSL}(\lambda)$$

and a wavelength that produces a longest wavelength local maximum value of $S_{SSL}(\lambda)$ in a wavelength range of 380 nm to 780 nm is denoted by $\lambda_R$ (nm), then a wavelength Λ4 that assumes $S_{SSL}(\lambda_R)/2$ exists on a longer wavelength-side of $\lambda_R$, and
an index $A_{cg}$ represented by formula (1) below satisfies $-280 \le A_{cg} \le -26$
[Expression 6]

$$A_{cg} = \frac{\int_{380}^{495} \Delta S(\lambda) d\lambda + \int_{495}^{590} (-\Delta S(\lambda)) d\lambda + \int_{590}^{\Lambda 4} \Delta S(\lambda) d\lambda}{} \quad (1).$$

[45] A light-emitting device incorporating a light-emitting element, wherein
light emitted from the light-emitting device includes, in a main radiant direction thereof, light whose distance $D_{uvSSL}$ from a black-body radiation locus as defined by ANSI C78.377 satisfies $-0.0325 \le D_{uvSSL} \le -0.0075$, and
if a spectral power distribution of light emitted from the light-emitting device in the radiant direction is denoted by $\varphi_{SSL}(\lambda)$, a spectral power distribution of a reference light that is selected according to $T_{SSL}$ (K) of the light emitted from the light-emitting device in the radiant direction is denoted by $\varphi_{ref}(\lambda)$, tristimulus values of the light emitted from the light-emitting device in the radiant direction are denoted by $(X_{SSL}, Y_{SSL}, Z_{SSL})$, and tristimulus values of the reference light that is selected according to $T_{SSL}$ (K) of the light emitted from the light-emitting device in the radiant direction are denoted by $(X_{ref}, Y_{ref}, Z_{ref})$, and
if a normalized spectral power distribution $S_{SSL}(\lambda)$ of light emitted from the light-emitting device in the radiant direction, a normalized spectral power distribution $S_{ref}(\lambda)$ of a reference light that is selected according to $T_{SSL}$ (K) of the light emitted from the light-emitting device in the radiant direction, and a difference $\Delta S(\lambda)$ between these normalized spectral power distributions are respectively defined as $$S_{SSL}(\lambda) = \varphi_{SSL}(\lambda)/Y_{SSL},$$

$$S_{ref}(\lambda) = \varphi_{ref}(\lambda)/Y_{ref}$$

and $$\Delta S(\lambda) = S_{ref}(\lambda) - S_{SSL}(\lambda),$$

and a wavelength that produces a longest wavelength local maximum value of $S_{SSL}(\lambda)$ in a wavelength range of 380 nm to 780 nm is denoted by $\lambda_R$ (nm), then a wavelength Λ4 that assumes $S_{SSL}(\lambda_R)/2$ does not exist on a longer wavelength-side of $\lambda_R$, and
an index $A_{cg}$ represented by formula (2) below satisfies $$-280 \le A_{cg} \le -26$$

[Expression 7]

$$A_{cg} = \frac{\int_{380}^{495} \Delta S(\lambda) d\lambda + \int_{495}^{590} (-\Delta S(\lambda)) d\lambda + \int_{590}^{780} \Delta S(\lambda) d\lambda}{} \quad (2).$$

[46] The light-emitting device according to [44] or [45], wherein
the light emitted from the light-emitting device in the radiant direction satisfies (1) and (2) below:
(1) if an a* value and a b* value in CIE 1976 L*a*b* color space of 15 Munsell renotation color samples from #01 to #15 listed below when mathematically assuming illumination by the light emitted from the light-emitting device in the radiant direction are respectively denoted by $a^*_{nSSL}$ and $b^*_{nSSL}$ (where n is a natural number from 1 to 15), and an a* value and a b* value in CIE 1976 L*a*b* color space of the 15 Munsell renotation color samples when mathematically assuming illumination by a reference light that is selected according to a correlated color temperature $T_{SSL}$ (K) of the light emitted from the light-emitting device in the radiant direction are respectively denoted by $a^*_{nref}$ and $b^*_{nref}$ (where n is a natural number from 1 to 15), then each saturation difference $\Delta C_n$ satisfies $$-2.7 \leq \Delta C_n \leq 18.6$$

(where n is a natural number from 1 to 15),
an average saturation difference represented by formula (3) below satisfies formula (4) below and

[Expression 8]

$$\frac{\sum_{n=1}^{15} \Delta C_n}{15} \qquad (3)$$

[Expression 9]

$$1.7 \leq \frac{\sum_{n=1}^{15} \Delta C_n}{15} \leq 7.0 \qquad (4)$$

and
if a maximum saturation difference value is denoted by $\lambda C_{max}$ and a minimum saturation difference value is denoted by $\Delta C_{min}$, then a difference $|\Delta C_{max} - \lambda C_{min}|$ between the maximum saturation difference value and the minimum saturation difference value satisfies $$3.0 \leq (|\Delta C_{max} - \Delta C_{min}|) \leq 19.6,$$

where $\Delta C_n = \sqrt{\{(a^*_{nSSL})^2 + (b^*_{nSSL})^2\}} - \sqrt{\{(a^*_{nref})^2 + (b^*_{nref})^2\}}$
with the 15 Munsell renotation color samples being:
01 7.5P 4/10
02 10PB 4/10
03 5PB 4/12
04 7.5B 5/10
05 10BG 6/8
06 2.5BG 6/10
07 2.5G 6/12
08 7.5GY 7/10
09 2.5 GY 8/10
10 5Y 8.5/12
11 10YR 7/12
12 5YR 7/12
13 10R 6/12
14 5R 4/14
15 7.5RP 4/12

(2) if hue angles in CIE 1976 L*a*b* color space of the 15 Munsell renotation color samples when mathematically assuming illumination by the light emitted from the light-emitting device in the radiant direction are denoted by $\theta_{nSSL}$ (degrees) (where n is a natural number from 1 to 15), and
hue angles in a CIE 1976 L*a*b* color space of the 15 Munsell renotation color samples when mathematically assuming illumination by a reference light that is selected according to the correlated color temperature $T_{SSL}$ (K) of the light emitted in the radiant direction are denoted by $\theta_{nref}$ (degrees) (where n is a natural number from 1 to 15), then an absolute value of each difference in hue angles $|\Delta h_n|$ satisfies $$0 \leq |\Delta h_n| \leq 9.0 \text{ (degrees)}$$

(where n is a natural number from 1 to 15),
where $\Delta h_n = \theta_{nSSL} - \theta_{nref}$.

[47] The light-emitting device according to any one of [44] to [46], wherein
a luminous efficacy of radiation K (lm/W) in a wavelength range from 380 nm to 780 nm as derived from the spectral power distribution $\varphi_{SSL}(\lambda)$ of light emitted from the light-emitting device in the radiant direction satisfies $$180(\text{lm/W}) \leq K(\text{lm/W}) \leq 320(\text{lm/W}).$$

[48] The light-emitting device according to [46], wherein each of the absolute value of the difference in hue angles $|\Delta h_n|$ satisfies $$0.003 \leq |\Delta h_n| \leq 8.3 \text{ (degrees)}$$

(where n is a natural number from 1 to 15).

[49] The light-emitting device according to [46], wherein the average saturation difference represented by the general formula (3) above satisfies formula (4)' below

[Expression 10]

$$2.0 \leq \frac{\sum_{n=1}^{15} \Delta C_n}{15} \leq 6.3. \qquad (4)'$$

[50] The light-emitting device according to [46], wherein each of the saturation difference $\Delta C_n$ satisfies $$-2.4 \leq \Delta C_n \leq 16.8$$

(where n is a natural number from 1 to 15).

[51] The light-emitting device according to [46], wherein the difference $|\Delta C_{max} - C_{min}|$ between the maximum saturation difference value and the minimum saturation difference value satisfies $$3.4 \leq (|\Delta C_{max} - \Delta C_{min}|) \leq 17.8.$$

[52] The light-emitting device according to any one of [44] to [51], wherein
a distance $D_{uvSSL}$ from a black-body radiation locus of the light emitted from the light-emitting device in the radiant direction satisfies $$-0.0250 \leq D_{uvSSL} \leq -0.0100.$$

[53]. The light-emitting device according to any one of [44] to [52], wherein the index $A_{cg}$ represented by the formula (1) or (2) above satisfies $$-253 \leq A_{cg} \leq -29.$$

[54] The light-emitting device according to any one of [44] to [53], wherein
the luminous efficacy of radiation K (lm/W) in a wavelength range from 380 nm to 780 nm as derived from the spectral power distribution $\varphi_{SSL}(\lambda)$ of light emitted from the light-emitting device in the radiant direction satisfies $$210(\text{lm/W}) \leq K(\text{lm/W}) \leq 288(\text{lm/W}).$$

[55] The light-emitting device according to any one of [44] to [54], wherein the correlated color temperature $T_{SSL}$ (K) satisfies $$2550(\text{K}) \leq T_{SSL}(\text{K}) \leq 5650(\text{K}).$$

[56] The light-emitting device according to any one of [44] to [55], wherein illuminance at which the light emitted from the light-emitting device in the radiant direction illuminates objects is 150 lx to 5000 lx.

[57] The light-emitting device according to anyone of [44] to [56], wherein the light-emitting device comprises a semiconductor light-emitting element as a light-emitting element and emits, in the radiant direction, light emitted from one to six light-emitting elements including the light emitted by the semiconductor light-emitting element.

[58] The light-emitting device according to [57], wherein a peak wavelength of an emission spectrum of the semiconductor light-emitting element is 380 nm or longer and shorter than 495 nm and the full-width at half-maximum of the emission spectrum of the semiconductor light-emitting element is 2 nm to 45 nm.

[59] The light-emitting device according to [58], wherein the peak wavelength of the emission spectrum of the semiconductor light-emitting element is 395 nm or longer and shorter than 420 nm.

[60] The light-emitting device according to [58], wherein the peak wavelength of the emission spectrum of the semiconductor light-emitting element is 420 nm or longer and shorter than 455 nm.

[61] The light-emitting device according to [58], wherein the peak wavelength of the emission spectrum of the semiconductor light-emitting element is 455 nm or longer and shorter than 485 nm.

[62] The light-emitting device according to [57], wherein the peak wavelength of the emission spectrum of the semiconductor light-emitting element is 495 nm or longer and shorter than 590 nm and the full-width at half-maximum of the emission spectrum of the semiconductor light-emitting element is 2 nm to 75 nm.

[63] The light-emitting device according to [57], wherein the peak wavelength of the emission spectrum of the semiconductor light-emitting element is 590 nm or longer and shorter than 780 nm and the full-width at half-maximum of the emission spectrum of the semiconductor light-emitting element is 2 nm to 30 nm.

[64] The light-emitting device according to any one of [57] to [63], wherein the semiconductor light-emitting element is fabricated on any substrate selected from the group consisting of a sapphire substrate, a GaN substrate, a GaAs substrate, and a GaP substrate.

[65] The light-emitting device according to any one of [57] to [63], wherein the semiconductor light-emitting element is fabricated on a GaN substrate or a GaP substrate and a thickness of the substrate is 100 μm to 2 mm.

[66] The light-emitting device according to any one of [57] to [63], wherein the semiconductor light-emitting element is fabricated on a sapphire substrate or a GaAs substrate and the semiconductor light-emitting element is removed from the substrate.

[67] The light-emitting device according to any one of [57] to [66], comprising a phosphor as a light-emitting element.

[68] The light-emitting device according to [67], wherein the phosphor includes one to five phosphors each having different emission spectra.

[69] The light-emitting device according to [67] or [68], wherein the phosphor includes a phosphor having an individual emission spectrum, when photoexcited at room temperature, with a peak wavelength of 380 nm or longer and shorter than 495 nm and a full-width at half-maximum of 2 nm to 90 nm.

[70] The light-emitting device according to [69], wherein the phosphor includes one or more types of phosphors selected from the group consisting of a phosphor represented by general formula (5) below, a phosphor represented by general formula (5)' below, $(Sr,Ba)_3MgSi_2O_8$:$Eu^{2+}$, and $(Ba,Sr,Ca,Mg)Si_2O_2N_2$:Eu

(Ba,Sr,Ca)MgAl$_{10}$O$_{17}$:Mn,Eu (5)

Sr$_a$Ba$_b$Eu$_x$(PO$_4$)$_c$X$_d$ (5)'

(in the general formula (5)', X is Cl, in addition, c, d, and x are numbers satisfying $2.7 \leq c \leq 3.3$, $0.9 \leq d \leq 1.1$, and $0.3 \leq x \leq 1.2$, moreover, a and b satisfy conditions represented by a+b =5−x and $0 \leq b/(a+b) \leq 0.6$).

[71] The light-emitting device according to [67] or [68], wherein the phosphor includes a phosphor having an individual emission spectrum, when photoexcited at room temperature, with a peak wavelength of 495 nm or longer and shorter than 590 nm and a full-width at half-maximum of 2 to 130 nm.

[72] The light-emitting device according to [71], wherein the phosphor includes one or more types of phosphors selected from the group consisting of $Si_{6-z}Al_zO_zN_{8-z}$:Eu (where $0<z<4.2$), a phosphor represented by general formula (6) below, a phosphor represented by general formula (6)' below, and $SrGaS_4$:$Eu^{2+}$

(Ba$_a$Ca$_b$Sr$_c$Mg$_d$Eu$_x$)SiO$_4$ (6)

(in the general formula (6), a, b, c, d, and x satisfy a+b+c+d+x=2, $1.0 \leq a \leq 2.0$, $0 \leq b < 0.2$, $0.2 \leq c \leq 0.8$, $0 \leq d < 0.2$, and $0 < x \leq 0.5$).

Ba$_{1-x-y}$Sr$_x$Eu$_y$Mg$_{1-z}$Mn$_z$Al$_{10}$O$_{17}$ (6)'

(in the general formula (6)', x, y, and z respectively satisfy $0.1 \leq x \leq 0.4$, $0.25 \leq y \leq 0.6$, and $0.05 \leq z \leq 0.5$).

[73] The light-emitting device according to [67] or [68], wherein the phosphor includes a phosphor having an individual emission spectrum, when photoexcited at room temperature, with a peak wavelength of 590 nm or longer and shorter than 780 nm and a full-width at half-maximum of 2 nm to 130 nm.

[74] The light-emitting device according to [73], wherein the phosphor includes one or more types of phosphors selected from the group consisting of a phosphor represented by general formula (7) below, a phosphor represented by general formula (7)' below, $(Sr,Ca,Ba)_2Al_xSi_{5-x}O_xN_{8-x}$:Eu (where $0 \leq x \leq 2$), $Eu_y(Sr,Ca,Ba)_{1-y}$:$Al_{1+x}Si_{4-x}O_xN_{7-x}$ (where $0 \leq x < 4$, $0 \leq y < 0.2$), $K_2SiF_6$:$Mn^{4+}$, $A_{2+x}M_yMn_zF_n$ (where A is Na and/or K; M is Si and Al; $-1 \leq x \leq 1$ and $0.9 \leq y+z \leq 1.1$ and $0.001 \leq z \leq 0.4$ and $5 \leq n \leq 7$), (Ca,Sr,Ba,Mg)AlSiN$_3$:Eu and/or (Ca,Sr,Ba)AlSiN$_3$:Eu, and $(CaAlSiN_3)_{1-x}(Si_2N_2O)_x$:Eu (where x satisfies $0 < x < 0.5$)

(La$_{1-x-y}$Eu$_x$Ln$_y$)$_2$O$_2$S (7)

(in the general formula (7), x and y denote numbers respectively satisfying $0.02 \leq x \leq 0.50$ and $0 \leq y \leq 0.50$, and Ln denotes at least one trivalent rare-earth element among Y, Gd, Lu, Sc, Sm, and Er)

(k−x)MgO.xAF$_2$.GeO$_2$:yMn$^{4+}$ (7)'

(in the general formula (7)', k, x, and y denote numbers respectively satisfying $2.8 \leq k \leq 5$, $0.1 \leq x \leq 0.7$, and $0.005 \leq y \leq 0.015$, and A is calcium (Ca), strontium (Sr), barium (Ba), zinc (Zn), or a mixture consisting of these elements).

[75] The light-emitting device according to [57] comprising a phosphor as a light-emitting element, wherein a peak wavelength of an emission spectrum of the semiconductor light-emitting element is 395 nm or longer and shorter than 420 nm, and the phosphor includes SBCA, β-SiAlON, and CASON.

[76] The light-emitting device according to [57] comprising a phosphor as a light-emitting element, wherein a peak wavelength of an emission spectrum of the semiconductor light-emitting element is 395 nm or longer and shorter than 920 nm, and the phosphor includes SCA, β-SiAlON, and CASON.

[77] The light-emitting device according to any one of [94] to [76], which is selected from the group consisting of a packaged LED, an LED module, an LED lighting fixture, and an LED lighting system.

[78] The light-emitting device according to any one of [44] to [77], which is used as a residential uses' device.
[79] The light-emitting device according to any one of [44] to [77], which is used as a exhibition illumination device.
[80] The light-emitting device according to any one of [44] to [77], which is used as a presentation illumination device.
[81] The light-emitting device according to any one of [44] to [77], which is used as a medical illumination device.
[82] The light-emitting device according to any one of [44] to [77], which is used as a work illumination device.
[83] The light-emitting device according to any one of [44] to [77], which is used as an illumination device incorporated in industrial equipment.
[84] The light-emitting device according to any one of [44] to [77], which is used as an illumination device for interior of transportation.
[85] The light-emitting device according to any one of [44] to [77], which is used as an illumination device for works of art.
[86] The light-emitting device according to any one of [44] to [77], which is used as an illumination device for aged persons.
[87] A design method of a light-emitting device incorporating a light-emitting element, wherein light emitted from the light-emitting device is configured so as to include, in a main radiant direction thereof, light whose distance $D_{uvSSL}$ from a black-body radiation locus as defined by ANSI C78.377 satisfies $-0.0325 \leq D_{uvSSL} \leq -0.0075$, and if a spectral power distribution of light emitted from the light-emitting device in the radiant direction is denoted by $\varphi_{SSL}(\lambda)$, a spectral power distribution of a reference light that is selected according to $T_{SSL}$ (K) of the light emitted from the light-emitting device in the radiant direction is denoted by $\varphi_{ref}(\lambda)$, tristimulus values of the light emitted from the light-emitting device in the radiant direction are denoted by $(X_{SSL}, Y_{SSL}, Z_{SSL})$, and tristimulus values of the reference light that is selected according to $T_{SSL}$ (K) of the light emitted from the light-emitting device in the radiant direction are denoted by $(X_{ref}, Y_{ref}, Z_{ref})$, and if a normalized spectral power distribution $S_{SSL}(\lambda)$ of light emitted from the light-emitting device in the radiant direction, a normalized spectral power distribution $S_{ref}(\lambda)$ of a reference light that is selected according to $T_{SSL}$ (K) of the light emitted from the light-emitting device in the radiant direction, and a difference $\Delta S(\lambda)$ between these normalized spectral power distributions are respectively defined as $$S_{SSL}(\lambda) = \varphi_{SSL}(\lambda)/Y_{SSL},$$

$$S_{ref}(\lambda) = \varphi_{ref}(\lambda)/Y_{ref}$$

and $$\Delta S(\lambda) = S_{ref}(\lambda) - S_{SSL}(\lambda)$$

and a wavelength that produces a longest wavelength local maximum value of $S_{SSL}(\lambda)$ in a wavelength range from 380 nm to 780 nm is denoted by $\lambda_R$ (nm), then a wavelength $\Lambda 4$ that assumes $S_{SSL}(\lambda_R)/2$ exists on a longer wavelength-side of $\lambda_R$, and an index $A_{cg}$ represented by formula (1) below satisfies $$-280 \leq A_{cg} \leq -26$$

[Expression 11]

$$A_{cg} = \int_{380}^{495} \Delta S(\lambda) d\lambda + \int_{495}^{590} (-\Delta S(\lambda)) d\lambda + \int_{590}^{\Lambda 4} \Delta S(\lambda) d\lambda \quad (1).$$

88. A design method of a light-emitting device incorporating a light-emitting element, wherein light emitted from the light-emitting device is configured so as to include, in a main radiant direction thereof, light whose distance $D_{uvSSL}$ from a black-body radiation locus as defined by ANSI C78.377 satisfies $-0.0325 \leq D_{uvSSL} \leq -0.0075$, and if a spectral power distribution of light emitted from the light-emitting device in the radiant direction is denoted by $\varphi_{SSL}(\lambda)$, a spectral power distribution of a reference light that is selected according to $T_{SSL}$ (K) of the light emitted from the light-emitting device in the radiant direction is denoted by $\varphi_{ref}(\lambda)$, tristimulus values of the light emitted from the light-emitting device in the radiant direction are denoted by $(X_{SSL}, Y_{SSL}, Z_{SSL})$, and tristimulus values of the reference light that is selected according to $T_{SSL}$ (K) of the light emitted from the light-emitting device in the radiant direction are denoted by $(X_{ref}, Y_{ref}, Z_{ref})$ and if a normalized spectral power distribution $S_{SSL}(\lambda)$ of light emitted from the light-emitting device in the radiant direction, a normalized spectral power distribution $S_{ref}(\lambda)$ of a reference light that is selected according to $T_{SSL}$ (K) of the light emitted from the light-emitting device in the radiant direction, and a difference $\Delta S(\lambda)$ between these normalized spectral power distributions are respectively defined as $$S_{SSL}(\lambda) = \varphi_{SSL}(\lambda)/Y_{SSL},$$

$$S_{ref}(\lambda) = \varphi_{ref}(\lambda)/Y_{ref}$$

and $$\Delta S(\lambda) = S_{ref}(\lambda) - S_{SSL}(\lambda)$$

and a wavelength that produces a longest wavelength local maximum value of $S_{SSL}(\lambda)$ in a wavelength range from 380 nm to 780 nm is denoted by $\lambda_R$ (nm), then a wavelength $\Lambda 4$ that assumes $S_{SSL}(\lambda_R)/2$ does not exist on a longer wavelength-side of $\lambda_R$, and an index $A_{cg}$ represented by formula (2) below satisfies $$-280 \leq A_{cg} \leq -26$$

[Expression 12]

$$A_{cg} = \int_{380}^{495} \Delta S(\lambda) d\lambda + \int_{495}^{590} (-\Delta S(\lambda)) d\lambda + \int_{590}^{780} \Delta S(\lambda) d\lambda \quad (2).$$

According to the present invention, compared to a case where illumination is performed with reference light (sometimes referred to as experimental reference light), a case where illumination is performed by a light-emitting device emitting light which produces a color appearance close to reference light and which has a high $R_a$ and a high $R_i$ (sometimes referred to as experimental pseudo-reference light), and the like, an illumination method and a light-emitting device are achieved which are capable of realizing a truly favorable color appearance of objects statistically judged by a large number of subjects to be more favorable even at an approximately similar CCT and/or an approximately similar illuminance.

Advantageous effects achieved by the present invention can be more specifically exemplified as follows.

First, when illuminating with the illumination method according to the present invention or illuminating by a light-emitting device according to the present invention such as a light source, a fixture, or a system, compared to cases where illumination is performed with experimental reference light or experimental pseudo-reference light, white appears whiter, more natural, and more comfortable even at an approximately similar CCT and/or an approximately similar illuminance. Furthermore, differences in lightness among achromatic colors such as white, gray, and black become more visible. As a result, for example, black letters or the like on an ordinary sheet of white paper become more legible. Moreover, while details will be given later, such an effect is completely unexpected in the context of conventional wisdom.

Second, with illuminance when illuminating with the illumination method according to the present invention or illuminance that is realized by a light-emitting device according to the present invention, a truly natural color appearance as though viewed under several tens of thousands of lx such as under outdoor illuminance on a sunny day is achieved for a majority of colors such as purple, bluish purple, blue, greenish blue, green, yellowish green, yellow, reddish yellow, red, and reddish purple, and in some cases, all colors even in an ordinary indoor environment of around several thousand lx to several hundred lx. In addition, the skin colors of subjects (Japanese), various foods, clothing, wooden colors, and the like which have intermediate chroma also acquire a natural color appearance which many of the subjects feel more favorable.

Third, when illuminating with the illumination method according to the present invention or illuminating by a light-emitting device according to the present invention, colors among close hues can be identified more easily and work or the like can be performed as comfortably as though under a high-illuminance environment as compared to cases where illumination is performed with experimental reference light or experimental pseudo-reference light even at an approximately similar CCT and/or an approximately similar illuminance. Furthermore, specifically, for example, a plurality of lipsticks with similar red colors can be more readily distinguished from each other.

Fourth, when illuminating with the illumination method according to the present invention or illuminating by a light source, a fixture, or a system according to the present invention, objects can be viewed more clearly and readily as though viewed under a high-illuminance environment as compared to cases where illumination is performed with experimental reference light or experimental pseudo-reference light even at an approximately similar CCT and/or an approximately similar illuminance.

Figure 25:
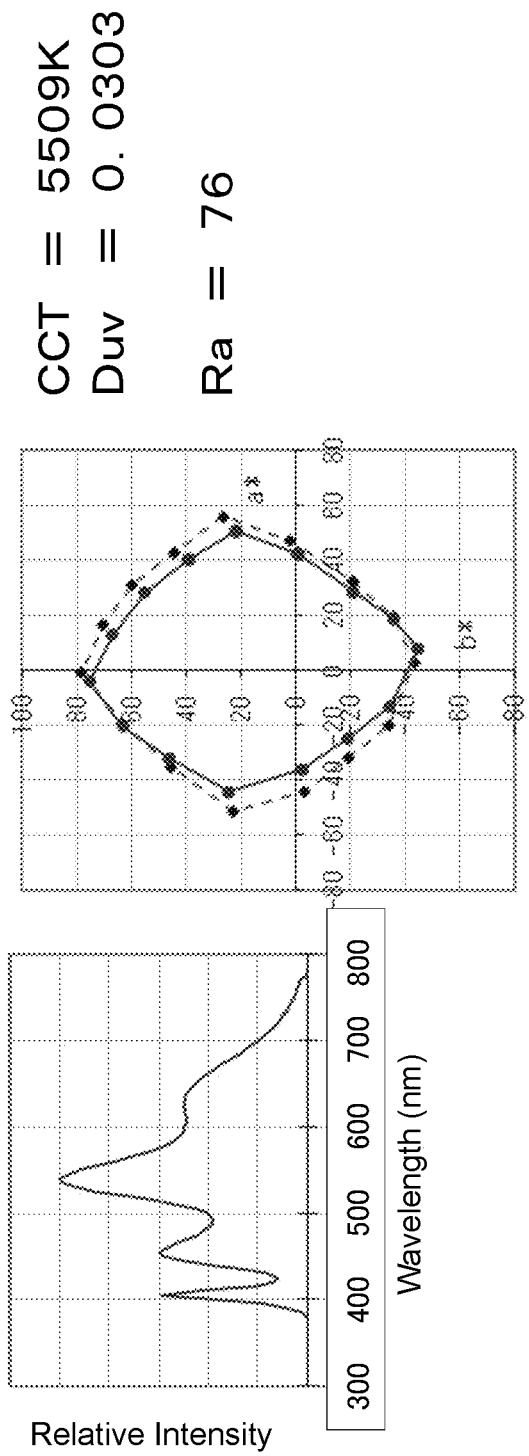
Figure 26:
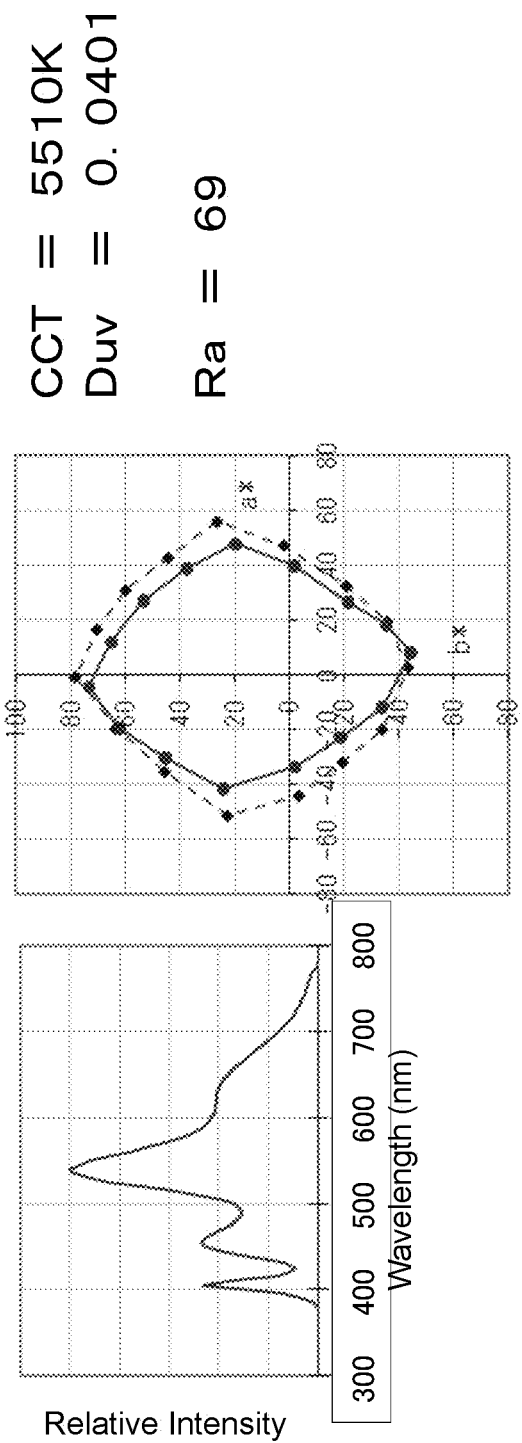
Figure 27:
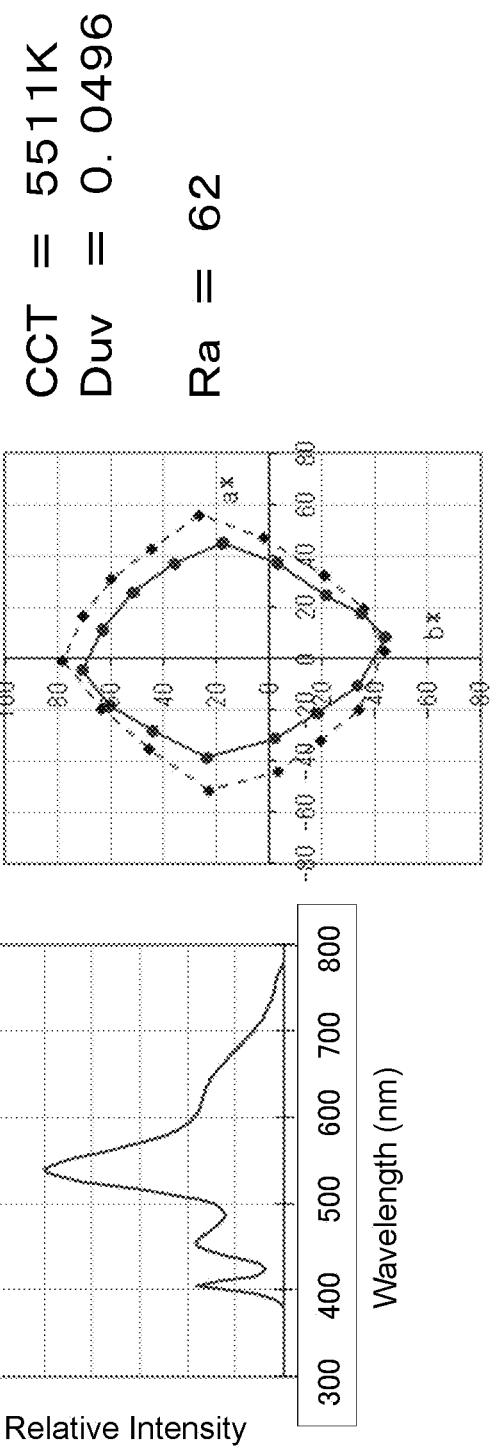
Figure 28:
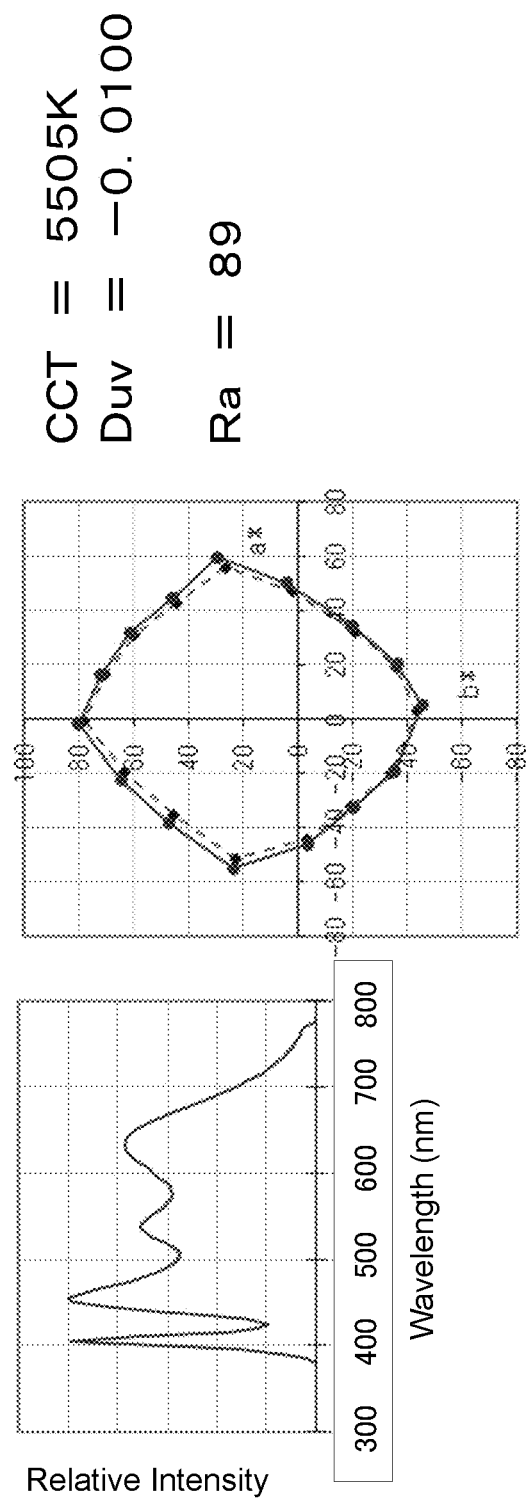
Figure 29:
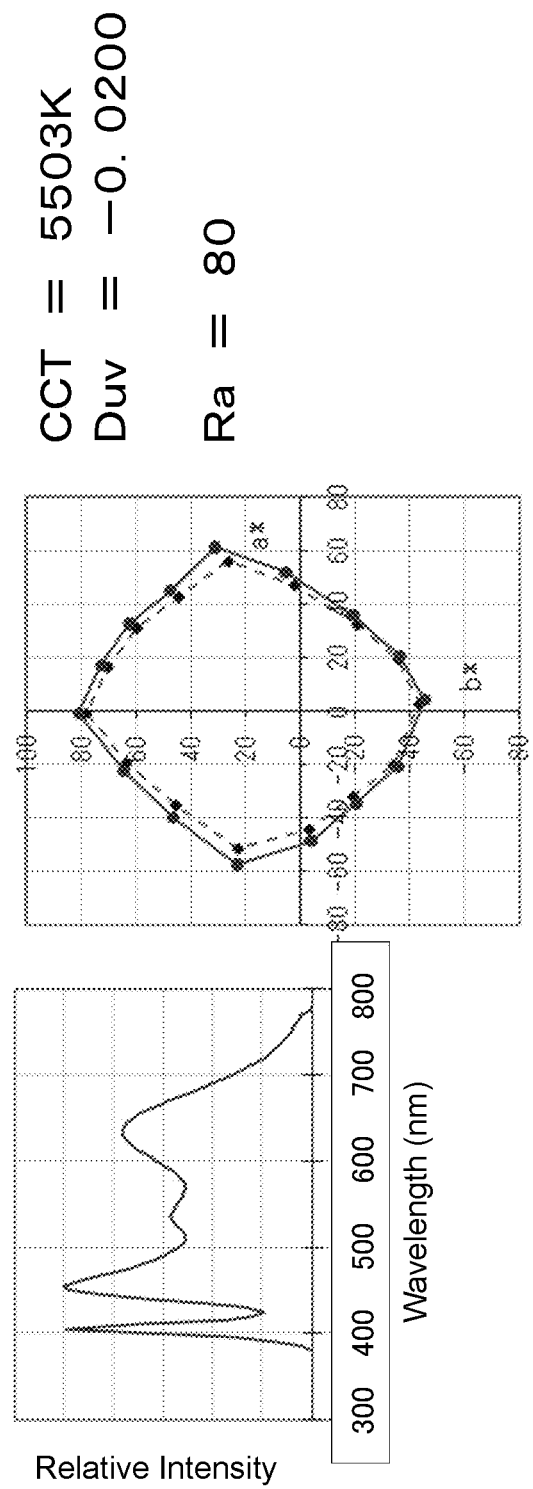
Figure 30:
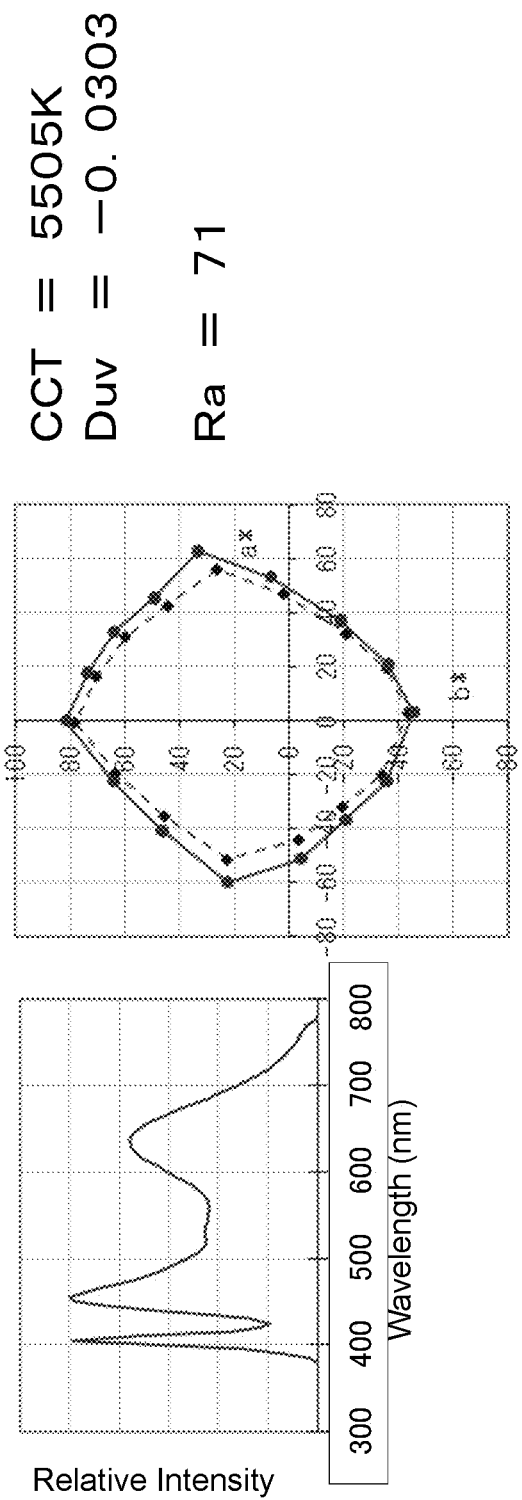
Figure 31:
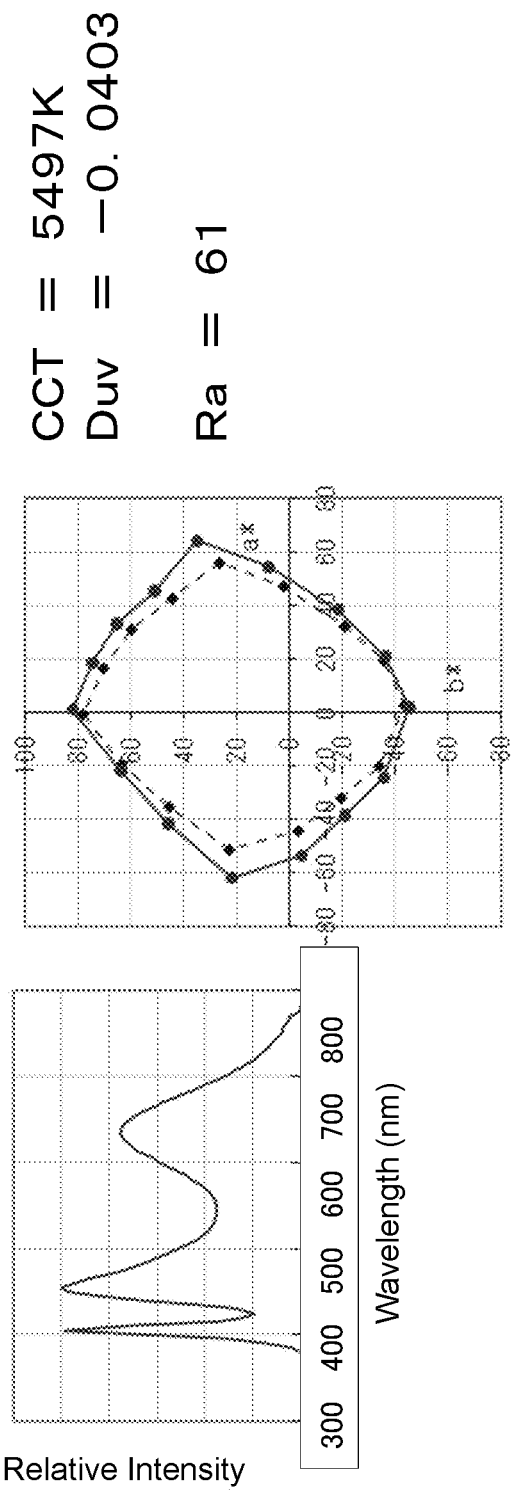
Figure 32:
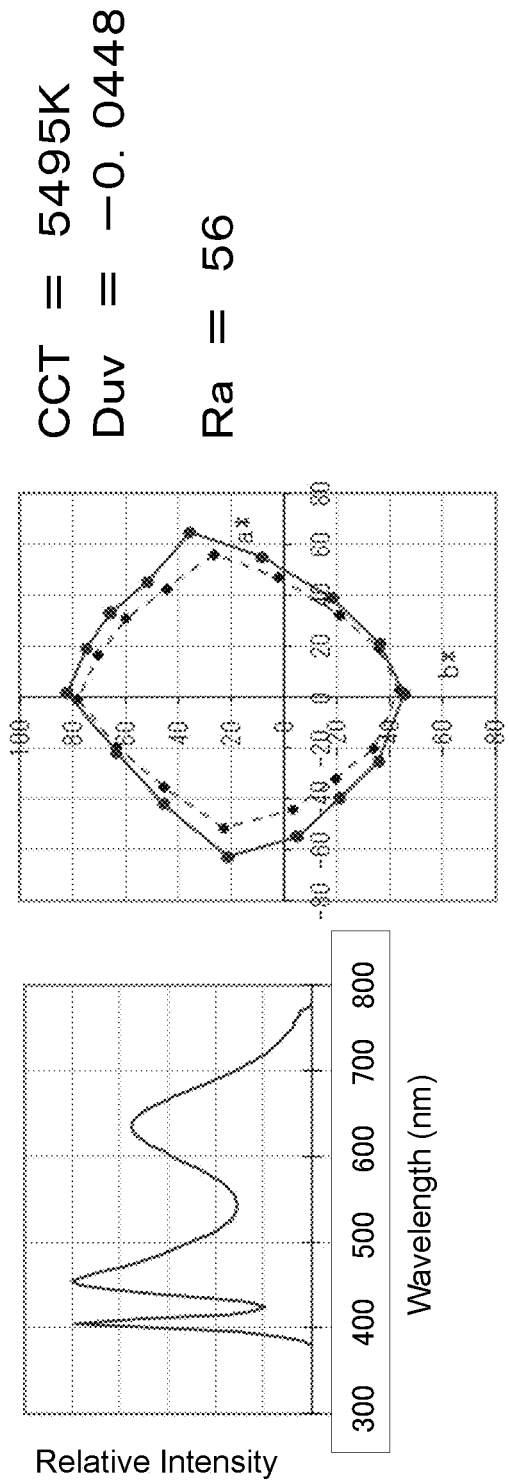
Figure 33:
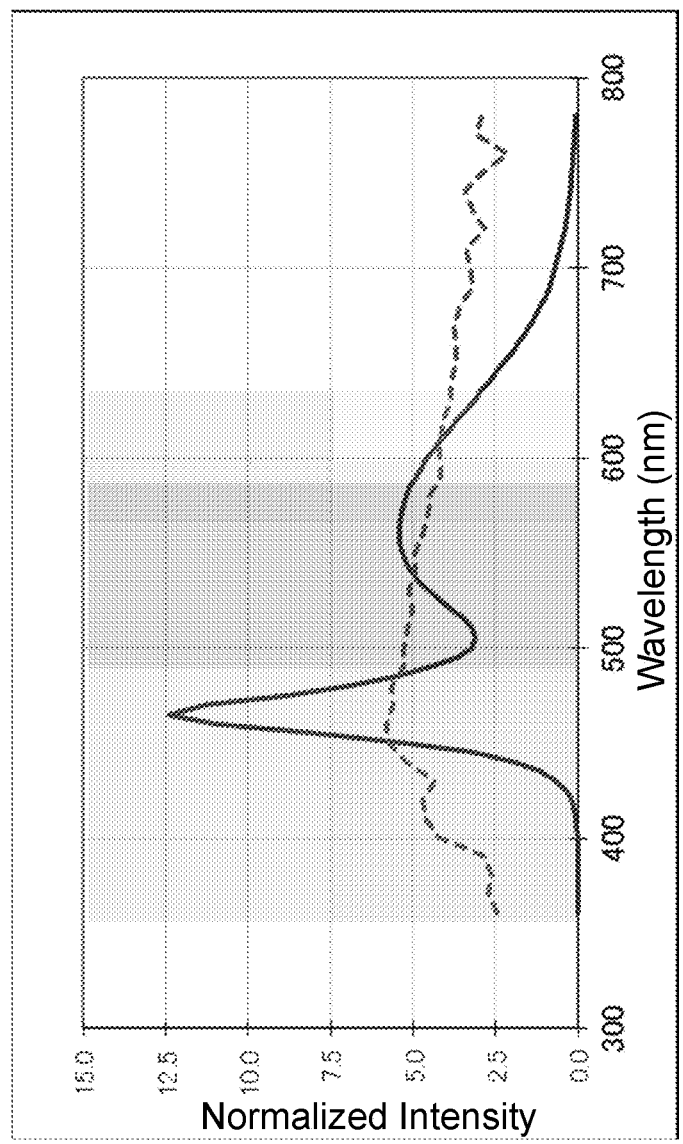
Figure 34:
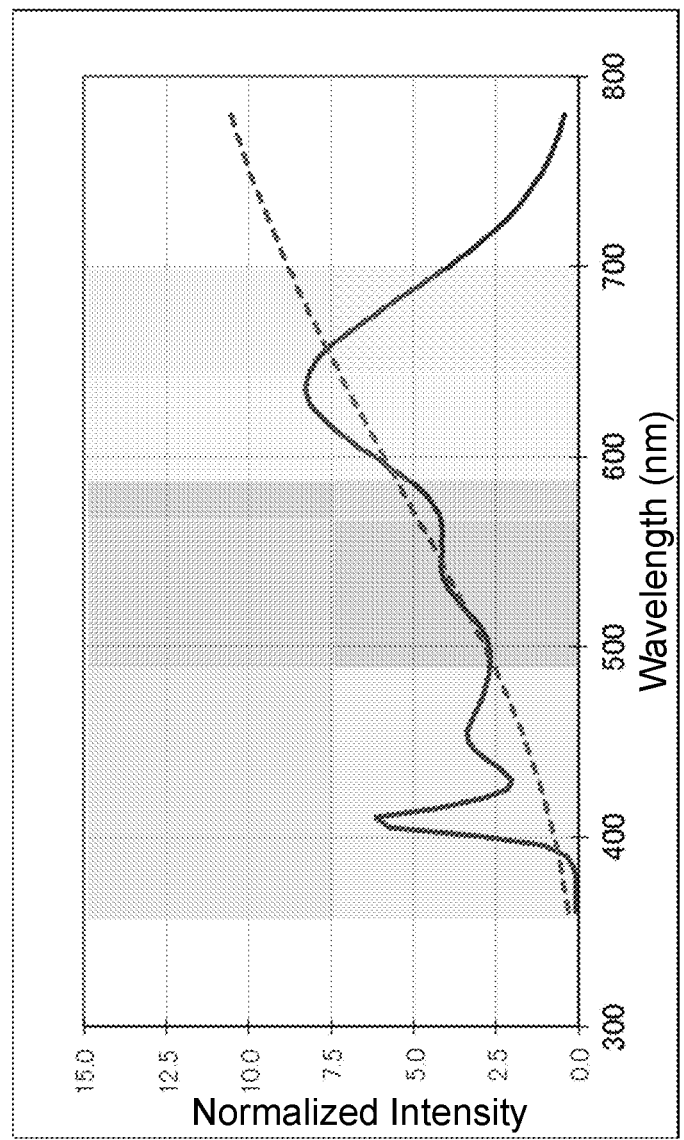
Figure 35:
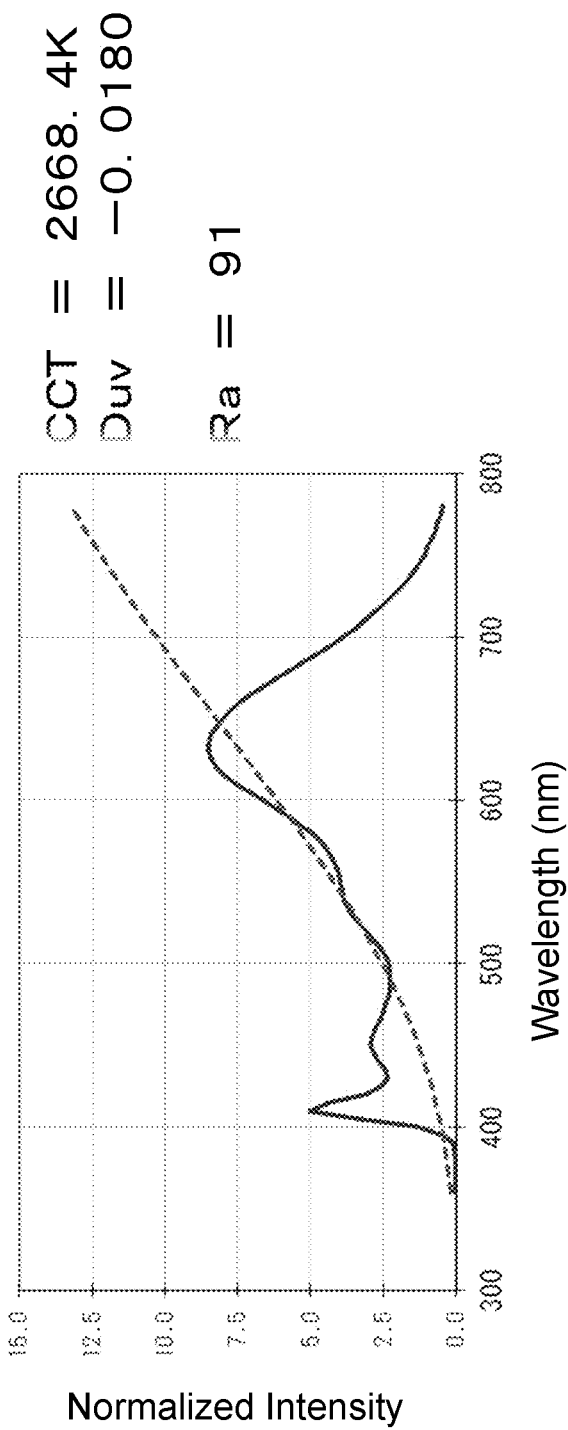
Figure 36:
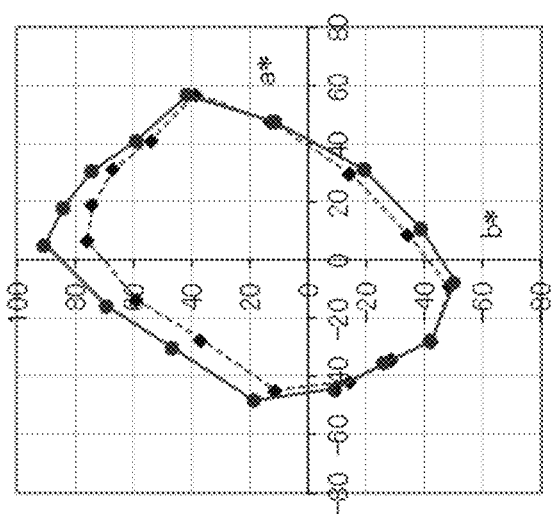
Figure 37:
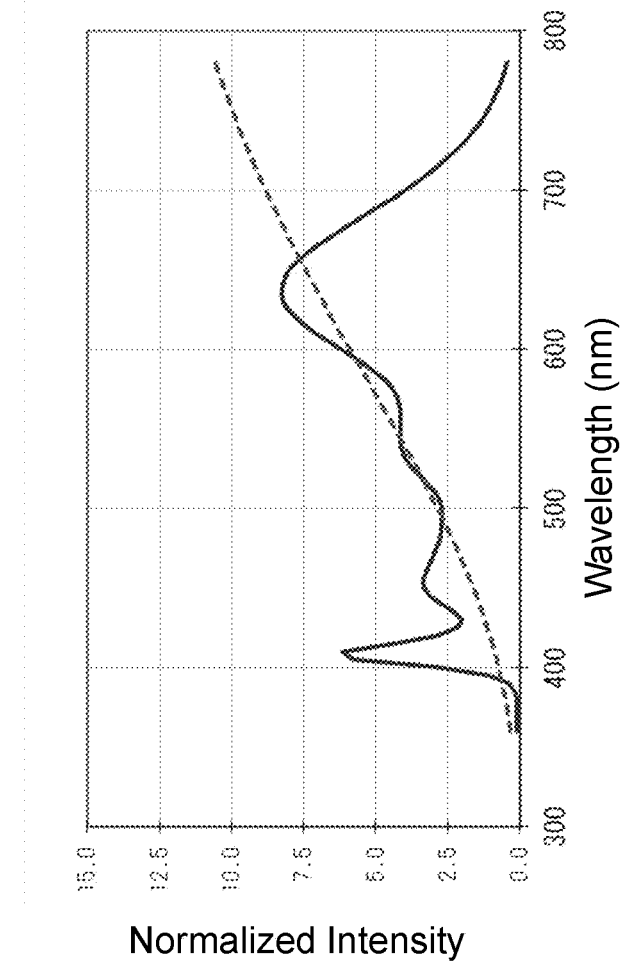
Figure 38:
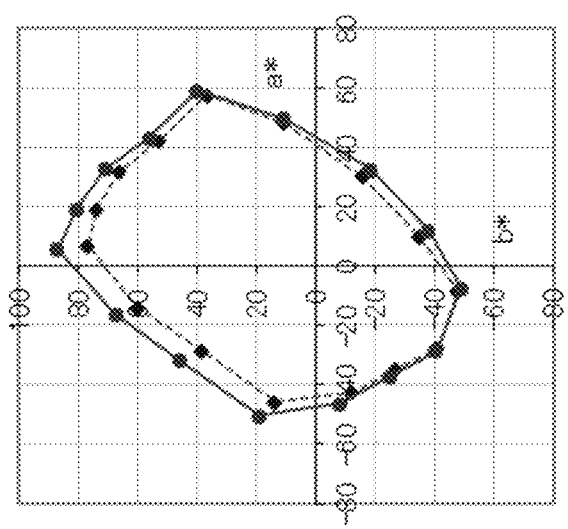
Figure 39:
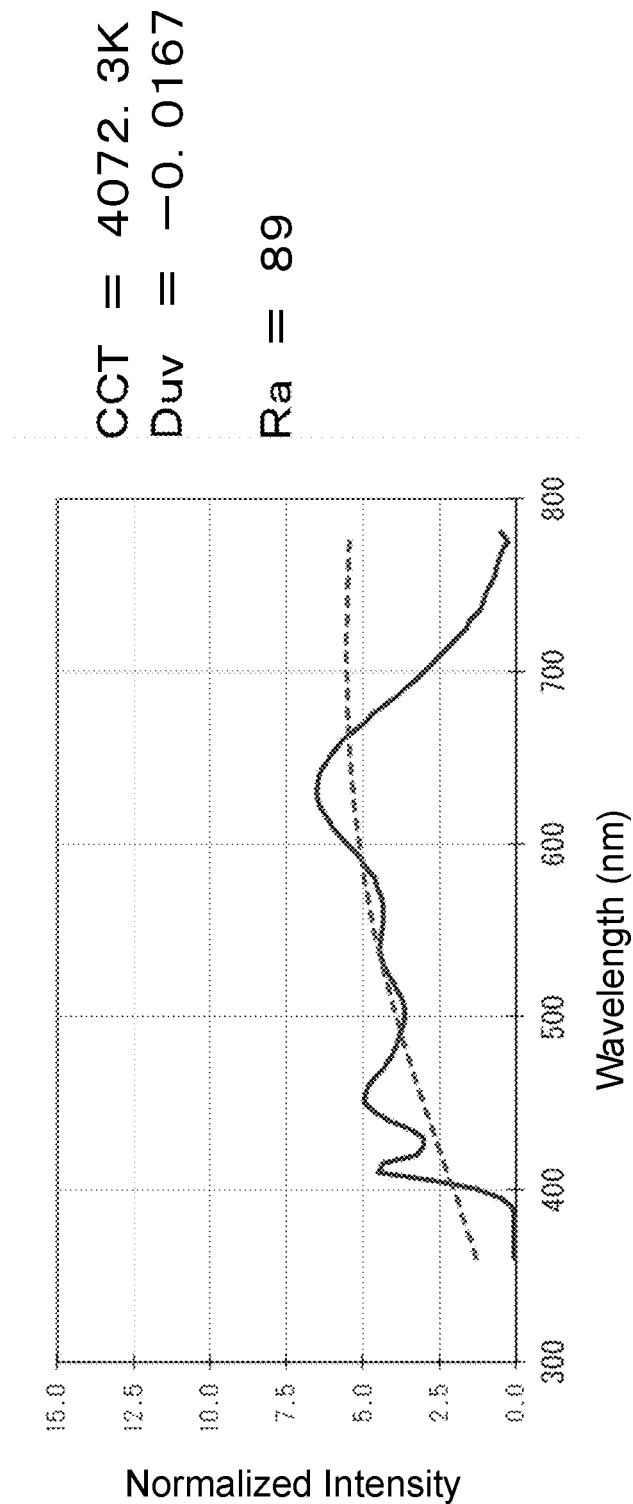
Figure 40:
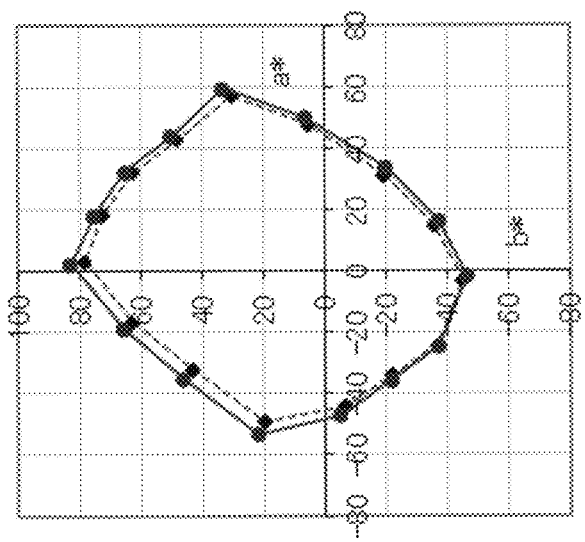
Figure 41:
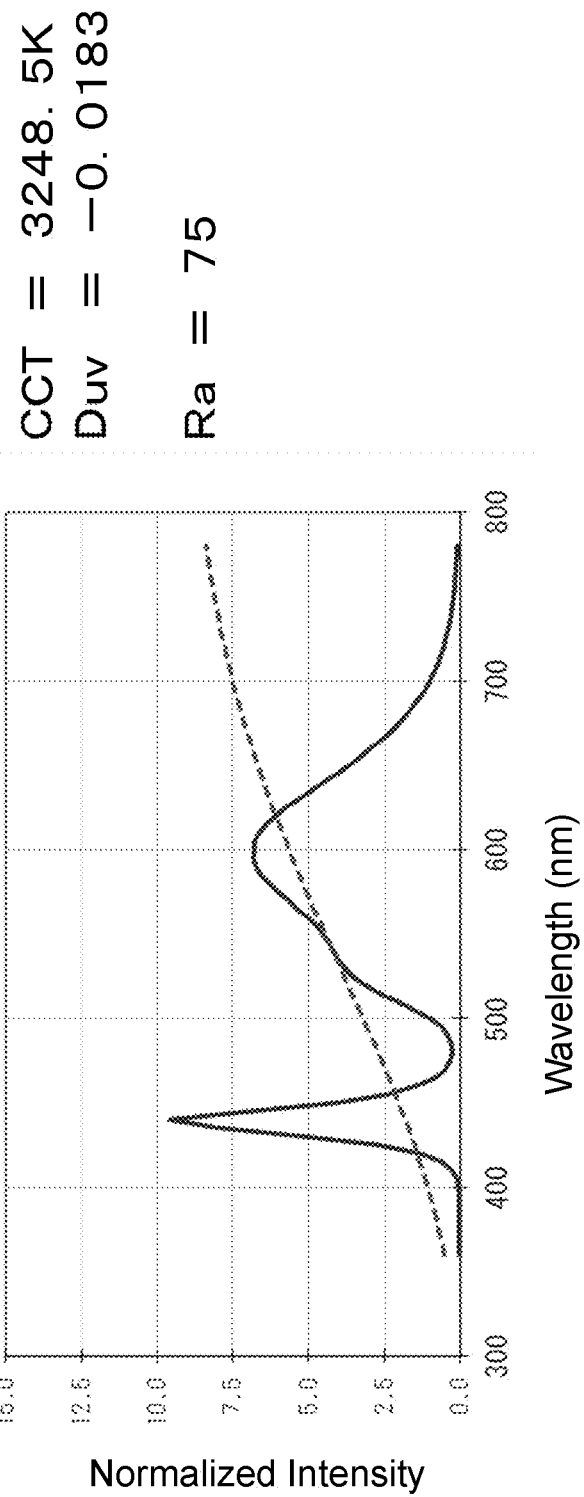
Figure 42:
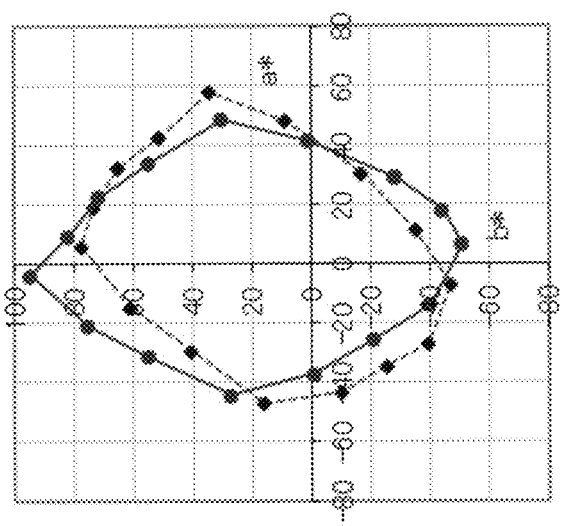

FIG. 25 is a diagram showing a spectral power distribution when assuming that light, emitted from a packaged LED which incorporates a semiconductor light-emitting element with a peak wavelength of 405 nm and which comprises a blue phosphor, a green phosphor, and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=0.0303);

FIG. 26 is a diagram showing a spectral power distribution when assuming that light, emitted from a packaged LED which incorporates a semiconductor light-emitting element with a peak wavelength of 405 nm and which comprises a blue phosphor, a green phosphor, and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=0.0401);

FIG. 27 is a diagram showing a spectral power distribution when assuming that light, emitted from a packaged LED which incorporates a semiconductor light-emitting element with a peak wavelength of 405 nm and which comprises a blue phosphor, a green phosphor, and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=0.0496);

FIG. 28 is a diagram showing a spectral power distribution when assuming that light, emitted from a packaged LED which incorporates a semiconductor light-emitting element with a peak wavelength of 405 nm and which comprises a blue phosphor, a green phosphor, and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=−0.0100);

FIG. 29 is a diagram showing a spectral power distribution when assuming that light, emitted from a packaged LED which incorporates a semiconductor light-emitting element with a peak wavelength of 405 nm and which comprises a blue phosphor, a green phosphor, and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=−0.0200);

FIG. 30 is a diagram showing a spectral power distribution when assuming that light, emitted from a packaged LED which incorporates a semiconductor light-emitting element with a peak wavelength of 405 nm and which comprises a blue phosphor, a green phosphor, and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=−0.0303);

FIG. 31 is a diagram showing a spectral power distribution when assuming that light, emitted from a packaged LED which incorporates a semiconductor light-emitting element with a peak wavelength of 405 nm and which comprises a blue phosphor, a green phosphor, and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=−0.0403);

FIG. 32 is a diagram showing a spectral power distribution when assuming that light, emitted from a packaged LED which incorporates a semiconductor light-emitting element with a peak wavelength of 405 nm and which comprises a blue phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv = −0.0448);

FIG. 33 is a diagram showing an integral range for a parameter $A_{cg}$ (when a CCT is 5000 K or higher);

FIG. 34 is a diagram showing an integral range of the parameter $A_{cg}$ (when a CCT is lower than 5000 K);

FIG. 35 is a diagram showing a normalized test light spectral power distribution (solid line) of test light 3 and a normalized reference light spectral power distribution (dotted line) of calculational reference light corresponding to the test light 3;

FIG. 36 is a diagram showing a CIELAB color space on which are respectively plotted a* values and b* values of the 15 Munsell renotation color samples when respectively assuming a case (solid line) where an object is illuminated by the test light 3 and a case where the object is illuminated by calculational reference light corresponding to the test light 3;

FIG. 37 is a diagram showing a normalized test light spectral power distribution (solid line) of test light 10 and a normalized reference light spectral power distribution (dotted line) of calculational reference light corresponding to the test light 10;

FIG. 38 is a diagram showing a CIELAB color space on which are respectively plotted a* values and b* values of the 15 Munsell renotation color samples when respectively assuming a case (solid line) where an object is illuminated by the test light 10 and a case where the object is illuminated by calculational reference light corresponding to the test light 10;

FIG. 39 is a diagram showing a normalized test light spectral power distribution (solid line) of test light 14 and a normalized reference light spectral power distribution (dotted line) of calculational reference light corresponding to the test light 14;

FIG. 40 is a diagram showing a CIELAB color space on which are respectively plotted a* values and b* values of the 15 Munsell renotation color samples when respectively assuming a case (solid line) where an object is illuminated by the test light 14 and a case where the object is illuminated by calculational reference light corresponding to the test light 14;

FIG. 41 is a diagram showing a normalized test light spectral power distribution (solid line) of comparative test light 19 and a normalized reference light spectral power distribution (dotted line) of calculational reference light corresponding to the comparative test light 19; and FIG. 42 is a diagram showing a CIELAB color space on which are respectively plotted a* values and b* values of the 15 Munsell renotation color samples when respectively assuming a case (solid line) where an object is illuminated by the comparative test light 19 and a case where the object is illuminated by calculational reference light corresponding to the comparative test light 19.

BEST MODE FOR CARRYING OUT THE INVENTION

While the present invention will be described in detail hereinafter, it is to be understood that the present invention is not limited to the embodiments described below and that various modifications can be made without departing from the spirit and scope of the invention.

Moreover, an illumination method according to a first embodiment of the present invention specifies the invention based on light at a position where an object is illuminated in a case where light emitted from a light-emitting device used in the illumination method illuminates the object. Therefore, illumination methods used by light-emitting devices capable of emitting light at a "position where an object is illuminated" which meets requirements of the present invention are to be included in the spirit and scope of the present invention.

In addition, an illuminating device according to second and third embodiments of the present invention specify the invention based on light in a "main radiant direction" among light emitted from a light-emitting device. Therefore, light-emitting devices capable of radiating light including light in a "main radiant direction" which meets requirements of the present invention are to be included in the spirit and scope of the present invention.

As used herein, the "main radiant direction" according to the second and third embodiments of the present invention refers to a direction in which light is radiated over a suitable range and in a suitable orientation which are in line with usage of the light-emitting device.

For example, the "main radiant direction" may be a direction in which luminous intensity or luminance of the light-emitting device is maximum or locally maximum.

In addition, the "main radiant direction" may be a direction having a finite range including a direction in which the luminous intensity or the luminance of the light-emitting device is maximum or locally maximum.

Alternatively, the "main radiant direction" may be a direction in which radiant intensity or radiance of the light-emitting device is maximum or locally maximum.

In addition, the "main radiant direction" may be a direction having a finite range including a direction in which the radiant intensity or the radiance of the light-emitting device is maximum or locally maximum.

Specific examples will be given below.

When the light-emitting device is an individual light-emitting diode (LED), an individual packaged LED, an individual LED module, an individual LED bulb, an individual fluorescent lamp, an individual incandescent bulb, or the like, a main radiant direction may be a vertical direction of each light-emitting device or within a finite solid angle which includes the vertical direction and which ranges between, for example, a maximum of $\pi$ (sr) and a minimum of $\pi/100$ (sr).

When the light-emitting device is an LED lighting fixture in which a lens, a reflection mechanism, and the like is added to the packaged LED or the like or a lighting fixture which incorporates a fluorescent lamp and which has light distribution characteristics applicable to so-called direct lighting use, semi-direct lighting use, general diffused lighting use, direct/indirect lighting use, semi-indirect lighting use, and indirect lighting use, a main radiant direction may be a vertical direction of each light-emitting device or within a finite solid angle which includes the vertical direction and which ranges between, for example, a maximum of $\pi$ (sr) and a minimum of $\pi/100$ (sr). In addition, the main radiant direction may be a direction in which luminous intensity or luminance of the light-emitting device is maximum or locally maximum. Furthermore, the main radiant direction may be within a finite solid angle that includes a direction in which luminous intensity or luminance of the light-emitting device is maximum or locally maximum and which ranges between, for example, a maximum of $\pi$ (sr) and a minimum of $\pi/100$ (sr). In addition, the main radiant direction may be a direction in which radiant intensity or radiance of the light-emitting device is maximum or locally maximum. Furthermore, the main radiant direction may be within a finite solid angle which includes a direction in which radiant intensity or radiance of the light-emitting device is maximum or locally maximum and which ranges between, for example, a maximum of $\pi$ (sr) and a minimum of $\pi/100$ (sr).

When the light-emitting device is a lighting system in which a plurality of the LED lighting fixtures or lighting fixtures incorporating a fluorescent lamp is mounted, the main radiant direction may be a vertical direction of a planar center of each light-emitting device or within a finite solid angle which includes the vertical direction and which ranges between, for example, a maximum of $\pi$ (sr) and a minimum of $\pi/100$ (sr). In addition, the main radiant direction may be a direction in which luminous intensity or luminance of the light-emitting device is maximum or locally maximum. Furthermore, the main radiant direction may be within a finite solid angle which includes a direction in which luminous intensity or luminance of the light-emitting device is maximum or locally maximum and which ranges between, for example, a maximum of $\pi$ (sr) and a minimum of $\pi/100$ (sr). In addition, the main radiant direction may be a direction in which radiant intensity or radiance of the light-emitting device is maximum or locally maximum. Furthermore, the main radiant direction may be within a finite solid angle which includes a direction in which radiant intensity or radiance of the light-emitting device is maximum or locally maximum and which ranges between, for example, a maximum of $\pi$ (sr) and a minimum of $\pi/100$ (sr).

A spectral power distribution of light emitted in the main radiant direction by the light-emitting device is favorably measured at a distance where illuminance at a measuring point is a practical illuminance (as will be described later, 150 lx or higher and 5000 lx or lower).

In the present specification, reference light as defined by CIE which is used in calculations for estimating a mathematical color appearance may sometimes be referred to as reference light, calculational reference light, and the like. On the other hand, experimental reference light which is used when making actual visual comparisons or, in other words, light from an incandescent bulb which incorporates a tungsten filament or the like may sometimes be referred to as reference light, experimental reference light and the like. In addition, light with a high $R_a$ and a high $R_i$ which is estimated to have a color appearance that is close to reference light such as light from an LED light source which is used as alternate light for experimental reference light in a visual comparison experiment may sometimes be referred to as reference light, experimental pseudo-reference light and the like. Furthermore, light that is an object of a mathematical or experimental examination may sometimes be referred to as test light in contrast to reference light.

The light-emitting device used in the illumination method according to the first embodiment includes a light-emitting element. In addition, the light-emitting device according to the second embodiment of the present invention includes a light-emitting element. The light-emitting element is not particularly limited as long as it can emit light corresponding to a range of 380 nm to 780 nm in some way, and examples of the light-emitting element include thermal emission light from a hot filament or the like, electric discharge emission light from a fluorescent tube, a high-pressure sodium lamp, or the like, stimulated emission light from a laser or the like, spontaneous emission light from a semiconductor light-emitting element, and spontaneous emission light from a phosphor. The light-emitting device according to the present embodiment is not particularly limited in configurations other than the above.

Therefore, for example, an individual semiconductor light-emitting element to which a lead or the like as a conducting mechanism is added or a packaged LED to which a heat dissipating mechanism is further added and integrated with a phosphor or the like may be adopted as the light-emitting device according to the present embodiment when the light-emitting device includes a semiconductor light-emitting device as the light emitting element. In addition, an LED module in which a robust heat dissipating mechanism is added to one or more packaged LEDs and which is generally mounted with a plurality of packaged LEDs may be adopted. Furthermore, an LED lighting fixture in which a lens, a reflecting mechanism, and the like are added to a packaged LED may be adopted. Moreover, a lighting system which supports a large number of LED lighting fixtures or the like and which is configured to be capable of illuminating an object may be adopted. The light-emitting device according to the present embodiment encompasses all of the above. Still further, for example, an individual electric discharge tube to which a mechanism capable of applying a high voltage is added or an electric discharge tube having a phosphor arranged in the interior or circumference thereof may be adopted as the light-emitting device according to the present embodiment when the light-emitting device includes an electric discharge tube as the light-emitting element. A lighting fixture in which a plurality of fluorescent tubes incorporating one or more phosphors are disposed may also be adopted. Furthermore, a lighting fixture to which a reflecting mechanism or the like is added may be adopted. Moreover, a control circuit or the like may be added to the lighting fixture to provide a lighting system. The light-emitting device according to the present embodiment encompasses all of the above.

Hereinafter, the present invention will be described in detail.

The present inventor has discovered a radiometric property or a photometric property common to spectra or spectral power distributions capable of realizing a color appearance or an object appearance which is as natural, vivid, highly visible, and comfortable as though perceived outdoors in a high-illuminance environment even in an ordinary indoor illuminance environment. The present inventor further ascertained, from a colorimetric perspective, in what way the color appearance of the color samples having specific spectral reflectance characteristics when assuming that the color is illuminated by light having the aforementioned spectrum or spectral power distribution changes (or does not change) when the object described above is achieved in comparison with a case where illumination by calculational reference light is assumed, and collectively reached the present invention. It should be noted that the present invention was made based on experimental facts which defy common and conventional wisdom.

Specific circumstances leading to the invention can be summarized as follows.

[Summary of Circumstances Leading to Invention]

As a first step, a baseline mathematical examination was conducted on the assumption of: A) a packaged LED light source incorporating both a semiconductor light-emitting element and a phosphor; and B) a packaged LED light source which does not include a phosphor and which only incorporates a semiconductor light-emitting element as a light-emitting element, which both have a high degree of freedom in setting a spectral power distribution.

In doing so, by employing, as a guideline, a mathematical variation regarding the color appearance of a color sample having specific spectral reflectance characteristics between a case where illumination by calculational reference light is assumed and a case where illumination by test light that is an examination object is assumed, test lights causing changes in hue, saturation (chroma), or the like were examined in detail. In particular, while being aware of the Hunt effect in an ordinary indoor environment where illuminance drops to around $\frac{1}{10}$ to $\frac{1}{1000}$ as compared to outdoors, the mathematical examination focused on light sources with variations in saturation of color appearance of an illuminated object.

As a second step, prototypes of a packaged LED light source and a lighting fixture incorporating the packaged LED light source were made based on the mathematically examined spectrum (test light). In addition, for comparative visual experiments to be performed in a third step, an incandescent bulb with a tungsten filament was prepared as experimental reference light.

Furthermore, prototypes of a light source capable of emitting light (experimental pseudo-reference light) with high $R_a$ and high $R_i$ and which produces a color appearance that is close to that of calculational reference light as well as a lighting fixture incorporating the light source were also made. Moreover, for visual experiments using the above, in order to have subjects evaluate a color appearance when an object is illuminated by experimental reference light or experimental pseudo-reference light and a color appearance when the object is illuminated by light (test light) of a lighting fixture incorporating the packaged LED light source, an illumination experiment system capable of illuminating different illuminating light on a large number of observation objects was fabricated.

As a third step, comparative visual experiments were performed. Due consideration was given to preparing chromatic objects so that colors of the observation objects covered all hues including purple, bluish purple, blue, greenish blue, green, yellowish green, yellow, reddish yellow, red, and reddish purple. Achromatic objects such as white objects and black objects were also prepared. These chromatic and achromatic objects were prepared in wide varieties and in large numbers including still objects, fresh flowers, food, clothing, and printed material. At this point, the subjects were asked to evaluate a color appearance when the objects were illuminated by experimental reference light or experimental pseudo-reference light and a color appearance when the objects were illuminated by test light. Comparisons between the former and the latter were performed at similar CCTs and similar illuminance. The subjects were asked to perform evaluations from the perspective of which of the lights had relatively achieved a color appearance or an object appearance that is as natural, vivid, highly visible, and comfortable as though perceived outdoors. The subjects were also asked the reasons for their judgment regarding which is superior or inferior.

As a fourth step, radiometric properties and photometric properties of the experimental reference light/experimental pseudo-reference light and the test light were extracted from actual measured values. Furthermore, a difference in calorimetric properties regarding a color appearance of color samples having specific spectral reflectance characteristics which differs from the observation objects described above between a case where illumination at a spectral power distribution of calculational reference light is calculationally assumed and a case where illumination at a spectral power distribution of an actually measured experimental reference light/experimental pseudo-reference light/test light is calculationally assumed was compared with the evaluations by the subjects in the visual experiments, and characteristics of the illumination method or the light-emitting device determined to be truly comfortable were extracted. Moreover, contents of the third and fourth steps also represent examples/comparative examples of the illumination method according to the first embodiment of the present invention, and contents of the second, third, and fourth steps also represent examples/comparative examples of the light-emitting device according to the second and third embodiments of the present invention.

[Quantification Method of Color Samples' Selection and Color Appearance]

In the first step, in consideration of the Hunt effect, a spectral power distribution at a position where light emitted from a light-emitting device mainly examined in the illumination method according to the present invention illuminates an object and a spectral power distribution of light in a main radiant direction which is emitted by the light-emitting device according to the present invention was assumed to vary saturation of an illuminated object from a case where illumination is performed using reference light. At this point, the following selections were made in order to quantify a color appearance or a variation thereof.

It was considered that, in order to quantitatively evaluate a color appearance from a spectral power distribution, a color sample with obvious mathematical spectral reflectance characteristics is favorably defined and a difference in color appearance of the color sample between a case of illumination by calculational reference light and a case of illumination by test light is adopted as an index.

Although test colors used in CRI are general choices, color samples $R_1$ to $R_8$ which are used when deriving an average color rendering index or the like are color samples with intermediate chroma and were therefore considered unsuitable when discussing saturation of high-chroma colors. In addition, while $R_9$ to $R_{12}$ are high-chroma color samples, there are not enough samples for a detailed discussion covering a range of all hue angles.

Therefore, it was decided that 15 color samples (one color sample per hue) be selected from color samples which have the highest chroma and which are positioned outermost in a Munsell color circle according to the Munsell renotation color system. Moreover, these are the same color samples used in CQS (Color Quality Scale) (versions 7.4 and 7.5) that is a new color rendition metric proposed by NIST (National Institute of Standards and Technology), U.S.A. The 15 color samples used in the present invention will be listed below. In addition, a number assigned for convenience sake are provided before each color sample. Moreover, in the present specification, these numbers will sometimes be represented by n. For example, n=3 signifies "5PB 4/12". n denotes a natural number from 1 to 15.

01 7.5P 4/10
02 10PB 4/10
03 5PB 4/12
04 7.5B 5/10
05 10 BG 6/8
06 2.5BG 6/10
07 2.5G 6/12
08 7.5 GY 7/10
09 2.5GY 8/10
10 5Y 8.5/12
11 10YR 7/12
12 5YR 7/12
13 10R 6/12
14 5R 4/14
15 7.5RP 4/12

In the present invention, from the perspective of deriving various indices, an attempt was made to quantify in what way the color appearance of the 15 color samples listed above changes (or does not change) between a case where the colors are assumed to be illuminated by calculational reference light and a case where the colors are assumed to be illuminated by test light when a color appearance or an object appearance that is as natural, vivid, highly visible, and comfortable as though perceived in an outdoor high-illuminance environment is achieved even in an ordinary indoor illuminance environment, and to extract results of the quantification as a color rendering property that should be attained by a light-emitting device.

Moreover, selection of a color space and selection of a chromatic adaptation formula are also important when quantitatively evaluating color appearance that is mathematically derived from the spectral power distributions described above. In the present invention, CIE 1976 L*a*b* (CIELAB) that is a uniform color space currently recommended by the CIE was used. In addition, CMCCAT2000 (Colour Measurement Committee's Chromatic Adaptation Transform of 2000) was adopted for chromatic adaptation calculation.

[Chromaticity Points Derived from Spectral Power Distribution at Position where Object is Illuminated or from Spectral Power Distribution of Light in Main Radiant Direction Emitted from Light-Emitting Device]

In the first step, selection of a chromaticity point of a light source is also important when making various prototypes of a packaged LED light source. Although chromaticity derived from a light source, a spectral power distribution at a position where an object is illuminated by light from the light source, or a spectral power distribution of light in a main radiant direction emitted from a light-emitting device can be defined by, for example, a CIE 1931 (x,y) chromaticity diagram, the derived chromaticity is favorably discussed using a CIE 1976 (u',v') chromaticity diagram which is a more uniform chromaticity diagram. In addition, when describing a position on a chromaticity diagram using a CCT and $D_{uv}$, a (u', (2/3)v') chromaticity diagram (synonymous with a CIE 1960 (u,v) chromaticity diagram) is particularly used. Moreover, $D_{uv}$ as described in the present specification is an amount defined by ANSI C78.377 and represents a distance of closest approach to a black-body radiation locus on a (u', (2/3)v') chromaticity diagram as an absolute value thereof. Furthermore, a positive sign means that a chromaticity point of a light-emitting device is above (on a side where v' is greater than) the black-body radiation locus, and a negative sign means that the chromaticity point of the light-emitting device is below (on aside where v' is smaller than) the black-body radiation locus.

[Examination of Calculation Regarding Saturation and $D_{uv}$ Value]

Figure 1:
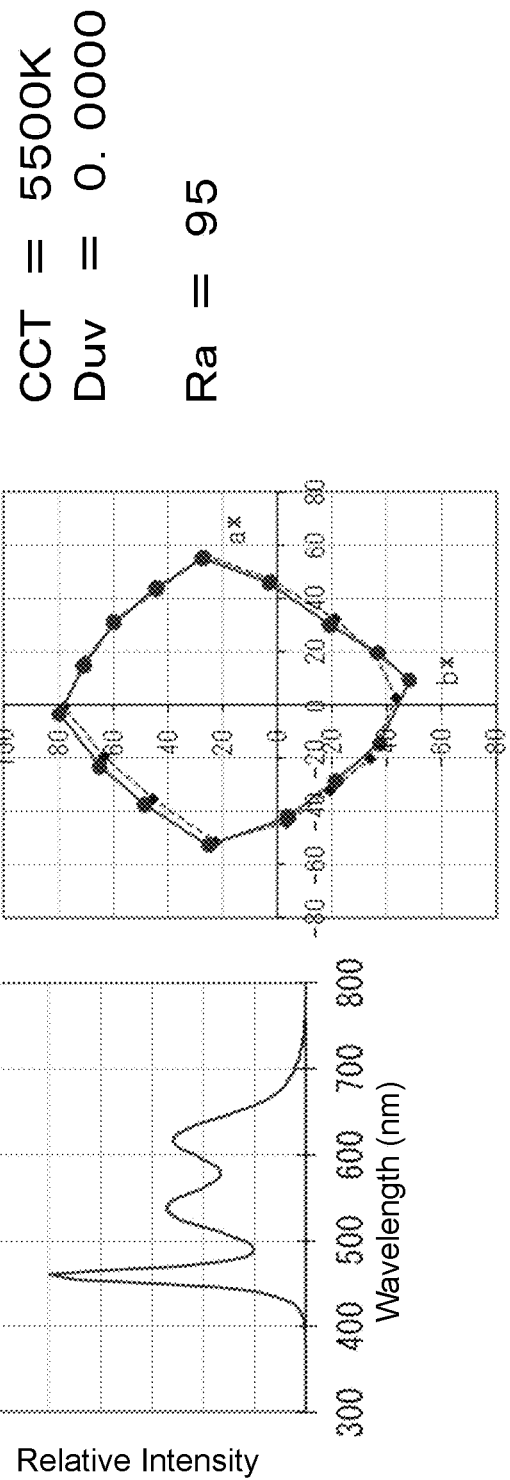
FIG. 1 is a diagram showing a spectral power distribution when assuming that light, emitted from a packaged LED which incorporates a semiconductor light-emitting element with a peak wavelength of 459 nm and which comprises a green phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light.
Figure 2:
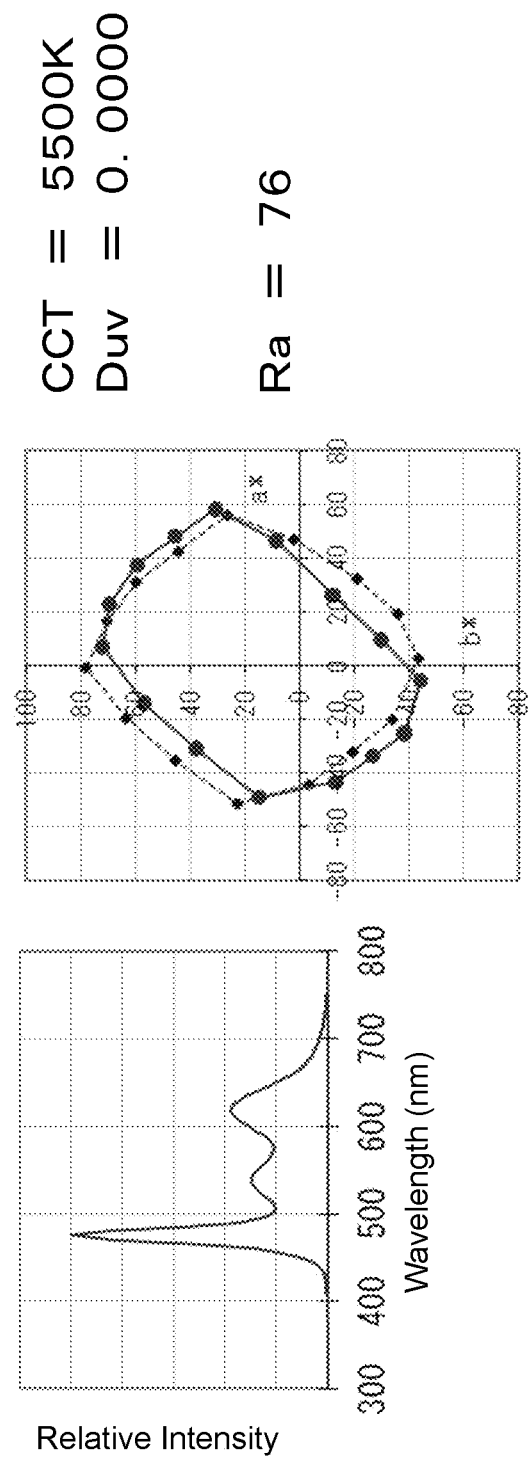
FIG. 2 is a diagram showing a spectral power distribution when assuming that light, emitted from a packaged LED which incorporates a semiconductor light-emitting element with a peak wavelength of 475 nm and which comprises a green phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light.
Figure 3:
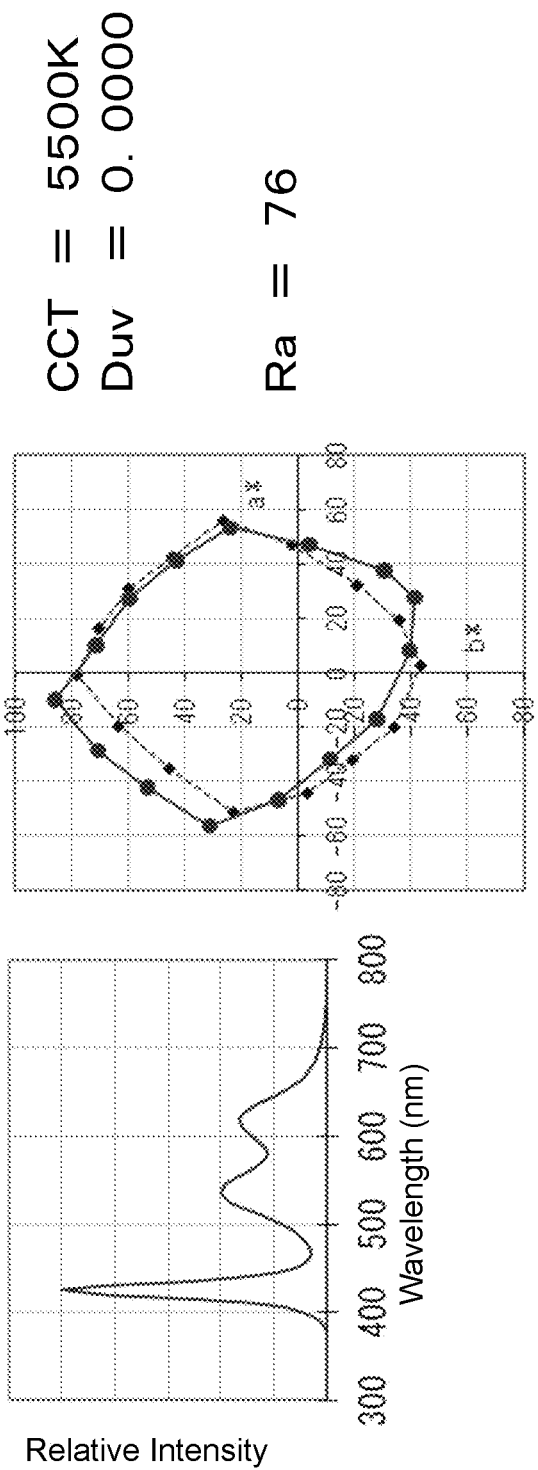
FIG. 3 is a diagram showing a spectral power distribution when assuming that light, emitted from a packaged LED which incorporates a semiconductor light-emitting element with a peak wavelength of 425 nm and which comprises a green phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light.

The color appearance of an object can vary even if the chromaticity point remains the same. For example, the three spectral power distributions (test lights) shown in FIGS. 1, 2, and 3 represent an example where the color appearance of an illuminated object is varied at a same chromaticity (CCT=5500 K, $D_{uv}$=0.0000) when assuming a packaged LED which incorporates a semiconductor light-emitting element with a peak wavelength from 425 to 475 nm and which uses the semiconductor light-emitting element as an excitation light source of a green phosphor and a red phosphor. While it is assumed that same materials are used for the green phosphor and the red phosphor constituting the respective spectral power distributions, in order to vary saturation, peak wavelengths of blue semiconductor light-emitting elements were respectively set to 459 nm for FIG. 1, 475 nm for FIG. 2, and 425 nm for FIG. 3. Expected color appearances of the 15 color samples when assuming illumination at the respective spectral power distributions and illumination by calculational reference lights corresponding to the respective spectral power distributions are as depicted in the CIELAB color spaces in FIGS. 1 to 3. In the drawings, points connected by dotted lines represent illumination by calculational reference light and points connected by solid lines represent illumination by test light. Moreover, while a direction perpendicular to the plane of paper represents lightness, only a* and b* axes were plotted for the sake of convenience.

The following findings were made regarding the spectral power distribution shown in FIG. 1. Based on calculations assuming illumination by calculational reference light and calculations assuming illumination by the test lights shown in the drawings, it was predicted that the color appearances of the 15 color samples will closely resemble one another. In addition, Ra calculated based on the spectral power distribution was high at 95. In a case where illumination by the test light shown in FIG. 2 is assumed, it was predicted that red and blue will appear vivid but purple and green will dull as compared to a case where illumination by calculational reference light is assumed. Ra calculated based on the spectral power distribution was relatively low at 76. Conversely, in a case where illumination by the test light shown in FIG. 3 is assumed, it was predicted that purple and green will appear vivid but red and blue will dull as compared to a case where illumination by calculational reference light is assumed. Ra calculated based on the spectral power distribution was relatively low at 76.

As described above, it was found that color appearances can be varied at the same chromaticity point.

However, a detailed examination by the present inventor revealed that a degree of freedom of light in a vicinity of a black-body radiation locus or, in other words, light whose $D_{uv}$ is in a vicinity of 0 is insufficient to vary spectral power distribution and vary the color appearance of the 15 high-saturation color samples. A more specific description will be given below.

For example, as shown in FIGS. 2 and 3, opposite tendencies were predicted for a variation in saturation of red/blue and a variation in saturation of purple/green. In other words, it was predicted that when saturation of a certain hue increases, saturation of another hue decreases. In addition, according to another examination, it was difficult to simultaneously vary saturation of a large number of hues using a simple and feasible method. Therefore, when illuminating with light in a vicinity of a black-body radiation locus or light whose $D_{uv}$ is in a vicinity of 0, it was difficult to simultaneously vary saturation of a large number of hues of the 15 high-chroma color samples, to relatively uniformly increase or decrease saturation of many hues, and the like.

In consideration thereof, the present inventor mathematically examined color appearances of the 15 color samples when assigning different $D_{uv}$ values to a plurality of spectral power distributions while comparing with a case where illumination is performed by calculational reference light. Generally, it is thought that white appears greenish when $D_{uv}$ is biased toward positive, white appears reddish when $D_{uv}$ takes a negative value, and overall color appearance becomes unnatural when $D_{uv}$ deviates from the vicinity of 0. In particular, it is thought that coloring of white induces such perceptions. However, the present inventor conducted the following examination with an aim to increase saturation controllability.

The eight spectral power distributions shown in FIGS. 4 to 11 represent calculation results of varying $D_{uv}$ from −0.0500 to +0.0150 at a same CCT (2700 K) when assuming a packaged LED which incorporates a blue semiconductor light-emitting element with a peak wavelength of 459 nm and which uses the blue semiconductor light-emitting element as an excitation light source of a green phosphor and a red phosphor. Expected color appearances of the 15 color samples when assuming illumination at the respective spectral power distributions (test lights) and illumination by calculational reference lights corresponding to the respective test lights are as represented in the CIELAB color spaces in FIGS. 4 to 11. In the drawings, points connected by dotted lines represent results regarding the calculational reference lights and points connected by solid lines represent results regarding respective test lights. Moreover, while a direction perpendicular to the plane of paper represents lightness, only a* and b* axes were plotted for the sake of convenience.

Figure 4:
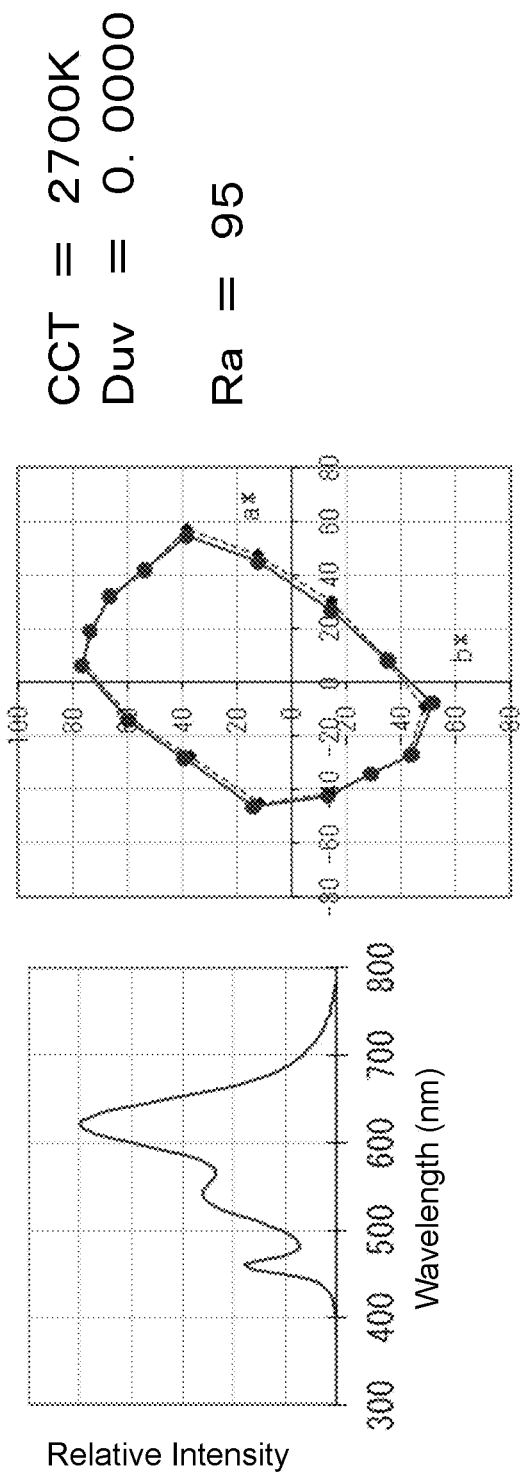
FIG. 4 is a diagram showing a spectral power distribution when assuming that light, emitted from a packaged LED which incorporates a semiconductor light-emitting element with a peak wavelength of 459 nm and which comprises a green phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv =0.0000)

With the test light with $D_{uv}$=0.0000 shown in FIG. 4, it was predicted that the color appearances of the 15 color samples will closely resemble one another between a case where illumination by calculational reference light is assumed and a case where illumination by the test light shown in FIG. 4 is assumed. Ra calculated based on the spectral power distribution was high at 95.

Figure 5:
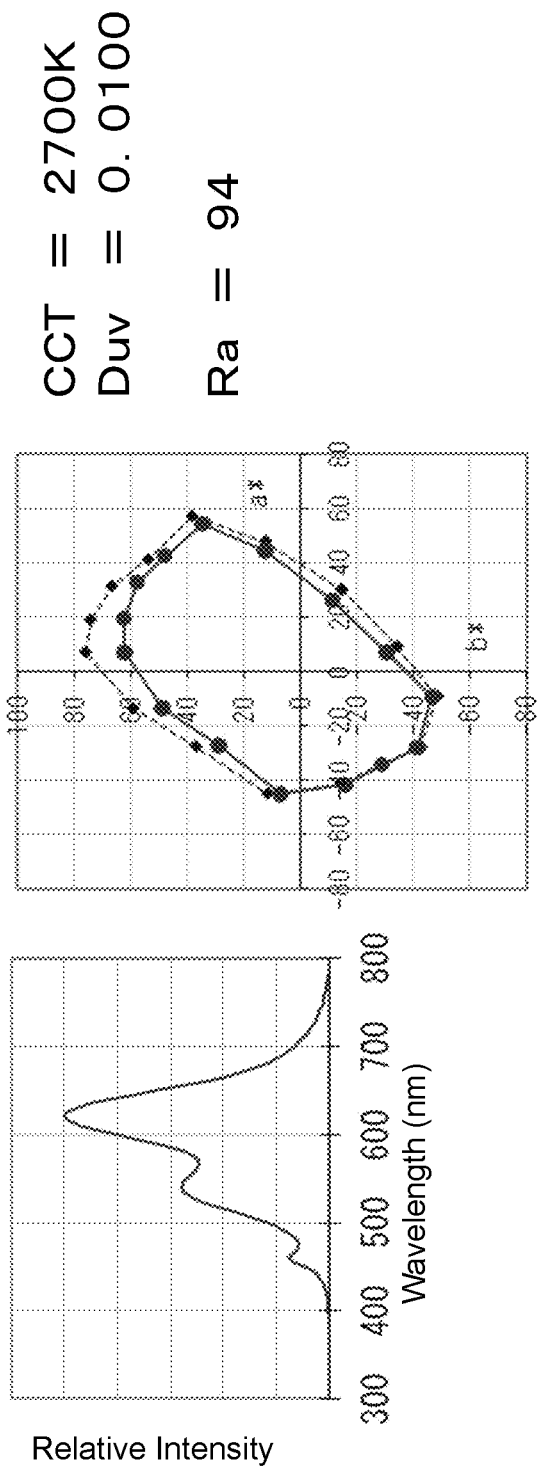
FIG. 5 is a diagram showing a spectral power distribution when assuming that light, emitted from a packaged LED which incorporates a semiconductor light-emitting element with a peak wavelength of 459 nm and which comprises a green phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv =0.0100)
Figure 6:
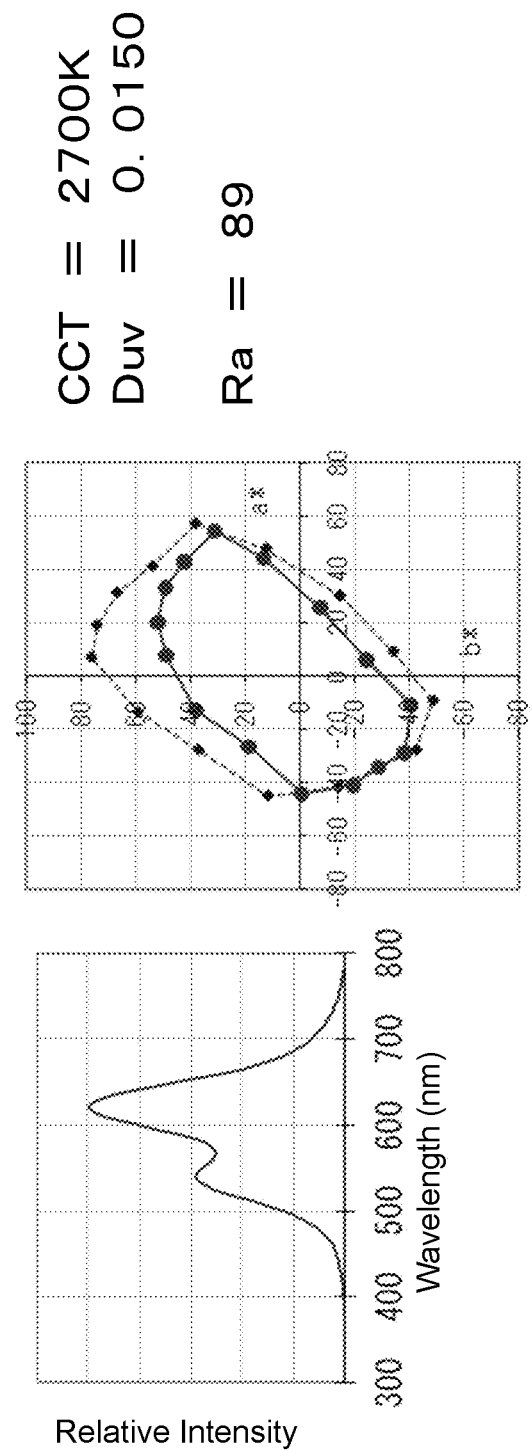
FIG. 6 is a diagram showing a spectral power distribution when assuming that light, emitted from a packaged LED which incorporates a semiconductor light-emitting element with a peak wavelength of 459 nm and which comprises a green phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv =0.0150)
Figure 7:
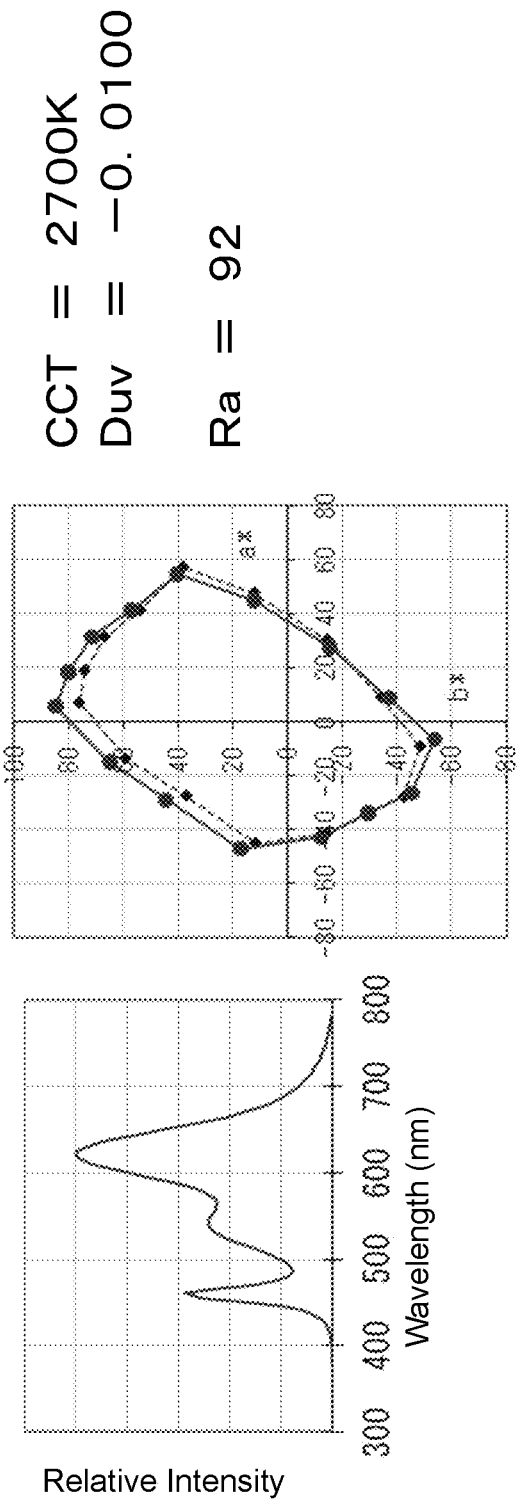
FIG. 7 is a diagram showing a spectral power distribution when assuming that light, emitted from a packaged LED which incorporates a semiconductor light-emitting element with a peak wavelength of 459 nm and which comprises a green phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv =−0.0100)
Figure 8:
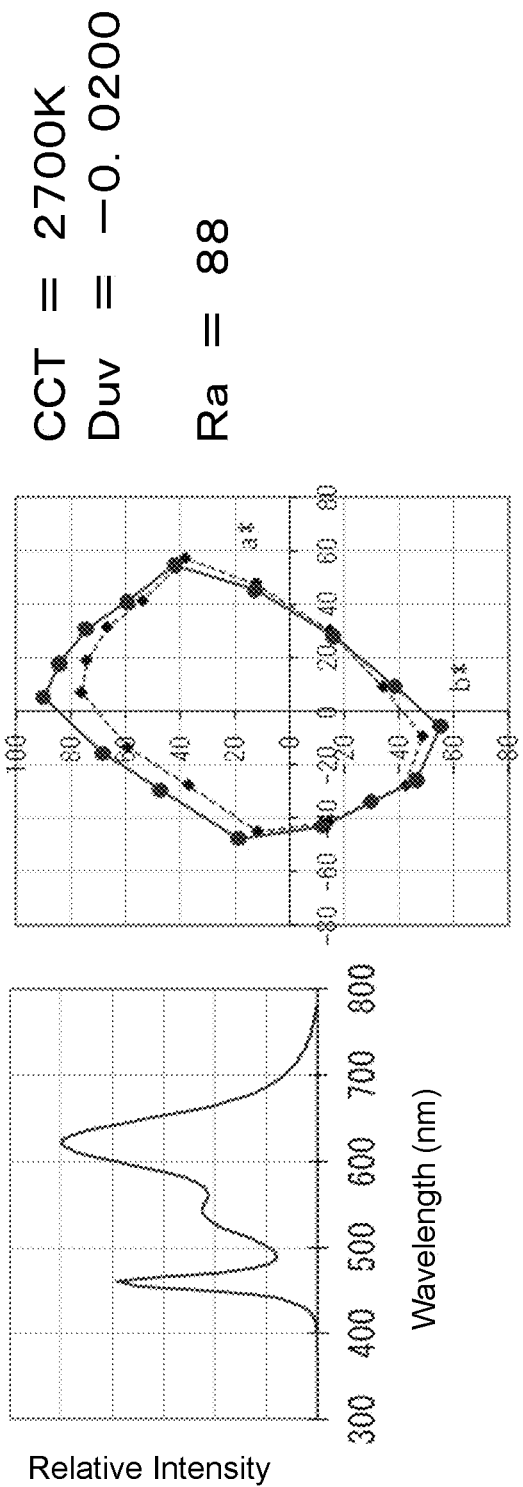
FIG. 8 is a diagram showing a spectral power distribution when assuming that light, emitted from a packaged LED which incorporates a semiconductor light-emitting element with a peak wavelength of 459 nm and which comprises a green phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv =−0.0200)
Figure 9:
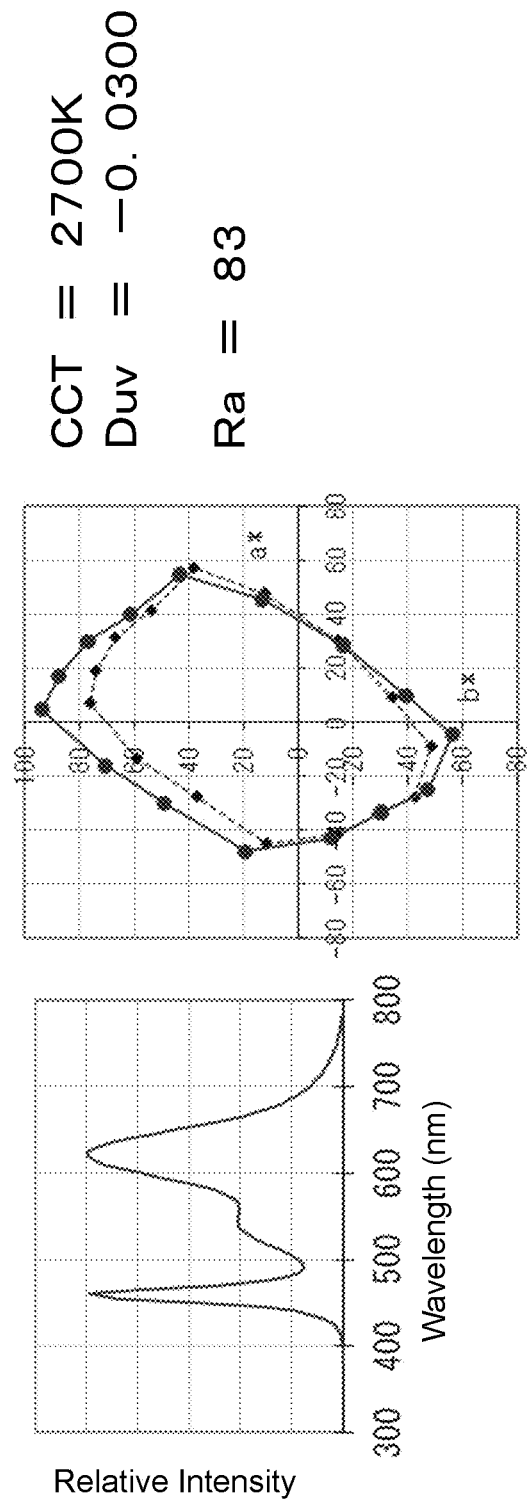
FIG. 9 is a diagram showing a spectral power distribution when assuming that light, emitted from a packaged LED which incorporates a semiconductor light-emitting element with a peak wavelength of 459 nm and which comprises a green phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv =−0.0300)
Figure 10:
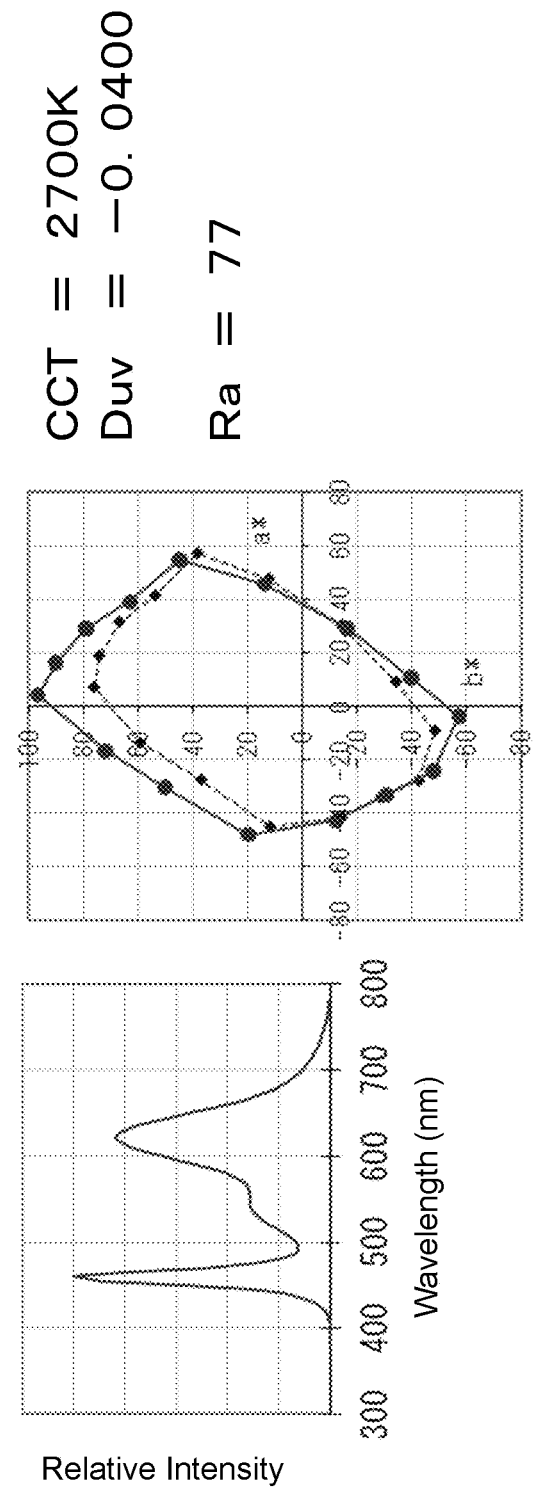
FIG. 10 is a diagram showing a spectral power distribution when assuming that light, emitted from a packaged LED which incorporates a semiconductor light-emitting element with a peak wavelength of 459 nm and which comprises a green phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv =−0.0400)
Figure 11:
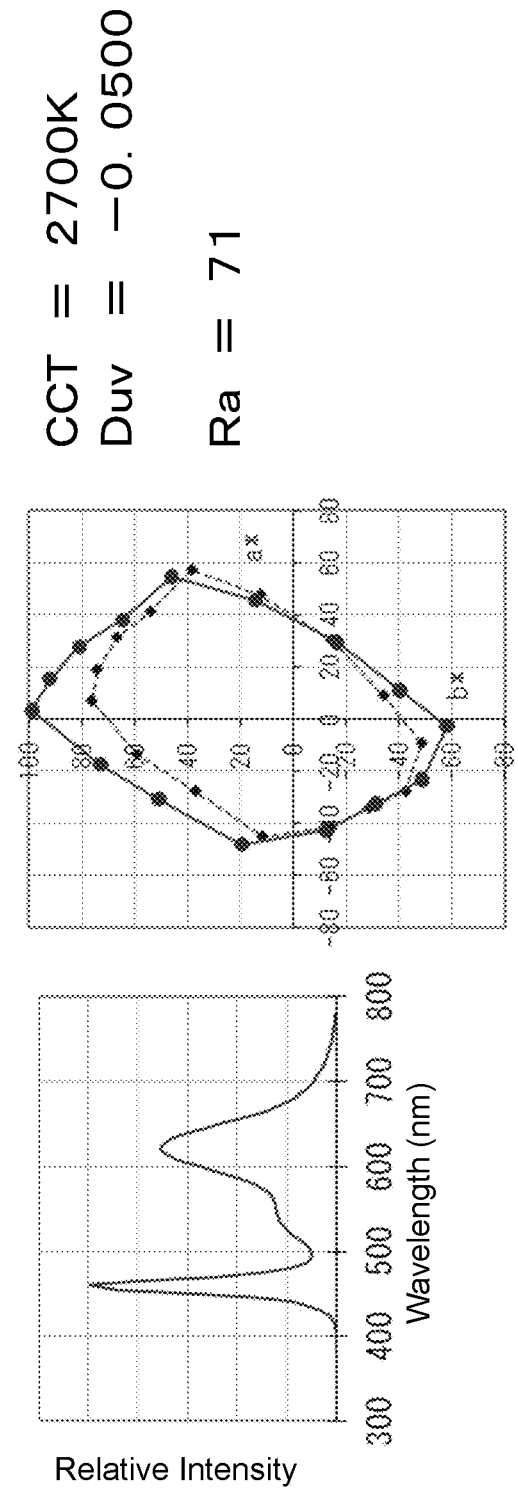
FIG. 11 is a diagram showing a spectral power distribution when assuming that light, emitted from a packaged LED which incorporates a semiconductor light-emitting element with a peak wavelength of 459 nm and which comprises a green phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv =−0.0500)

The test lights shown in FIGS. 5 and 6 represent examples where $D_{uv}$ is shifted in a positive direction from +0.0100 to +0.0150. As shown, when $D_{uv}$ is shifted in the positive direction, it was predicted that the saturation of the 15 color samples can be varied over a wider hue range as compared to the case of the test light with $D_{uv}$=0.0000. In addition, it was found that the saturation of the 15 color samples can be varied relatively uniformly as compared to the case of the test light with $D_{uv}$=0.0000. Moreover, with the case of the calculational reference lights and the case of the test lights shown in FIGS. 5 and 6, it was predicted that the color appearances of almost all of the 15 color samples with the exception of the blue to greenish blue region will dull when $D_{uv}$ is shifted in the positive direction. Furthermore, a trend was also predicted in that the greater the shift of $D_{uv}$ in the positive direction, the lower the saturation. Ra calculated based on the spectral power distributions of FIGS. 5 and 6 were 94 and 89, respectively.

On the other hand, the test lights shown in FIGS. 7 to 11 represent examples where $D_{uv}$ is shifted in a negative direction from −0.0100 to −0.0500. As shown, when $D_{uv}$ is shifted in the negative direction, it was found that the saturation of the 15 color samples can be varied over a wider hue range as compared to the case of the test light with $D_{uv}$=0.0000. It was also found that the saturation of the 15 color samples can be varied relatively uniformly as compared to the case of the test light with $D_{uv}$=0.0000. Moreover, it was predicted that the color appearances of almost all of the 15 color samples with the exception of the blue to greenish blue region and the purple region will appear vividly when $D_{uv}$ is shifted in the negative direction between a case where illumination by the calculational reference lights is assumed and a case where illumination by the test lights shown in FIGS. 7 to 11 is assumed. Furthermore, a trend was also predicted in that the greater the shift of $D_{uv}$ in the negative direction, the higher the saturation. Ra calculated based on the spectral power distributions of FIGS. 7 to 11 was 92, 88, 83, 77, and 71, respectively.

According to currently prevailing belief, it was predicted that the greater the shift of $D_{uv}$ in the negative direction, the further the deviation of color appearance from a case of illumination with reference light and, therefore, the greater the deterioration of color appearance.

In consideration thereof, the present inventor mathematically examined predictions of color appearances of the 15 most vivid color samples which are positioned outermost in the Munsell renotation color system when assigning various $D_{uv}$ values to test lights in which spectrum-forming light-emitting elements (light-emitting materials) differ from each other while comparing with calculational reference lights.

The 10 spectral power distributions shown in FIGS. 12 to 21 represent results of varying $D_{uv}$ from −0.0500 to +0.0400 at a same CCT (4000 K) when a packaged LED incorporating four semiconductor light-emitting elements is assumed. Peak wavelengths of the four semiconductor light-emitting elements were respectively set to 459 nm, 528 m, 591 nm, and 662 nm. Expected color appearances of the 15 color samples when assuming illumination by the 10 respective test lights and illumination by the calculational reference lights corresponding to the respective test lights are as represented in the CIELAB color spaces in FIGS. 12 to 21. In the drawings, points connected by dotted lines represent results obtained with the calculational reference lights and points connected by solid lines represent results regarding the respective test lights. Moreover, while a direction perpendicular to the plane of paper represents lightness, only a* and b* axes were plotted for the sake of convenience.

Figure 12:
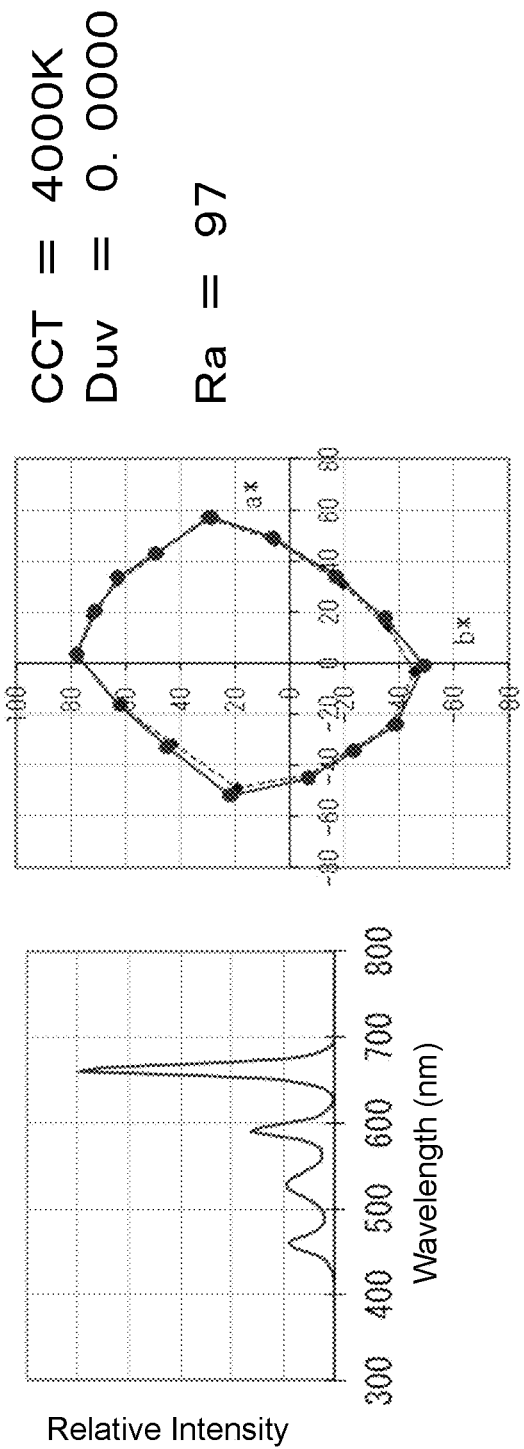
FIG. 12 is a diagram showing a spectral power distribution when assuming that light emitted from a packaged LED which incorporates four semiconductor light-emitting elements illuminates the 15 Munsell renotation color samples, and a CIELAB color space on which are respectively plotted a* values and b* values of the 15 Munsell renotation color samples when illuminated by the LED and when illuminated by reference light (Duv=0.0000)
Figure 13:
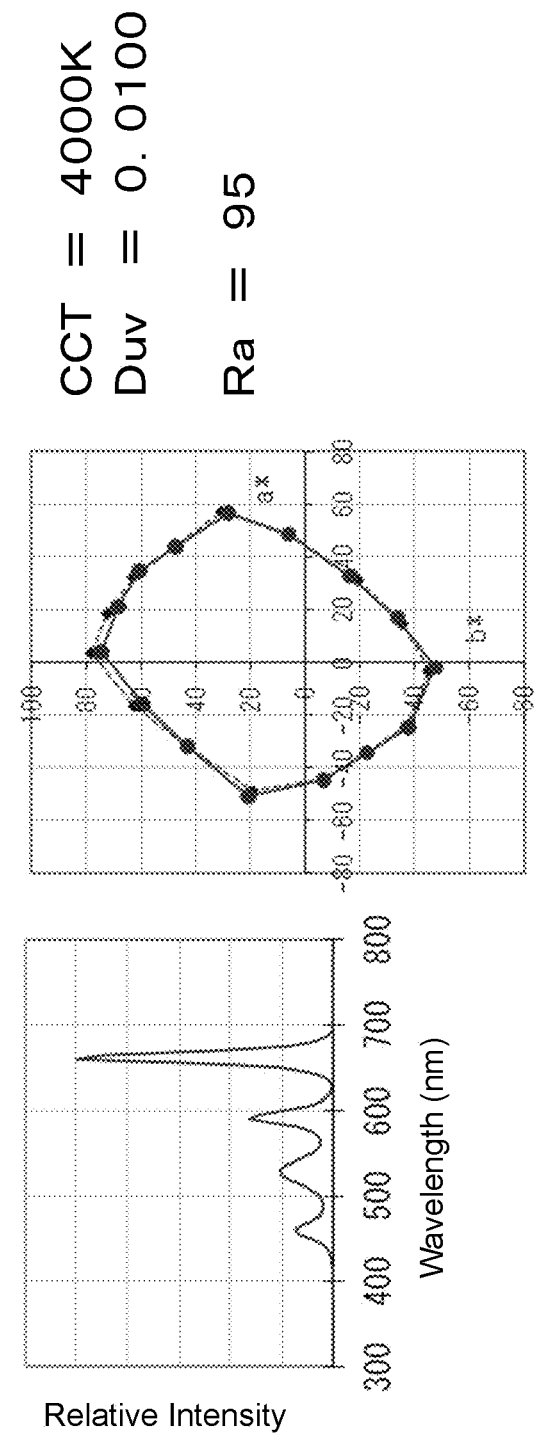
FIG. 13 is a diagram showing a spectral power distribution when assuming that light emitted from a packaged LED which incorporates four semiconductor light-emitting elements illuminates the 15 Munsell renotation color samples, and a CIELAB color space on which are respectively plotted a* values and b* values of the 15 Munsell renotation color samples when illuminated by the LED and when illuminated by reference light (Duv=0.0100)
Figure 14:
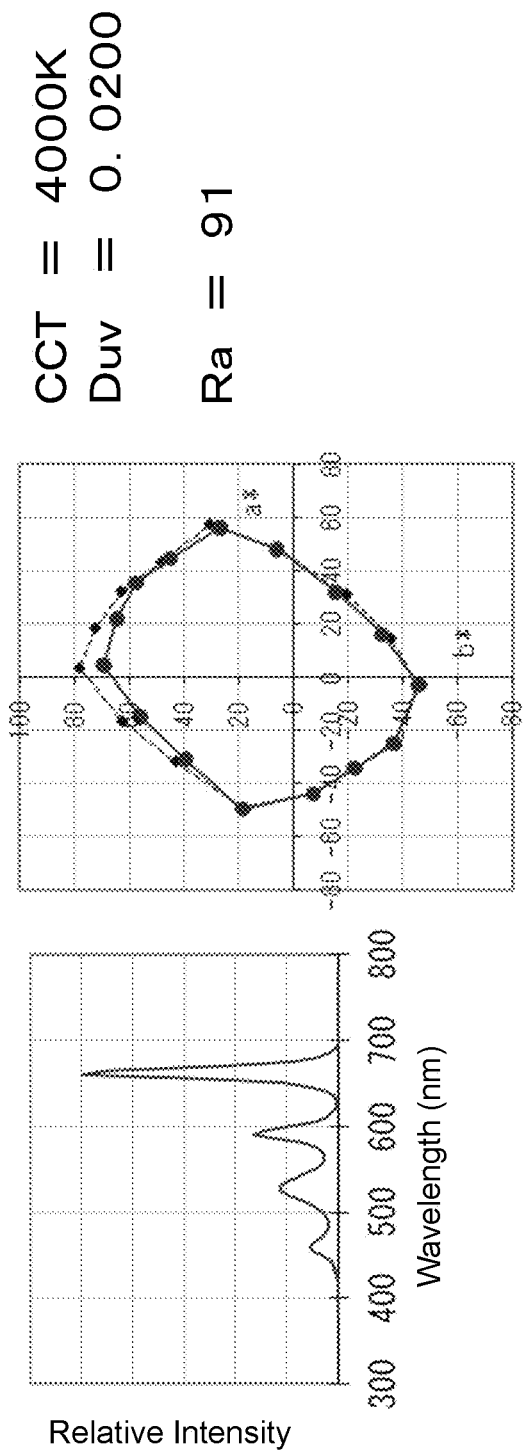
FIG. 14 is a diagram showing a spectral power distribution when assuming that light emitted from a packaged LED which incorporates four semiconductor light-emitting elements illuminates the 15 Munsell renotation color samples, and a CIELAB color space on which are respectively plotted a* values and b* values of the 15 Munsell renotation color samples when illuminated by the LED and when illuminated by reference light (Duv=0.0200)
Figure 15:
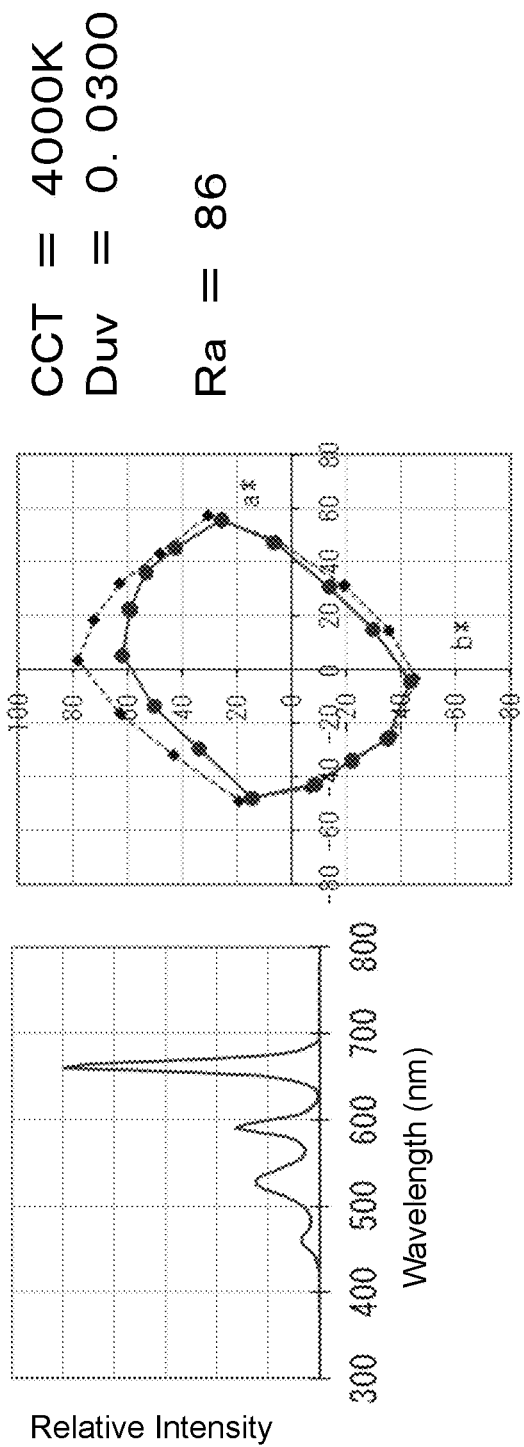
FIG. 15 is a diagram showing a spectral power distribution when assuming that light emitted from a packaged LED which incorporates four semiconductor light-emitting elements illuminates the 15 Munsell renotation color samples, and a CIELAB color space on which are respectively plotted a* values and b* values of the 15 Munsell renotation color samples when illuminated by the LED and when illuminated by reference light (Duv=0.0300)
Figure 16:
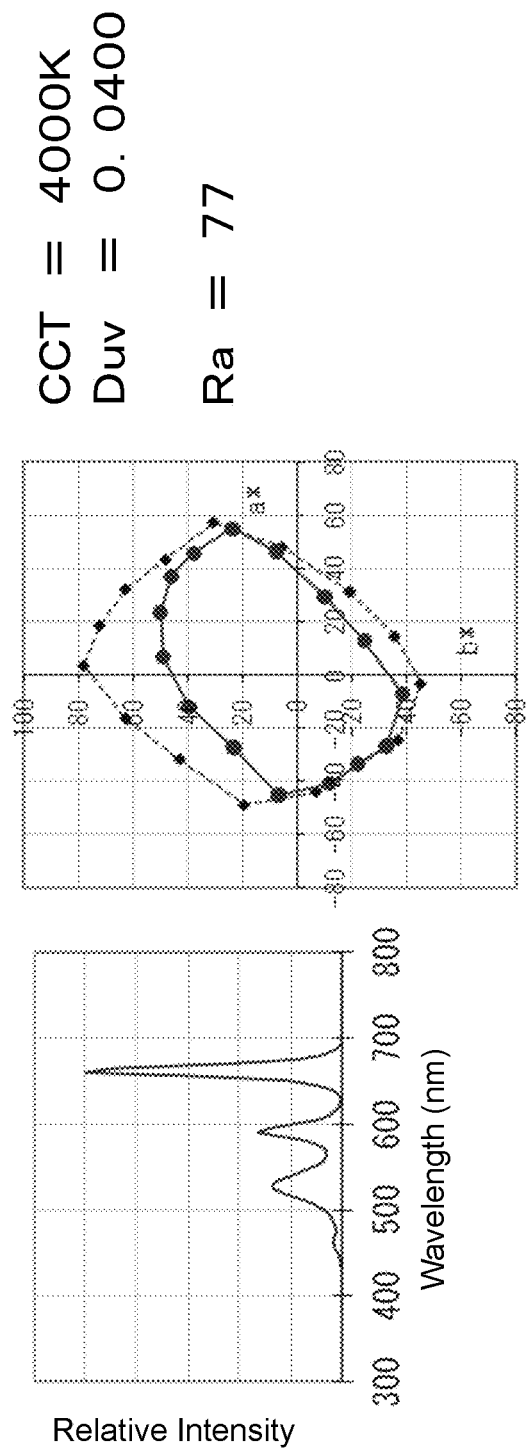
FIG. 16 is a diagram showing a spectral power distribution when assuming that light emitted from a packaged LED which incorporates four semiconductor light-emitting elements illuminates the 15 Munsell renotation color samples, and a CIELAB color space on which are respectively plotted a* values and b* values of the 15 Munsell renotation color samples when illuminated by the LED and when illuminated by reference light (Duv=0.0400)
Figure 17:
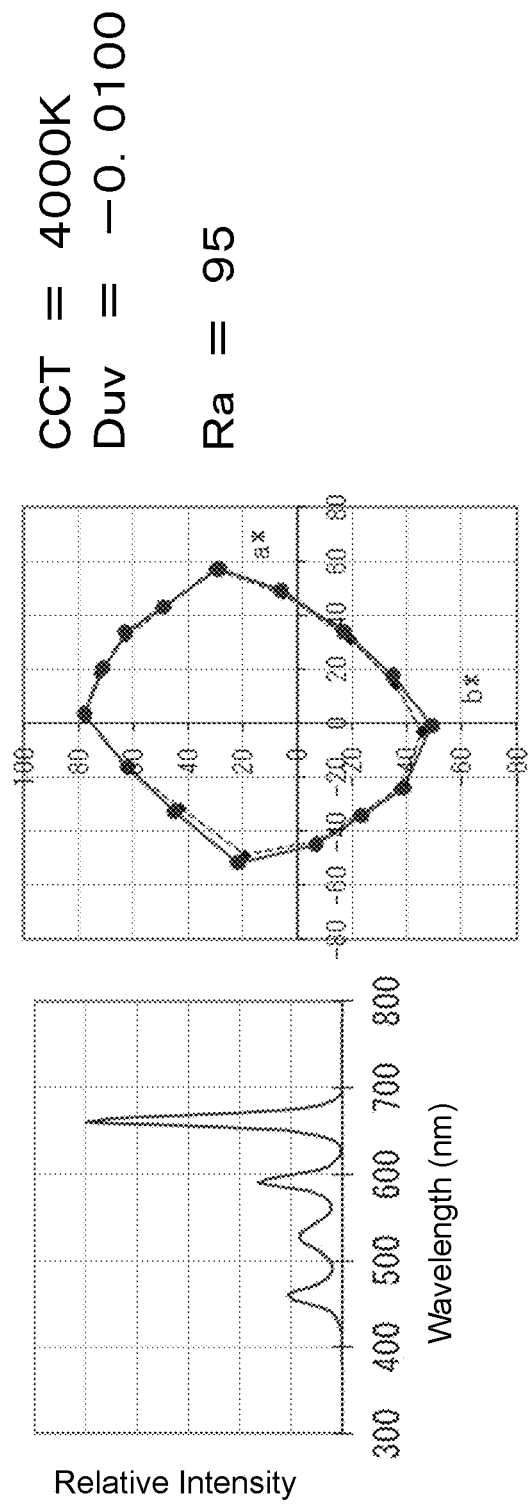
FIG. 17 is a diagram showing a spectral power distribution when assuming that light emitted from a packaged LED which incorporates four semiconductor light-emitting elements illuminates the 15 Munsell renotation color samples, and a CIELAB color space on which are respectively plotted a* values and b* values of the 15 Munsell renotation color samples when illuminated by the LED and when illuminated by reference light (Duv=−0.0100)
Figure 18:
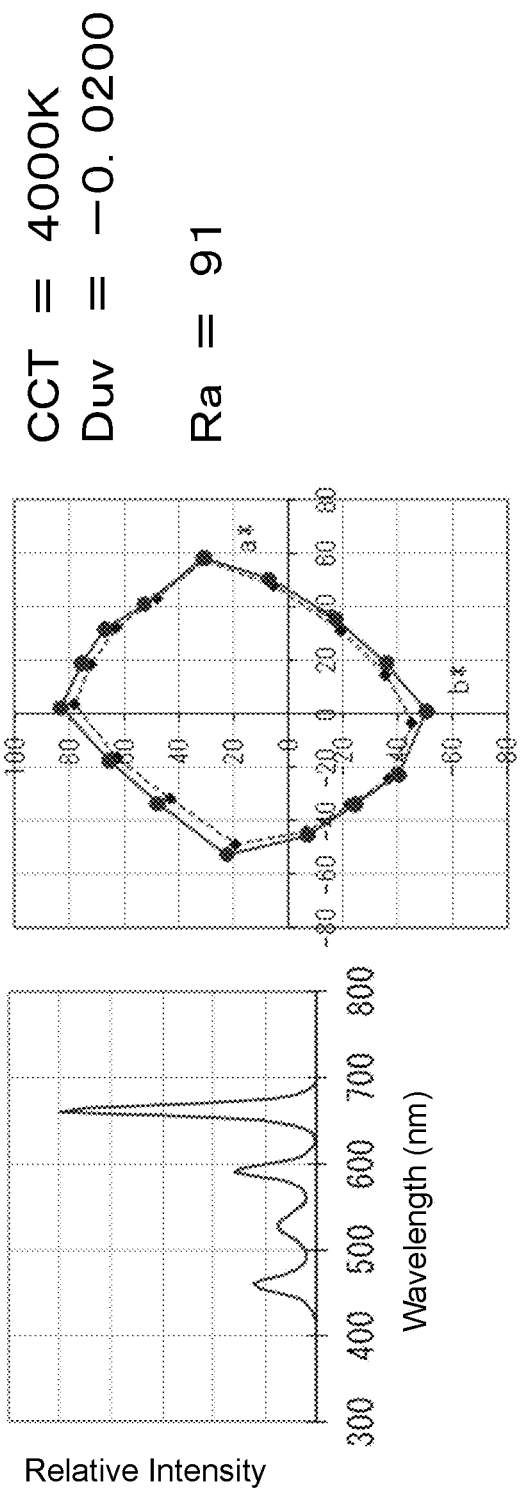
FIG. 18 is a diagram showing a spectral power distribution when assuming that light emitted from a packaged LED which incorporates four semiconductor light-emitting elements illuminates the 15 Munsell renotation color samples, and a CIELAB color space on which are respectively plotted a* values and b* values of the 15 Munsell renotation color samples when illuminated by the LED and when illuminated by reference light (Duv=−0.0200)
Figure 19:
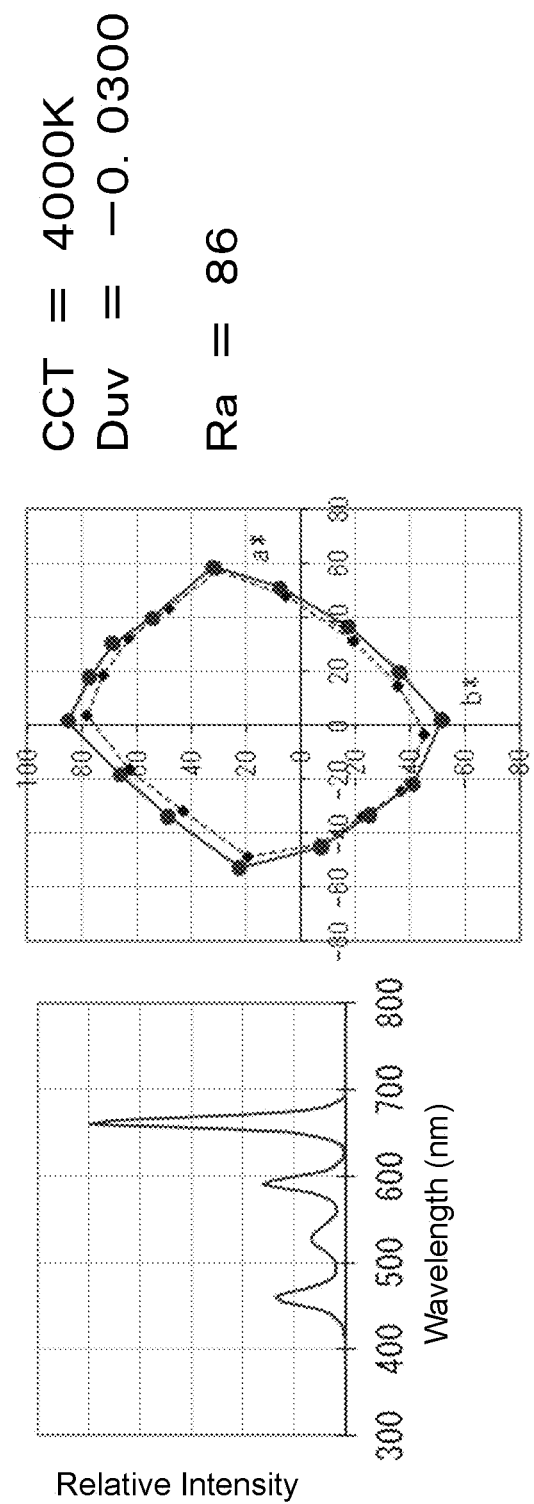
FIG. 19 is a diagram showing a spectral power distribution when assuming that light emitted from a packaged LED which incorporates four semiconductor light-emitting elements illuminates the 15 Munsell renotation color samples, and a CIELAB color space on which are respectively plotted a* values and b* values of the 15 Munsell renotation color samples when illuminated by the LED and when illuminated by reference light (Duv=−0.0300)
Figure 20:
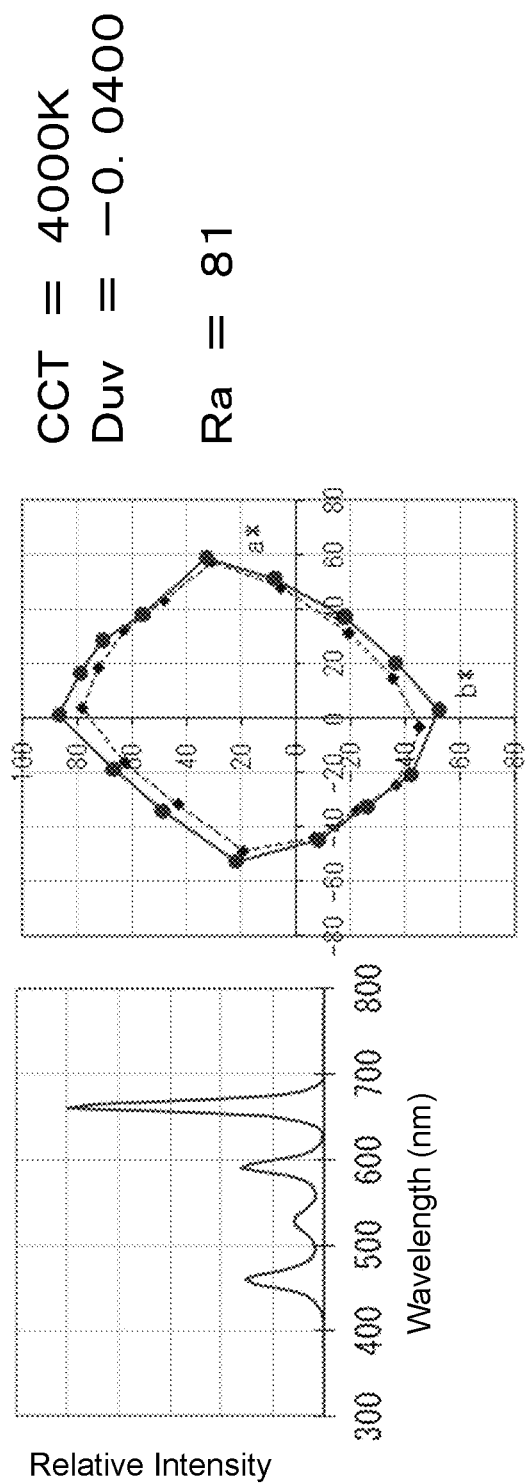
FIG. 20 is a diagram showing a spectral power distribution when assuming that light emitted from a packaged LED which incorporates four semiconductor light-emitting elements illuminates the 15 Munsell renotation color samples, and a CIELAB color space on which are respectively plotted a* values and b* values of the 15 Munsell renotation color samples when illuminated by the LED and when illuminated by reference light (Duv=−0.0400)
Figure 21:
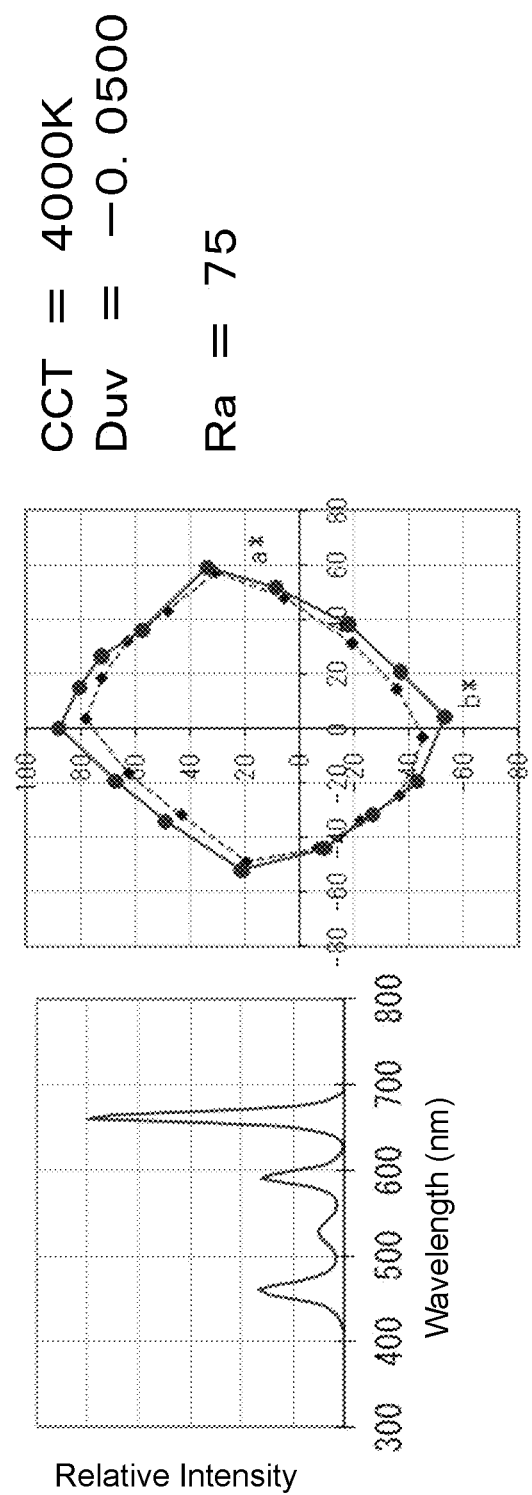
FIG. 21 is a diagram showing a spectral power distribution when assuming that light emitted from a packaged LED which incorporates four semiconductor light-emitting elements illuminates the 15 Munsell renotation color samples, and a CIELAB color space on which are respectively plotted a* values and b* values of the 15 Munsell renotation color samples when illuminated by the LED and when illuminated by reference light (Duv=−0.0500)

With the test light with $D_{uv}$=0.0000 shown in FIG. 12, it was predicted that the color appearances of the 15 color samples will closely resemble one another between a case where illumination by the calculational reference light is assumed and a case where illumination by the test light shown in FIG. 12 is assumed. Ra calculated based on the spectral power distribution was high at 98.

The test lights shown in FIGS. 13 to 16 represent examples where $D_{uv}$ is shifted in a positive direction from +0.0100 to +0.0400. As shown, when $D_{uv}$ is shifted in the positive direction, it was found that the saturation of the 15 color samples can be varied over a wider hue range as compared to the case of the test light with $D_{uv}$=0.0000. It was also found that the saturation of the 15 color samples can be varied relatively uniformly as compared to the case of the test light with $D_{uv}$=0.0000. Moreover, it was predicted that the color appearances of almost all of the 15 color samples with the exception of the blue to greenish blue region and the red region will appear dull when $D_{uv}$ is shifted in the positive direction between a case where illumination by the calculational reference lights is assumed and a case where illumination by the test lights shown in FIGS. 13 to 16 is assumed. Furthermore, a trend was also predicted in that the greater the shift of $D_{uv}$ in the positive direction, the lower the saturation. Ra calculated based on the spectral power distributions of FIGS. 13 to 16 was 95, 91, 86, and 77, respectively. According to currently prevailing belief, it was predicted that the greater the shift of $D_{uv}$ in the positive direction, the further the deviation of color appearance from a case of illumination with reference light and, therefore, the greater the deterioration of color appearance.

On the other hand, the test lights shown in FIGS. 17 to 21 represent examples where $D_{uv}$ is shifted in a negative direction from −0.0100 to −0.0500. As shown, when $D_{uv}$ is shifted in the negative direction, it was found that the saturation of the 15 color samples can be varied over a wider hue range as compared to the case of the test light with $D_{uv}$=0.0000. It was also found that the saturation of the 15 color samples can be varied relatively uniformly as compared to the case of the test light with $D_{uv}$=0.0000. Moreover, it was predicted that the color appearances of almost all of the 15 color samples with the exception of the blue to greenish blue region and the red region will appear vividly when $D_{uv}$ is shifted in the negative direction between a case where illumination by the calculational reference lights is assumed and a case where illumination by the test lights shown in FIGS. 17 to 21 is assumed. Furthermore, a trend was also predicted in that the greater the shift of $D_{uv}$ in the negative direction, the higher the saturation. Ra calculated based on the spectral power distributions of FIGS. 17 to 21 was 95, 91, 86, 81, and 75, respectively. According to currently prevailing belief, it was predicted that the greater the shift of $D_{uv}$ in the negative direction, the further the deviation of color appearance from a case of illumination with reference light and, therefore, the greater the deterioration of color appearance.

In addition, the present inventor mathematically examined predictions of color appearances of the 15 most vivid color samples which are positioned outermost in the Munsell renotation color system when assigning various $D_{uv}$ values to test lights in which spectrum-forming light-emitting elements (light-emitting materials) further differ from each other while comparing with calculational reference light.

The 11 spectral power distributions shown in FIGS. 22 to 32 represent calculation results of varying $D_{uv}$ from −0.0448 to +0.0496 at a close CCT (approximately 5500 K) when assuming a packaged LED which incorporates a purple semiconductor light-emitting element and which uses the purple semiconductor light-emitting element as an excitation light source of a blue phosphor, a green phosphor, and a red phosphor. A peak wavelength of the incorporated semiconductor light-emitting element was set to 405 nm. Moreover, the result shown in FIG. 32 was obtained without including a green phosphor in order to cause $D_{uv}$ to take an excessively negative value. Mathematically expected color appearances of the 15 color samples when assuming illumination by the 11 respective test lights and illumination by calculational reference lights corresponding to the respective test lights are as represented in the CIELAB color spaces in FIGS. 22 to 32. In the drawings, points connected by dotted lines represent results regarding the calculational reference lights and points connected by solid lines represent results regarding the respective test lights. Moreover, while a direction perpendicular to the plane of paper represents lightness, only a* and b* axes were plotted for the sake of convenience.

Figure 22:
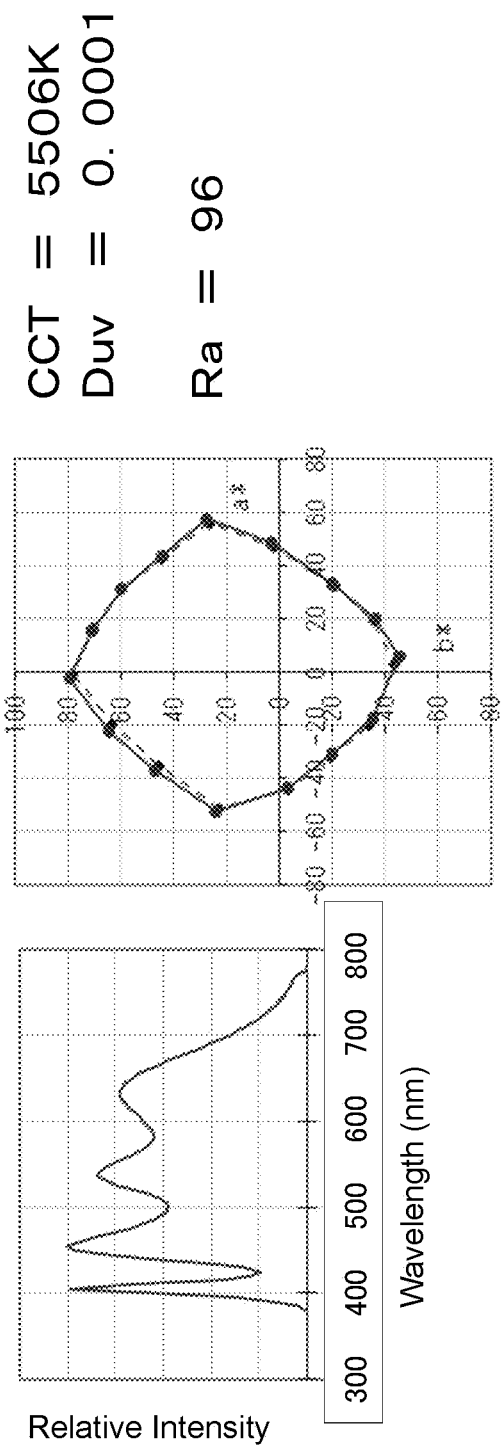
FIG. 22 is a diagram showing a spectral power distribution when assuming that light, emitted from a packaged LED which incorporates a semiconductor light-emitting element with a peak wavelength of 405 nm and which comprises a blue phosphor, a green phosphor, and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=0.0001)
Figure 23:
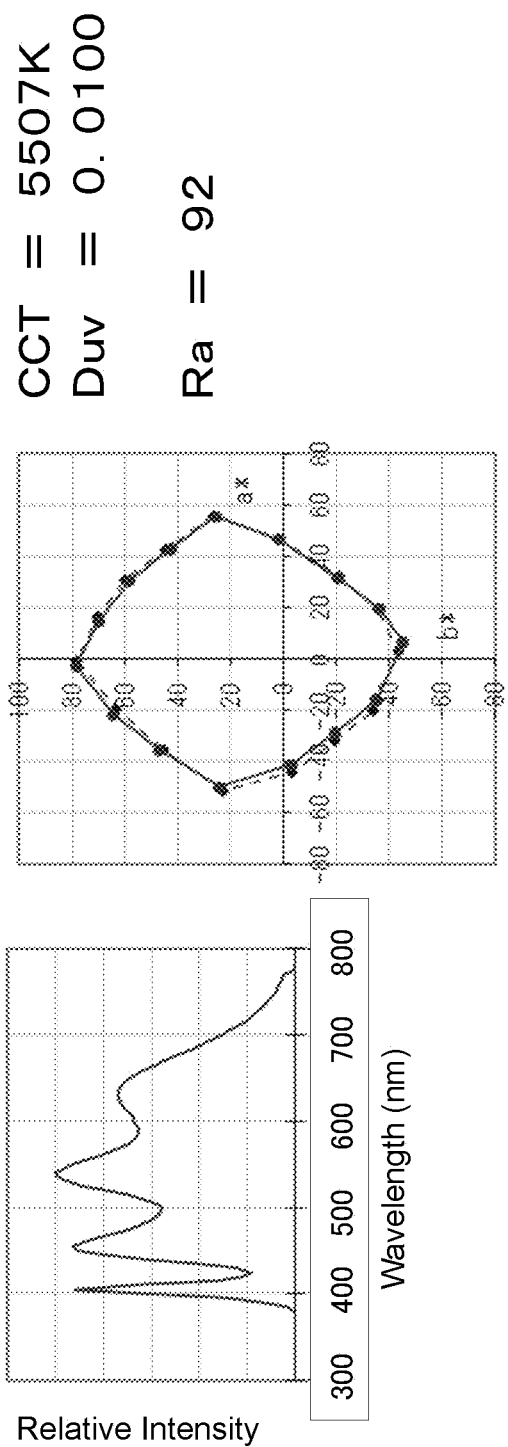
FIG. 23 is a diagram showing a spectral power distribution when assuming that light, emitted from a packaged LED which incorporates a semiconductor light-emitting element with a peak wavelength of 405 nm and which comprises a blue phosphor, a green phosphor, and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=0.0100)
Figure 24:
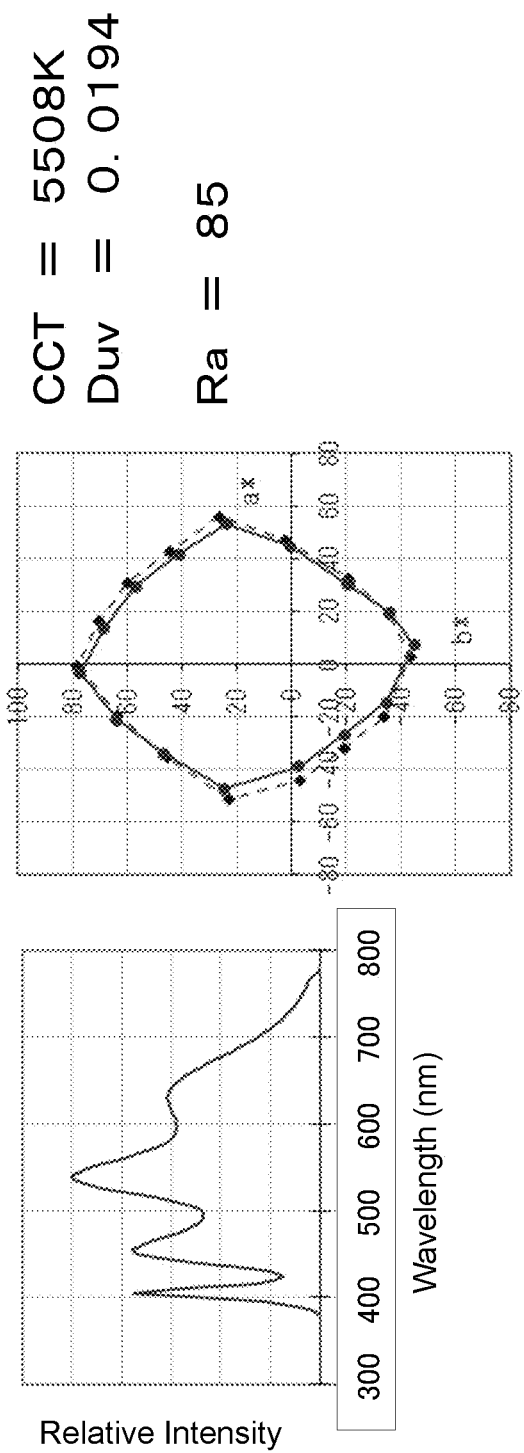
FIG. 24 is a diagram showing a spectral power distribution when assuming that light, emitted from a packaged LED which incorporates a semiconductor light-emitting element with a peak wavelength of 405 nm and which comprises a blue phosphor, a green phosphor, and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=0.0194)

With the test light with $D_{uv}$=0.0001 shown in FIG. 22, it was predicted that the color appearances of the 15 color samples will closely resemble one another between a case of the calculational reference light and a case of the test light shown in FIG. 22. Ra calculated based on the spectral power distribution was high at 96.

The test lights shown in FIGS. 23 to 27 represent examples where $D_{uv}$ is shifted in a positive direction from +0.0100 to +0.0496. As shown, when $D_{uv}$ is shifted in the positive direction, it was found that the saturation of the 15 color samples can be varied over a wider hue range as compared to the case of the test light with $D_{uv}$=0.0001. It was also found that the saturation of the 15 color samples can be varied relatively uniformly as compared to the case of the test light with $D_{uv}$=0.0001. Moreover, it was predicted that the color appearances of almost all of the 15 color samples with the exception of the blue region will appear dull when $D_{uv}$ is shifted in the positive direction between a case where illumination by the calculational reference lights is assumed and a case where illumination by the test lights shown in FIGS. 23 to 27 is assumed. Furthermore, a trend was also predicted in that the greater the shift of $D_{uv}$ in the positive direction, the lower the saturation. Ra calculated based on the spectral power distributions of FIGS. 23 to 27 was 92, 85, 76, 69, and 62, respectively. According to currently prevailing belief, it was predicted that the greater the shift of $D_{uv}$ in the positive direction, the further the deviation of color appearance from a case of illumination with reference light and, therefore, the greater the deterioration of color appearance.

On the other hand, the test lights shown in FIGS. 28 to 32 represent examples where $D_{uv}$ is shifted in a negative direction from −0.0100 to −0.0448. As described earlier, $D_{uv}$=−0.0448 is realized as a system that does not include a green phosphor. As shown, when $D_{uv}$ is shifted in the negative direction, it was found that the saturation of the 15 color samples can be varied over a wider hue range as compared to the case of the test light with $D_{uv}$=0.0001. It was also found that the saturation of the 15 color samples can be varied relatively uniformly as compared to the case of the test light with $D_{uv}$=0.0001. Moreover, it was predicted that the color appearances of almost all of the 15 color samples with the exception of the blue region will appear vivid when $D_{uv}$ is shifted in the negative direction between a case where illumination by the calculational reference lights is assumed and a case where illumination by the test lights shown in FIGS. 28 to 32 is assumed. Furthermore, a trend was also predicted in that the greater the shift of $D_{uv}$ in the negative direction, the higher the saturation. Ra calculated based on the test lights of FIGS. 28 to 32 was 89, 80, 71, 61, and 56, respectively. According to currently prevailing belief, it was predicted that the greater the shift of $D_{uv}$ in the negative direction, the further the deviation of color appearance from a case of illumination with reference light and, therefore, the greater the deterioration of color appearance.

[Summary of Examination of Calculation Regarding Saturation Control and $D_{uv}$ Value]

From the examination of calculations thus far, the following was predicted "based on currently prevailing wisdom".

(1) Test light with a chromaticity point in a vicinity of $D_{uv}$=0.0000 has a low degree of freedom with respect to varying saturation of the 15 color samples. Specifically, it is difficult to simultaneously vary saturation of a large number of hues of the 15 high-chroma color samples, to relatively uniformly increase or decrease saturation of many hues, and the like.

(2) When $D_{uv}$ of test light is set to a positive value, saturation of the 15 color samples can be lowered relatively easily. The saturation of the 15 color samples can be lowered over a wider hue range and in a relatively uniform manner as compared to the case of the test light with $D_{uv}$=0.0000. Furthermore, the greater the shift of $D_{uv}$ in the positive direction, the lower the saturation. In addition, since Ra further decreases, it was predicted that in visual experiments or the like, the greater the shift of $D_{uv}$ in the positive direction, the greater the deviation of color appearance in a case of illumination by test light from a case where an actual illuminated object or the like is illuminated by experimental reference light or experimental pseudo-reference light and, therefore, the greater the deterioration of color appearance. In particular, it was predicted that white will appear yellowish (greenish) and overall color appearance will become unnatural.

(3) When $D_{uv}$ is set to a negative value, saturation of the 15 color samples can be raised relatively easily. The saturation of the 15 color samples can be raised over a wider hue range and in a relatively uniform manner as compared to the case of the test light with $D_{uv}$=0.0000. Furthermore, the greater the shift of $D_{uv}$ in the negative direction, the higher the saturation. In addition, since Ra further decreases, it was predicted that the greater the shift of $D_{uv}$ in the negative direction, the greater the deviation of color appearance in a case of illumination by test light from a case where an actual illuminated object or the like is illuminated by experimental reference light or experimental pseudo-reference light and, therefore, the greater the deterioration of color appearance. In particular, it was predicted that white will appear reddish (pinkish) and overall color appearance will become unnatural.

The above are predictions made "based on currently prevailing wisdom" from the examination of calculations thus far.

[Introduction of Quantitative Indices]

In the present invention, the following quantitative indices were introduced in preparation of a detailed discussion regarding characteristics of a spectral power distribution or a color appearance itself, luminous efficacy of radiation, and the like and in preparation of a detailed discussion regarding color appearance.

[Introduction of Quantitative Index Regarding Color Appearance]

First, it was decided that an a* value and a b* value of the 15 color samples in a CIE 1976 L*a*b* color space of test light as measured at a position of an object when the object is illuminated by the test light (according to the illumination method of the present invention) and test light when a light-emitting device emits the test light in a main radiant direction (according to the light-emitting device of the present invention) be respectively denoted by $a^*_{nSSL}$ and $b^*_{nSSL}$ (where n is a natural number from 1 to 15), hue angles of the 15 color samples be respectively denoted by $\theta_{nSSL}$ (degrees) (where n is a natural number from 1 to 15), an a* value and a b* value of the 15 color samples in a CIE 1976 L*a*b* color space when mathematically assuming illumination by calculational reference light that is selected according to a CCT of the test light (black-body radiator when lower than 5000 K and CIE daylight when equal to or higher than 5000 K) be respectively denoted by $a^*_{nref}$ and $b^*_{nref}$ (where n is a natural number from 1 to 15), hue angles of the 15 color samples be respectively denoted by $\theta_{nref}$ (degrees) (where n is a natural number from 1 to 15), and an absolute value of respective differences in hue angles $\Delta h_n$ (degrees) (where n is a natural number from 1 to 15) of the 15 Munsell renotation color samples when illuminated by the two lights be defined as $$|\Delta h_n| = |\theta_{nSSL} - \theta_{nref}|.$$

That is, $|\Delta h_n|$ involves "$\Delta h_1, \Delta h_2, \Delta h_3, \ldots$ and $\Delta h_{15}$".

This was done because mathematically-predicted differences in hue angles related to the 15 Munsell renotation color samples specially selected in the present invention were considered important indices for evaluating various objects or color appearances of the objects as a whole and realizing a color appearance or an object appearance that is natural, vivid, highly visible, and comfortable when performing visual experiments using test light and experimental reference light or experimental pseudo-reference light.

In addition, saturation differences $\Delta C_n$ (where n is a natural number from 1 to 15) of the 15 Munsell renotation color samples when assuming illumination by two lights, namely, test light and calculational reference light, were respectively defined as $$\Delta C_n = \sqrt{\{(a^*_{nSSL})^2 + (b^*_{nSSL})^2\}} - \sqrt{\{(a^*_{nref})^2 + (b^*_{nref})^2\}}.$$

Furthermore, formula (1) below which represents an average saturation difference of the 15 Munsell renotation color samples was also considered to be an important index.

[Expression 13]

$$\frac{\sum_{n=1}^{15} \Delta C_n}{15} \quad (1)$$

Moreover, if a maximum saturation difference value among the 15 Munsell renotation color samples is denoted by $\Delta C_{max}$ and a minimum saturation difference value among the 15 Munsell renotation color samples is denoted by $\Delta C_{min}$, then $$(|\Delta C_{max} - \Delta C_{min}|)$$

representing a difference between the maximum saturation difference value and the minimum saturation difference value (difference among differences between maximum and minimum degrees of saturation) was also considered an important index. This was done because various characteristics related to differences in saturation among the 15 Munsell renotation color samples specially selected in the present invention were considered important indices for evaluating various objects or color appearances of the objects as a whole and realizing a color appearance or an object appearance that is natural, vivid, highly visible, and comfortable when performing visual experiments using test light and experimental reference light or experimental pseudo-reference light.

[Introduction of Quantitative Index Regarding Spectral Power Distribution]

In the present invention, the following two quantitative indices were introduced in order to further discuss radiometric properties and photometric properties of spectral power distributions. One is an index $A_{cg}$ and the other is luminous efficacy of radiation K (lm/W).

The index $A_{cg}$ is an attempt to describe a difference between a color appearance by experimental reference light or experimental pseudo-reference light and a color appearance by test light as a radiometric property and a photometric property of a spectral power distribution or a spectrum shape. As a result of various examinations, the index $A_{cg}$ has been defined in the present invention as follows.

Let $\varphi_{ref}(\lambda)$ and $\varphi_{SSL}(\lambda)$ respectively denote spectral power distributions of calculational reference light and test light which represent color stimuli that differ from one another when measured at a position of an illuminated object (according to the illumination method of the present invention) or when measuring light emitted in a main radiant direction from a light-emitting device (according to the light-emitting device of the present invention), $x(\lambda)$, $y(\lambda)$, and $z(\lambda)$ denote a color-matching function, and $(X_{ref}, Y_{ref}, Z_{ref})$ and $(X_{SSL}, Y_{SSL}, Z_{SSL})$ respectively denote tristimulus values corresponding to the calculational reference light and the test light. In this case, the following is satisfied regarding the calculational reference light and the test light, where k denotes a constant.

$$Y_{ref} = k \int \varphi_{ref}(\lambda) \cdot y(\lambda) d\lambda$$

$$Y_{SSL} = k \int \varphi_{SSL}(\lambda) \cdot y(\lambda) d\lambda$$

At this point, normalized spectral power distributions obtained by normalizing the spectral power distributions of the calculational reference light and the test light by their respective Y were defined as $$S_{ref}(\lambda) = \varphi_{ref}(\lambda) / Y_{ref}$$

and $$S_{SSL}(\lambda) = \varphi_{SSL}(\lambda) / Y_{SSL},$$

and a difference between the normalized reference light spectral power distribution and the normalized test light spectral power distribution was represented by $$\Delta S(\lambda) = S_{ref}(\lambda) - S_{SSL}(\lambda).$$

Furthermore, at this point, the index $A_{cg}$ was defined as follows.

$$A_{cg} = \int_{\Lambda 1}^{\Lambda 2} \Delta S(\lambda) d\lambda + \int_{\Lambda 2}^{\Lambda 3} (-\Delta S(\lambda)) d\lambda + \int_{\Lambda 3}^{\Lambda 4} \Delta S(\lambda) d\lambda \quad \text{[Expression 14]}$$

Moreover, upper and lower limit wavelengths of the integrals were respectively set to
$\Lambda 1 = 380$ nm,
$\Lambda 2 = 495$ nm, and
$\Lambda 3 = 590$ nm.

In addition, $\Lambda 4$ was defined divided into the following two cases. First, in the normalized test light spectral power distribution $S_{SSL}(\lambda)$, when a wavelength which provides a longest wavelength local maximum value within 380 nm to 780 nm is denoted by $\lambda_R$ (nm) and a spectral intensity of the wavelength $\lambda_R$ (nm) is denoted by $S_{SSL}(\lambda_R)$, a wavelength which is on a longer wavelength-side of $\lambda_R$ and which has an intensity of $S_{SSL}(\lambda_R)/2$ was adopted as $\Lambda 4$. If no such wavelength exists within a range up to 780 nm, then $\Lambda 4$ was set to 780 nm.

The index $A_{cg}$ is used when a visible range related to radiations that are color stimuli is roughly divided into a short wavelength range (or the blue region including purple and the like), an intermediate wavelength range (the green region including yellow and the like), and a long wavelength range (the red region including orange and the like) in order to determine whether a concave and/or a convex shape of a spectrum exist at an appropriate intensity and at an appropriate position in a normalized test light spectral power distribution as compared to a mathematically normalized reference light spectral power distribution. As illustrated in FIGS. 33 and 34, long wavelength integral ranges differ according to positions of a longest wavelength local maximum value. In addition, selections of calculational reference light differ according to a CCT of test light. In the case of FIG. 33, since the CCT of the test light depicted by a solid line in FIG. 33 is equal to or higher than 5000 K, CIE daylight is selected as the reference light as depicted by a dotted line in FIG. 33. In the case of FIG. 34, since the CCT of the test light depicted by a solid line in FIG. 34 is lower than 5000 K, black-body radiator is selected as the reference light as depicted by a dotted line in FIG. 34. Moreover, shaded portions in the drawings schematically represent integral ranges of the short wavelength range, the intermediate wavelength range, and the long wavelength range.

In the short wavelength range, a first term of $A_{cg}$ (an integral of $\Delta S(\lambda)$) is more likely to have a negative value when a spectrum intensity of the normalized test light spectral power distribution is higher than that of the mathematically normalized reference light spectral power distribution. In the intermediate wavelength range, conversely, a second term of $A_{cg}$ (an integral of $-\Delta S(\lambda)$) is more likely to have a negative value when a spectrum intensity of the normalized test light spectral power distribution is lower than that of the normalized reference light spectral power distribution. Furthermore, in the long wavelength range, a third term of $A_{cg}$ (an integral of $\Delta S (\lambda)$) is more likely to have a negative value when a spectrum intensity of the normalized test light spectral power distribution is higher than that of the normalized reference light spectral power distribution.

In addition, as described earlier, the calculational reference light varies according to the CCT of the test light. In other words, black-body radiator is used as the calculational reference light when the CCT of the test light is lower than 5000 K, and defined CIE daylight is used as the calculational reference light when the CCT of the test light is equal to or higher than 5000 K. When deriving a value of the index $A_{cg}$, mathematically defined black-body radiator or CIE daylight was used for $\varphi_{ref}(\lambda)$, while a function used based on a simulation or a value actually measured in an experiment was used for $\varphi_{SSL}(\lambda)$.

Furthermore, when evaluating the test light spectral power distribution $\varphi_{SSL}(\lambda)$ when measured at a position of an illuminated object (according to the illumination method of the present invention) or when measuring light emitted in a main radiant direction from a light-emitting device (according to the light-emitting device of the present invention), the widely-used definition below was adopted for luminous efficacy of radiation K (lm/W).

$$K=Km \times [\int_{380}^{780}\{\varphi_{SSL}(\lambda) \times V(\lambda)\}d\lambda]/[\int_{380}^{780}\varphi_{SSL}(\lambda)d\lambda] \quad \text{[Expression 15]}$$

In the equation above,
$K_m$: maximum luminous efficacy(lm/W),
$V (\lambda)$: spectral luminous efficiency, and
$\lambda$: wavelength (nm).

The luminous efficacy of radiation K (lm/W) of the test light spectral power distribution $\varphi_{SSL}(\lambda)$ when measured at a position of an illuminated object (according to the illumination method of the present invention) or when measuring light emitted in a main radiant direction from a light-emitting device (according to the light-emitting device of the present invention) is an amount that equals luminous efficacy of a source $\eta$ (lm/W) when an efficiency of the spectral power distribution itself which is attributable to its shape and which is related to characteristics of all materials constituting the light-emitting device (for example, efficiencies such as internal quantum efficiency and light extraction efficiency of a semiconductor light-emitting element, internal quantum efficiency and external quantum efficiency of a phosphor, and light transmission characteristics of an encapsulant) is 100%.

[Details of Second Step]

As described earlier, as the second step, prototypes of a packaged LED light source and a lighting fixture were made based on the mathematically examined spectra (test lights). In addition, prototypes of a light source for light (experimental pseudo-reference light) with a high $R_a$ and a high $R_i$ and which produces a color appearance that is close to that of calculational reference light as well as prototypes of a lighting fixture incorporating the light source were also made.

Specifically, prototypes of a light source that excites a green phosphor and a red phosphor using a blue semiconductor light-emitting element, a light source that excites a yellow phosphor and a red phosphor using a blue semiconductor light-emitting element, and a light source that excites a blue phosphor, a green phosphor, and a red phosphor using a purple semiconductor light-emitting element were made and instrumentalized.

BAN or SBCA was used as the blue phosphor. BSS, β-SiAlON, or BSON was used as the green phosphor. YAG was used as the yellow phosphor. CASON or SCASN was used as the red phosphor.

A normally practiced method was used when making packaged LED prototypes. Specifically, a semiconductor light-emitting element (chip) was flip-chip-mounted on a ceramic package which incorporated metal wiring capable of providing electric contact. Next, a slurry created by mixing a phosphor to be used and a binder resin was arranged as a phosphor layer.

After the packaged LEDs were prepared, the packaged LEDs were used to create LED bulbs of MR16 Gu10, MR16 Gu5.3, and the like. The LED bulbs were made into a type of a lighting fixture by building a drive circuit into the LED bulbs and also mounting a reflecting mirror, a lens, and the like to the LED bulbs. In addition, some commercially available LED bulbs were also prepared. Furthermore, incandescent bulbs incorporating a tungsten filament were also prepared to be used as experimental reference light.

In addition, a large number of the LED bulbs were arranged to produce a lighting system for conducting comparative visual experiments. In this case, a system capable of illumination by instantaneously switching among three kinds of bulbs was assembled. A type of drive power wire was dedicated for an incandescent bulb having a tungsten filament (experimental reference light), and an adjustable transformer was arranged at a subsequent stage so that the CCT can be varied by boosting drive voltage from 110 V to 130 V relative to 100 V input voltage. Furthermore, two remaining lines of the drive power wire were used for the LED bulbs, in which one system was used for experimental pseudo-reference light (LED light source) and the other for test light.

[Details of Third Step]

As the third step, comparative visual experiment were conducted in which subjects were asked to evaluate color appearances of a large number of observation objects while switching between experimental reference light (or experimental pseudo-reference light) and test light. The lighting system was installed in a dark room in order to remove disturbance. In addition, illuminance at the positions of the observation objects was set approximately the same by varying the number of fixtures of experimental reference light (or experimental pseudo-reference light) and test light which were mounted to the lighting system. The experiment was conducted within an illuminance range of approximately 150 lx to approximately 5000 lx.

Illuminated objects and observed objects which were actually used will be listed below. Due consideration was given to preparing chromatic objects so that colors of all hues including purple, bluish purple, blue, greenish blue, green, yellowish green, yellow, reddish yellow, red, and reddish purple were represented. Achromatic objects such as white objects and black objects were also prepared. In addition, these objects were prepared in wide varieties and in large numbers including still objects, fresh flowers, food, clothing, and printed material. Furthermore, the skins of the subjects (Japanese) themselves were also included in the experiment as observation objects. Moreover, the color names partially added to the object names listed below simply signify that such objects will appear in such colors in various ordinary environments and are not accurate representations of the colors.

White ceramic plate, white asparagus, white mushroom, white gerbera, white handkerchief, white dress shirt, white rice, sesame and salt, salted rice cracker Purple fresh flower Bluish purple cloth handkerchief, blue jeans, greenish blue towel Green bell pepper, lettuce, shredded cabbage, broccoli, green lime, green apple Yellow banana, yellow bell pepper, greenish yellow lemon, yellow gerbera, fried egg Orange orange, orange bell pepper, carrot Red tomato, red apple, red bell pepper, red sausage, pickled plum Pink necktie, pink gerbera, salmon broiled with salt Russet necktie, beige work clothes, croquette, tonkatsu (deep-fried pork cutlet), burdock root, cookie, chocolate Peanut, woodenware Skin of subjects (Japanese)

Newspaper, color printed matter including black letters on white background (polychromatic), paperback, weekly magazine Exterior wall color samples (Alpolic manufactured by Mitsubishi Plastics, Inc.; white, blue, green, yellow, red)

Color checkers (Color checker classic manufactured by X-Rite; total of 24 color samples including 18 chromatic colors and six achromatic colors (one white, four grey, and one black)).

Moreover, names and Munsell notations of the respective color samples in the color checker are as follows.

| Name | Munsell Notation |
| --- | --- |
| Dark skin | 3.05 YR 3.69/3.20 |
| Light skin | 2.2 YR 6.47/4.10 |
| Blue sky | 4.3 PB 4.95/5.55 |
| Foliage | 6.65 GY 4.19/4.15 |
| Blue flower | 9.65 PB 5.47/6.70 |
| Bluish green | 2.5 BG 7/6 |
| Orange | 5 YR 6/11 |
| Purplish blue | 7.5 PB 4/10.7 |
| Moderate red | 2.5 R 5/10 |
| Purple | 5 P 3/7 |
| Yellow green | 5 GY 7.08/9.1 |
| Orange yellow | 10 YR 7/10.5 |
| Blue | 7.5 PB 2.90/12.75 |
| Green | 0.1 G 5.38/9.65 |
| Red | 5 R 4/12 |
| Yellow | 5 Y 8/11.1 |
| Magenta | 2.5 RP 5/12 |
| Cyan | 5 B 5/8 |
| White | N 9.5/ |
| Neutral 8 | N 8/ |
| Neutral 6.5 | N 6.5/ |
| Neutral 5 | N 5/ |
| Neutral 3.5 | N 3.5/ |
| Black | N 2/ |

Moreover, it is not always self-evident that a correlation exists between color appearances of the various illuminated objects used in the comparative visual experiments and the various mathematical indices related to the color appearances of the 15 Munsell color samples used in the calculations. Such a correlation is to be revealed through the visual experiments.

The visual experiments were performed by the following procedure.

The prepared experimental reference light, experimental pseudo-reference light, and test light were divided per CCT as measured at the position of illuminated objects (according to the illumination method of the present invention) or lights emitted in the main radiant directions among the prepared experimental reference light, experimental pseudo-reference light, and test light were divided per CCT (according to the light-emitting device of the present invention) into six experiments. Details are as follows.

TABLE 1

| CCT classification in visual experiments | | |
| --- | --- | --- |
| Experiment | CCT range (K) | |
| A | 2500 or higher | lower than 2600 |
| B | 2600 or higher | lower than 2700 |
| C | 2700 or higher | lower than 2900 |
| D | 2900 or higher | lower than 3250 |
| E | 3500 or higher | lower than 4100 |
| F | 5400 or higher | lower than 5700 |

In each visual experiment, a same object was illuminated by switching between experimental reference light (or experimental pseudo-reference light) and test light, and subjects were asked to relatively judge which light was capable of realizing a color appearance or an object appearance that is as natural, vivid, highly visible, and comfortable as though perceived outdoors. The subjects were also asked the reasons for their judgment regarding which is superior or inferior.

[Details of Fourth Step, Experiment Result]

In the fourth step, results of comparative visual experiments conducted in the third step using the prototypes of LED light sources/fixtures/systems made in the second step were compiled. Table 2 represents results corresponding to experiment A and Table 3 represents results corresponding to experiment B. The same shall apply thereafter, with Table 7 representing results corresponding to experiment F. Regarding comprehensive evaluations of the test lights relative to the reference light shown in Tables 2 to 7, a comparable appearance is represented by a central "0", an evaluation that the test light is slightly favorable is represented by "1", an evaluation that the test light is favorable is represented by "2", an evaluation that the test light is more favorable is represented by "3", an evaluation that the test light is extremely favorable is represented by "4", and an evaluation that the test light is dramatically favorable is represented by "5". On the other hand, an evaluation that the test light is slightly unfavorable is represented by "−1", an evaluation that the test light is unfavorable is represented by "−2", an evaluation that the test light is more unfavorable is represented by "−3", an evaluation that the test light is extremely unfavorable is represented by "−4", and an evaluation that the test light is dramatically unfavorable is represented by "−5".

It should be noted that since the evaluation "1" represents a determination that the test light is slightly favorable, the test lights evaluated as "2" or higher are determined here as truly favorable test lights.

In the fourth step, in particular, an attempt was made to extract a radiometric property and a photometric property of a spectral power distribution shared by the test light from an actually measured spectrum in a case where the color appearance of an illuminated object when illuminated by the test light was judged to be more favorable than when illuminated by experimental reference light or experimental pseudo-reference light in a visual experiment. In other words, with respect to numerical values of $A_{cg}$, luminous efficacy of radiation K (lm/W), CCT (K), $D_{uv}$, and the like, characteristics of a position of the illuminated object (according to the illumination method of the present invention) and light emitted in the main radiant direction from the light-emitting device (according to the light-emitting device of the present invention) were extracted. At the same time, differences between color appearances of the 15 color samples when assuming illumination by calculational reference lights and color appearances of the 15 color samples when assuming a test light spectral power distribution actually measured at the position of the illuminated object (according to the illumination method of the present invention) or a test light spectral power distribution when actually measuring light emitted in the main radiant direction from the light-emitting device (according to the light-emitting device of the present invention) were also compiled using $|\Delta h_n|$,

[Expression 16]

$$\frac{\sum_{n=1}^{15} \Delta C_n}{15},$$

$\Delta C_n$, and ($|\Delta C_{max} - \Delta C_{min}|$) as indices. Moreover, while values of $|\Delta h_n|$ and $\Delta C_n$ vary when n is selected, in this case, maximum and minimum values are shown. These values are also described in Tables 2 to 7. Moreover, since it was found that, with respect to the color appearance of the illuminated object, results of comprehensive evaluation by the subjects were relatively dependent on $D_{uv}$ values of test light at the position of the illuminated object (according to the illumination method of the present invention) or test light emitted in the main radiant direction from the light-emitting device (according to the light-emitting device of the present invention), Tables 2 to 7 have been sorted in a descending order of $D_{uv}$ values.

Overall, it was determined by the present experiment that the object appearance or the color appearance of an actually observed object being illuminated by test light is more favorable than when being illuminated by experimental reference light if $D_{uv}$ takes an appropriate negative value and $|\Delta h_n|$,

[Expression 17]

$$\frac{\sum_{n=1}^{15} \Delta C_n}{15},$$

$\Delta C_n$, ($|\Delta C_{max} - \Delta C_{min}|$), and the like are within appropriate ranges or if the index $A_{cg}$ and the like are within appropriate ranges. This result was unexpected in view of "results based on currently prevailing wisdom" described in step 1.

TABLE 2

Summary of Experiment A (results of visual experiment and various indices)

| | Light-emitting element | CCT (K) | $D_{uv}$ | $\|\Delta h_n\|$ maximum value | $\|\Delta h_n\|$ minimum value | $\frac{\sum_{n=1}^{15} \Delta C_n}{15}$ | $\Delta C_{max}$ | $\Delta C_{min}$ | $\|\Delta C_{max} - \Delta C_{min}\|$ | $A_{cg}$ | Luminous efficacy of radiation (lm/W) | Ra | Comprehensive evaluation |
|---|---|---|---|---|---|---|---|---|---|---|---|---|---|
| Reference light | Tungsten filament Incandescent bulb (110 V) | 2,589 | −0.00023 | 0.20 | 0.02 | 0.07 | 0.30 | −0.10 | 0.40 | 18.05 | 140 | 100 | — |
| Comparative test light 1 | Purple LED BAM BSS CASON | 2,559 | −0.00169 | 6.14 | 0.01 | 0.45 | 3.50 | −2.04 | 5.54 | −2.04 | 240 | 97 | 0 |
| Comparative test light 2 | Purple LED SBCA β-SiAlON CASON | 2,548 | −0.00516 | 8.22 | 0.20 | 1.95 | 9.41 | −3.44 | 12.84 | −32.01 | 235 | 94 | 1 |
| Test light 1 | Purple LED SBCA β-SiAlON CASON | 2,538 | −0.01402 | 6.90 | 0.00 | 4.39 | 13.90 | −0.83 | 14.73 | −41.70 | 229 | 92 | 4 |

TABLE 3

Summary of Experiment B (results of visual experiment and various indices)

| | Light-emitting element | CCT (K) | $D_{uv}$ | $\|\Delta h_n\|$ maximum value | $\|\Delta h_n\|$ minimum value | $\frac{\sum_{n=1}^{15} \Delta C_n}{15}$ | $\Delta C_{max}$ | $\Delta C_{min}$ | $\|\Delta C_{max} - \Delta C_{min}\|$ | $A_{cg}$ | Luminous efficacy of radiation (lm/W) | Ra | Comprehensive evaluation |
|---|---|---|---|---|---|---|---|---|---|---|---|---|---|
| Reference light | Tungsten filament Incandescent bulb (110 V) | 2,679 | −0.00010 | 0.10 | 0.00 | 0.03 | 0.14 | −0.05 | 0.19 | 3.40 | 145 | 100 | — |
| Comparative test light 3 | Purple LED BAM BSS CASON | 2,631 | −0.00255 | 6.24 | 0.00 | 0.71 | 4.23 | −1.91 | 6.14 | 20.42 | 239 | 97 | 0 |

TABLE 3-continued

Summary of Experiment B (results of visual experiment and various indices)

| | Light-emitting element | CCT (K) | $D_{uv}$ | $|\Delta h_n|$ maximum value | $|\Delta h_n|$ minimum value | $\dfrac{\sum_{n=1}^{15}\Delta C_n}{15}$ | $\Delta C_{max}$ | $\Delta C_{min}$ | $|\Delta C_{max} - \Delta C_{min}|$ | $A_{cg}$ | Luminous efficacy of radiation (lm/W) | Ra | Comprehensive evaluation |
|---|---|---|---|---|---|---|---|---|---|---|---|---|---|
| Comparative test light 4 | Purple LED SBCA β-SiAlON CASON | 2,672 | −0.00464 | 7.02 | 0.08 | 1.32 | 6.08 | −1.85 | 7.93 | −11.06 | 236 | 96 | 1 |
| Test light 2 | Purple LED SBCA β-SiAlON CASON | 2,636 | −0.01299 | 8.32 | 0.04 | 3.50 | 13.41 | −2.43 | 15.83 | −63.83 | 229 | 95 | 4 |
| Test light 3 | Purple LED SBCA β-SiAlON CASON | 2,668 | −0.01803 | 7.23 | 0.10 | 4.68 | 14.47 | −0.67 | 15.14 | −114.08 | 222 | 91 | 5 |
| Test light 4 | Purple LED SBCA β-SiAlON CASON | 2,628 | −0.02169 | 7.42 | 0.40 | 5.09 | 16.84 | −0.96 | 17.81 | −126.42 | 216 | 90 | 4 |

TABLE 4

Summary of Experiment C (results of visual experiment and various indices)

| | Light-emitting element | CCT (K) | $D_{uv}$ | $|\Delta h_n|$ maximum value | $|\Delta h_n|$ minimum value | $\dfrac{\sum_{n=1}^{15}\Delta C_n}{15}$ | $\Delta C_{max}$ | $\Delta C_{min}$ | $|\Delta C_{max} - \Delta C_{min}|$ | $A_{cg}$ | Luminous efficacy of radiation (lm/W) | Ra | Comprehensive evaluation |
|---|---|---|---|---|---|---|---|---|---|---|---|---|---|
| Comparative test light 5 | Blue LED BSON SCASN | 2,811 | 0.01380 | 9.51 | 0.29 | −6.42 | −0.11 | −18.50 | 18.39 | 142.46 | 322 | 91 | −4 |
| Comparative test light 6 | Blue LED BSON SCASN | 2,788 | 0.00970 | 5.00 | 0.51 | −3.49 | 0.05 | −11.04 | 11.10 | 102.87 | 309 | 94 | −2 |
| Comparative test light 7 | Commercially available LED | 2,880 | 0.00819 | 5.78 | 0.29 | −3.33 | −0.07 | −8.02 | 7.95 | 211.76 | 294 | 92 | −2 |
| Comparative test light 8 | Blue LED BSON SCASN | 2,723 | 0.00020 | 1.84 | 0.00 | 0.51 | 3.47 | −2.37 | 5.84 | 15.58 | 299 | 94 | 0 |
| Reference light | Tungsten filament Incandescent bulb (130 V) | 2,749 | −0.00017 | 0.12 | 0.00 | 0.04 | 0.18 | −0.08 | 0.26 | 16.59 | 150 | 100 | — |
| Comparative test light 9 | Purple LED BAM BSS CASON | 2,703 | −0.00331 | 6.26 | 0.08 | 0.91 | 4.76 | −1.78 | 6.53 | 22.48 | 238 | 97 | 0 |
| Comparative test light 10 | Purple LED BAM BSS CASON | 2,784 | −0.00446 | 6.30 | 0.06 | 1.17 | 5.46 | −1.92 | 7.37 | −13.19 | 235 | 96 | 1 |
| Comparative test light 11 | Purple LED BAM BSS CASON | 2,761 | −0.00561 | 7.16 | 0.07 | 1.48 | 6.60 | −2.16 | 8.76 | −46.26 | 232 | 96 | 1 |
| Test light 5 | Blue LED BSON SCASN | 2,751 | −0.01060 | 5.22 | 0.28 | 2.79 | 8.47 | −2.02 | 10.49 | −28.57 | 289 | 93 | 3 |
| Test light 6 | Purple LED SBCA β-SiAlON CASON | 2,798 | −0.01991 | 6.11 | 0.06 | 4.25 | 13.37 | −0.63 | 14.01 | −141.79 | 221 | 91 | 5 |
| Test light 7 | Purple LED SBCA β-SiAlON CASON | 2,803 | −0.02141 | 7.56 | 0.30 | 4.82 | 14.26 | −0.84 | 15.10 | −176.30 | 216 | 90 | 4 |
| Test light 8 | Blue LED BSON SCASN | 2,736 | −0.02210 | 4.56 | 0.07 | 4.99 | 12.13 | −0.97 | 13.11 | −139.12 | 257 | 85 | 4 |
| Test light 9 | Blue LED BSON SCASN | 2,718 | −0.02840 | 7.10 | 0.23 | 6.36 | 16.62 | 0.89 | 15.72 | −174.29 | 251 | 84 | 2 |
| Comparative test light 12 | Blue LED BSON SCASN | 2,711 | −0.03880 | 7.83 | 0.84 | 7.42 | 20.26 | 0.49 | 19.77 | −253.28 | 240 | 80 | −1 |
| Comparative test light 13 | Blue LED BSON SCASN | 2,759 | −0.04270 | 7.61 | 0.16 | 7.86 | 20.06 | 1.04 | 19.03 | −228.40 | 231 | 77 | −2 |
| Comparative test light 14 | Blue LED BSON SCASN | 2,792 | −0.04890 | 5.92 | 0.24 | 7.50 | 19.12 | 1.22 | 17.90 | −267.67 | 227 | 70 | −3 |

TABLE 5

Summary of Experiment D (results of visual experiment and various indices)

| | Light-emitting element | CCT (K) | $D_{uv}$ | $|\Delta h_n|$ maximum value | $|\Delta h_n|$ minimum value | $\dfrac{\sum_{n=1}^{15}\Delta C_n}{15}$ | $\Delta C_{max}$ | $\Delta C_{min}$ | $|\Delta C_{max} - \Delta C_{min}|$ | $A_{cg}$ | Luminous efficacy of radiation (lm/W) | Ra | Comprehensive evaluation |
|---|---|---|---|---|---|---|---|---|---|---|---|---|---|
| Comparative test light 15 | Blue LED YAG CASON | 3,005 | 0.01411 | 18.54 | 0.18 | −5.95 | 4.13 | −13.83 | 17.96 | 197.80 | 376 | 69 | −4 |
| Pseudo-reference light | Purple LED BAM BSS CASON | 2,973 | 0.00064 | 3.48 | 0.02 | −0.04 | 1.49 | −1.48 | 2.98 | 31.87 | 245 | 97 | — |
| Comparative test light 16 | Blue LED YAG CASON | 2,911 | −0.00667 | 18.39 | 0.62 | 0.82 | 14.09 | −11.10 | 25.20 | 61.34 | 330 | 72 | −2 |
| Comparative test light 17 | Purple LED SBCA β-SiAlON CASON | 3,026 | −0.00742 | 3.77 | 0.18 | 2.53 | 6.06 | −0.15 | 6.21 | −17.86 | 281 | 92 | 1 |
| Comparative test light 18 | Blue LED YAG CASON | 3,056 | −0.01276 | 16.81 | 0.95 | 1.79 | 16.35 | −10.53 | 26.88 | 25.24 | 319 | 74 | −2 |
| Test light 10 | Purple LED SBCA β-SiAlON CASON | 2,928 | −0.01742 | 5.87 | 0.33 | 4.15 | 10.17 | 0.10 | 10.07 | −177.14 | 216 | 88 | 5 |
| Comparative test light 19 | Blue LED YAG CASON | 3,249 | −0.01831 | 15.98 | 1.15 | 2.37 | 17.15 | −10.01 | 27.16 | −6.20 | 310 | 75 | −2 |
| Test light 11 | Purple LED SBCA β-SiAlON CASON | 2,992 | −0.02498 | 7.63 | 0.33 | 4.86 | 13.54 | −1.11 | 14.65 | −247.50 | 210 | 88 | 3 |
| Test light 12 | Purple LED SBCA β-SiAlON CASON | 3,001 | −0.02525 | 7.66 | 0.34 | 4.88 | 13.55 | −1.14 | 14.69 | −253.58 | 209 | 88 | 2 |

TABLE 6

Summary of Experiment E (results of visual experiment and various indices)

| | Light-Emitting element | CCT (K) | $D_{uv}$ | $|\Delta h_n|$ maximum value | $|\Delta h_n|$ minimum value | $\dfrac{\sum_{n=1}^{15}\Delta C_n}{15}$ | $\Delta C_{max}$ | $\Delta C_{min}$ | $|\Delta C_{max} - \Delta C_{min}|$ | $A_{cg}$ | Luminous efficacy of radiation (lm/W) | Ra | Comprehensive evaluation |
|---|---|---|---|---|---|---|---|---|---|---|---|---|---|
| Pseudo-reference light | Purple LED SBCA β-SiAlON CASON | 3,666 | 0.00006 | 4.76 | 0.05 | 0.52 | 3.37 | −2.13 | 5.50 | −6.84 | 249 | 94 | — |
| Test light 13 | Purple LED SBCA β-SiAlON CASON | 3,673 | −0.01302 | 2.86 | 0.04 | 2.32 | 5.16 | −0.20 | 5.36 | −82.35 | 236 | 93 | 4 |
| Test light 14 | Purple LED SBCA β-SiAlON CASON | 4,072 | −0.01666 | 1.97 | 0.10 | 2.69 | 4.63 | 0.60 | 4.03 | −116.16 | 230 | 89 | 5 |
| Test light 15 | Purple LED SBCA β-SiAlON CASON | 3,631 | −0.02102 | 3.29 | 0.11 | 3.38 | 6.72 | 0.53 | 6.19 | −173.43 | 223 | 87 | 4 |

TABLE 7

Summary of Experiment F (results of visual experiment and various indices)

| | Light-emitting element | CCT (K) | $D_{uv}$ | $|\Delta h_n|$ maximum value | $|\Delta h_n|$ minimum value | $\frac{\sum_{n=1}^{15}\Delta C_n}{15}$ | $\Delta C_{max}$ | $\Delta C_{min}$ | $|\Delta C_{max} - \Delta C_{min}|$ | $A_{cg}$ | Luminous efficacy of radiation (lm/W) | Ra | Comprehensive evaluation |
|---|---|---|---|---|---|---|---|---|---|---|---|---|---|
| Comparative test light 20 | Purple LED SBCA β-SiAlON CASON | 5,490 | 0.0073137 | 5.45 | 0.03 | −0.07 | 2.20 | −2.45 | 4.65 | 56.25 | 255 | 94 | −2 |
| Pseudo-reference light | Purple LED BAM BSS CASON | 5,451 | −0.002917 | 4.50 | 0.02 | 0.07 | 2.21 | −3.05 | 5.26 | 94.78 | 275 | 96 | — |
| Comparative test light 21 | Purple LED SBCA β-SiAlON CASON | 5,484 | −0.005339 | 3.32 | 0.02 | 1.61 | 3.19 | 0.03 | 3.16 | −84.44 | 234 | 92 | 1 |
| Test light 16 | Purple LED SBCA β-SiAlON CASON | 5,538 | −0.007788 | 2.95 | 0.10 | 1.91 | 3.94 | 0.58 | 3.36 | −86.47 | 231 | 90 | 2 |
| Test light 17 | Purple LED SBCA β-SiAlON CASON | 5,661 | −0.009926 | 3.32 | 0.27 | 2.17 | 4.70 | 0.91 | 3.80 | −114.17 | 229 | 88 | 2 |
| Test light 18 | Purple LED SBCA β-SiAlON CASON | 5,577 | −0.012668 | 3.72 | 0.08 | 2.49 | 5.31 | 0.95 | 4.36 | −136.35 | 226 | 86 | 4 |
| Test light 19 | Purple LED SBCA β-SiAlON CASON | 5,504 | −0.01499 | 4.05 | 0.07 | 2.76 | 5.79 | 0.99 | 4.81 | −155.28 | 224 | 84 | 4 |
| Test light 20 | Purple LED SBCA β-SiAlON CASON | 5,531 | −0.017505 | 4.53 | 0.06 | 3.04 | 6.48 | 0.93 | 5.55 | −173.79 | 222 | 82 | 5 |
| Test light 21 | Purple LED SBCA β-SiAlON CASON | 5,650 | −0.020101 | 5.14 | 0.13 | 3.34 | 7.34 | 0.79 | 6.56 | −180.73 | 220 | 79 | 4 |
| Test light 22 | Purple LED SBCA β-SiAlON CASON | 5,470 | −0.026944 | 6.06 | 0.25 | 4.06 | 8.68 | 0.82 | 7.86 | −239.07 | 214 | 73 | 2 |
| Comparative test light 22 | Purple LED SBCA β-SiAlON CASON | 5,577 | −0.033351 | 6.98 | 0.17 | 4.73 | 10.23 | 0.67 | 9.56 | −322.02 | 205 | 66 | 1 |
| Comparative test light 23 | Purple LED SBCA β-SiAlON CASON | 5,681 | −0.038497 | 7.53 | 0.04 | 5.26 | 11.36 | 0.51 | 10.86 | −419.02 | 194 | 61 | −1 |
| Comparative test light 24 | Purple LED SBCA β-SiAlON CASON | 5,509 | −0.043665 | 7.95 | 0.39 | 5.74 | 12.04 | 0.37 | 11.66 | −486.05 | 189 | 56 | −2 |

[Details of Fourth Step, Consideration]

Hereinafter, the experiment results will be considered. Moreover, the test lights and comparative test lights in the tables may sometimes be collectively referred to as a "test light".

1) When $D_{uv}$ of test light is on positive side of experimental reference light (or experimental pseudo-reference light)

Tables 4, 5, and 7 include results in which the $D_{uv}$ of test light is on the positive side of experimental reference light (or experimental pseudo-reference light). From these results, it is found that the greater the positive value of the $D_{uv}$ of the test light, the less favorable the color appearance or the object appearance of the illuminated object as judged by the subjects. A more specific description will be given below.

With respect to the appearance of an illuminated white object, the subjects judged that the greater the positive value of $D_{uv}$, the more yellowish (greenish) the appearance and the greater a feeling of strangeness. With respect to the appearance of gray portions of the illuminated color checkers, the subjects judged that differences in lightness became less visible. Furthermore, the subjects pointed out that characters in illuminated printed matter became more illegible. Moreover, with respect to the color appearances of various illuminated chromatic colors, the subjects judged that the greater the positive value of the $D_{uv}$ of the test light, the more unnatural and dull the color appearances as compared to when illuminated by experimental reference light (or experimental pseudo-reference light). The subjects pointed out that the various illuminated exterior wall color samples were perceived as being extremely different from the same colors when viewed outdoors, and their own skin colors also appeared unnatural and unhealthy. In addition, the subjects pointed out that differences in color of petals of fresh flowers with similar and analogous colors became less distinguishable and contours became less visible as compared to when illuminated by experimental reference light.

Furthermore, it was found that these results were not noticeably dependent on the CCT of the test lights described in Tables 4, 5, and 7, and also were not noticeably dependent on the configuration of the light-emitting elements (light-emitting materials) of the light-emitting device.

Since the greater the positive value of the $D_{uv}$ of the test light, the lower the value of Ra as an overall trend, one could argue that some of the results described above were within a range predictable from the detailed mathematical examination performed in step 1.

2) When $D_{uv}$ of test light is on negative side of experimental reference light (or experimental pseudo-reference light)

All of the Tables 2 to 7 include results in which the $D_{uv}$, of test light is on the negative side of experimental reference light (or experimental pseudo-reference light). These results show that when the $D_{uv}$ of the test light was in an appropriate negative range and the various indices in the tables were in appropriate ranges, the subjects judged the color appearance or the object appearance of the illuminated object to be favorable, more favorable, extremely favorable, or dramatically favorable. On the other hand, it is also shown that even if the $D_{uv}$ of the test light was in a similar range, the color appearance or the object appearance of the illuminated object was judged to be unfavorable or slightly favorable when the various indices in the tables were not in appropriate ranges as shown in Tables 2 to 5.

Among the results described above, it was totally unexpected that the color appearance of an object illuminated by test light would be a natural and favorable color appearance and a favorable object appearance as compared to being illuminated by experimental reference light (or experimental pseudo-reference light) when the $D_{uv}$ of the test light was in an appropriate negative range and the various indices in the tables were in appropriate ranges. Details of features pointed out by the subjects were as follows.

With white objects, the subjects judged that yellowness (greenness) had decreased and the objects appeared white, more white, extremely white, or dramatically white in comparison to being illuminated by experimental reference light (or experimental pseudo-reference light) when the $D_{uv}$ of the test light was in an appropriate negative range and the various indices in the tables were in appropriate ranges. It was also pointed out that the closer to an optimum range, the more natural and more favorable the appearance. This was a totally unexpected result.

Furthermore, with gray portions of the color checkers, the subjects judged that differences in lightness had increased, further increased, extremely increased, or dramatically increased in comparison to being illuminated by experimental reference light (or experimental pseudo-reference light) when the $D_{uv}$ of the test light was in an appropriate negative range and the various indices in the tables were in appropriate ranges. The subjects also pointed out that the closer to an optimum range, the more natural and the higher the visibility of the appearance. This was a totally unexpected result.

In addition, with contours of achromatic color samples, the subjects judged that clearness had increased, further increased, extremely increased, or dramatically increased in comparison to being illuminated by experimental reference light (or experimental pseudo-reference light) when the $D_{uv}$ of the test light was in an appropriate negative range and the various indices in the tables were in appropriate ranges. The subjects also pointed out that the closer to an optimum range, the more natural and the higher the visibility of the appearance. This was a totally unexpected result.

Furthermore, with characters in printed matter, the subjects judged that legibility had increased, further increased, extremely increased, or dramatically increased in comparison to being illuminated by experimental reference light (or experimental pseudo-reference light) when the $D_{uv}$ of the test light was in an appropriate negative range and the various indices in the tables were in appropriate ranges. The subjects also pointed out that the closer to an optimum range, the more natural and the higher the legibility of the appearance of characters. This was a totally unexpected result.

In addition, with the illuminated objects in various chromatic colors, the subjects judged that the color appearances of the illuminated objects had a natural vividness, a further natural vividness, an extremely natural vividness, or a dramatically natural vividness in comparison to being illuminated by experimental reference light (or experimental pseudo-reference light) when the $D_{uv}$ of the test light was in an appropriate negative range and the various indices in the tables were in appropriate ranges. The subjects also pointed out that the closer to an optimum range, the more natural and favorable the color appearance. This was a totally unexpected result.

Furthermore, with the various exterior wall color samples, the subjects judged that the color appearances of the color samples were close, further close, extremely close, or dramatically close to their memories when seeing the color samples outdoors in comparison to being illuminated by experimental reference light (or experimental pseudo-reference light) when the $D_{uv}$ of the test light was in an appropriate negative range and the various indices in the tables were in appropriate ranges. The subjects also pointed out that the closer to an optimum range, the more natural and favorable the color appearance, which more closely resembled their memories when seeing the color samples outdoors. This was a totally unexpected result.

In addition, with the color appearances of the skin of the subjects themselves (Japanese), the subjects judged that their skin appeared natural, further natural, extremely natural, or dramatically natural in comparison to being illuminated by experimental reference light (or experimental pseudo-reference light) when the $D_{uv}$ of the test light was in an appropriate negative range and the various indices in the tables were in appropriate ranges. The subjects also pointed out that the closer to an optimum range, the more natural, healthy, and favorable the color appearance. This was a totally unexpected result.

Furthermore, with differences in colors of petals of fresh flowers with similar and analogous colors, the subjects judged that the differences became distinguishable, further distinguishable, extremely distinguishable, or dramatically distinguishable in comparison to being illuminated by experimental reference light (or experimental pseudo-reference light) when the $D_{uv}$ of the test light was in an appropriate negative range and the various indices in the tables were in appropriate ranges. The subjects also pointed out that the greater the negative value of $D_{uv}$ relative to an appropriate upper limit within the experiment range, the greater the distinguishability. This was a totally unexpected result.

In addition, with various illuminated objects, the subjects judged that contours appeared clear, further clear, extremely clear, or dramatically clear in comparison to being illuminated by experimental reference light (or experimental pseudo-reference light) when the $D_{uv}$ of the test light was in an appropriate negative range and the various indices in the tables were inappropriate ranges. The subjects also pointed out that the greater the negative value of $D_{uv}$ relative to an appropriate upper limit within the experiment range, the clearer the appearance of the contours. This was a totally unexpected result.

Particularly since the greater the negative value of the $D_{uv}$ of the test light, the lower the value of Ra as an overall trend, one could argue that these results were totally unexpected from the detailed mathematical examination performed in step 1. As shown in Tables 2 to 7, purely focusing on Ra values reveal that, for example, Ra of test lights comprehensively judged to be "dramatically favorable" ranged from around 82 and 91 despite the fact that there were a large number of test lights with Ra of 95 or higher. In addition, the comparative visual experiments were performed beyond the $D_{uv}$ range described in ANSI C78.377-2008. Therefore, one can argue that the results described above represent a novel discovery of a perceptually favorable region related to the color appearance of an illuminated object outside of a current common-sense recommended chromaticity range.

Furthermore, with the illumination method according to the first embodiment of the present invention, it was shown that, in addition to $D_{uv}$, the various indices described in Tables 2 to 7 or, in other words, $|\Delta h_n|$,

[Expression 18]

$$\frac{\sum_{n=1}^{15} \Delta C_n}{15},$$

$\Delta C_n$, and $(|\Delta C_{max} - \Delta C_{min}|)$ must be within appropriate ranges in order to obtain such perceptions. In addition, it was found that the index $A_{cg}$ and the luminous efficacy of radiation K (lm/W) are favorably within appropriate ranges.

In particular, from the results of the test lights judged to be favorable in the visual experiments, in consideration of the characteristics of $|\Delta h_n|$,

[Expression 19]

$$\frac{\sum_{n=1}^{15} \Delta C_n}{15},$$

$\Delta C_n$, and $(|\Delta C_{max} - \Delta C_{min}|)$, it was found that the following trends exist. Specifically, test lights which produced a favorable color appearance or a favorable object appearance had the following characteristics with respect to the color appearance of the 15 color samples when illumination by calculational reference light is assumed and the color appearance of the 15 color samples when illumination by an actually measured test light spectral power distribution is assumed.

The difference in hue angles $(|\Delta h_n|)$ of the 15 color samples between illumination by test lights and illumination by calculational reference light is relatively small, and an average saturation

[Expression 20]

$$\frac{\sum_{n=1}^{15} \Delta C_n}{15}$$

of the 15 color samples when illuminated by the test lights had increased in an appropriate range as compared to that when illuminated by the calculational reference light. Moreover, in addition to the average values, individual saturations $(\Delta C_n)$ of the 15 color samples also show that none of the respective $\Delta C_n$ of the 15 color samples when illuminated by the test lights was excessively lower or higher than the same values when illuminated by the calculational reference light and were all in appropriate ranges. As a result, the difference among differences between maximum and minimum degrees of saturation $(|\Delta C_{max} - \Delta C_{min}|)$ was narrow in an appropriate range. When further simplified, it is inferable that an ideal case features small differences in hue angles among the hues of all 15 color samples and a relatively uniform increase in saturation of the 15 color samples within appropriate ranges when assuming illumination by test light as compared to when assuming illumination of the 15 color samples by reference light.

A solid line in FIG. 35 represents a normalized test light spectral power distribution of test light 3 judged to be "dramatically favorable" in the comprehensive judgment shown in Table 3. In addition, a dotted line in FIG. 35 represents a normalized spectral power distribution of calculational reference light (black-body radiator) calculated based on a CCT of the test light. On the other hand, FIG. 36 represents a CIELAB plot related to color appearances of the 15 color samples when assuming illumination by the test light 3 (solid line) and assuming illumination by the calculational reference light (black-body radiator) (dotted line). Moreover, while a direction perpendicular to the plane of paper represents lightness, only a* and b* axes were plotted for the sake of convenience.

Furthermore, FIGS. 37 and 38 summarize results of test light 10 judged to be "dramatically favorable" in the comprehensive judgment shown in Table 5 in a similar manner to that described above, and FIGS. 39 and 40 summarize results of test light 14 judged to be "dramatically favorable" in the comprehensive judgment shown in Table 6 in a similar manner to that described above.

In this manner, it is shown that when a favorable color appearance or a favorable object appearance is obtained in the visual experiments, differences in hue angles among the hues of all 15 color samples are small and saturation of the 15 color samples increase relatively uniformly within appropriate ranges when assuming illumination by the test light as compared to when assuming illumination of the 15 color samples by the reference light. It is also shown that, from this perspective, a CCT in a vicinity of 4000 K is favorable.

On the other hand, even if $D_{uv}$ has a negative value in an appropriate range, for example, comparative test light 19 with $D_{uv} \cong -0.0183$ in Table 5 is judged in the visual experiments to have an unfavorable appearance created by the test lights. This is conceivably due to the fact that some characteristics among $|\Delta h_n|$,

[Expression 21]

$$\frac{\sum_{n=1}^{15} \Delta C_n}{15},$$

$\Delta C_n$, and ($|\Delta C_{max}-\Delta C_{min}|$) were inappropriate. FIGS. 41 and 42 represent a result of a CIELAB plot performed with respect to a normalized spectral power distribution and color appearances of the 15 color samples for the comparative test light 19 in a similar manner to FIGS. 35, 36, and the like. As is apparent from FIGS. 41 and 42, there is a large difference in hue angles among several hues of the 15 color samples and saturation of the 15 color samples vary in an extremely non-uniform manner when comparing a case where illumination of the 15 color samples by the reference light is assumed with a case where illumination by the test lights is assumed.

The results of the visual experiments and the consideration thereof show that the respective quantitative indices favorably fall within the following ranges.

$D_{uv}$ in the illumination method according to the first embodiment of the present invention was −0.0075 or lower, more favorably −0.0100 or lower, extremely favorably −0.0120 or lower, and dramatically favorably −0.0160 or lower.

In addition, $D_{uv}$ in the illumination method according to the first embodiment of the present invention was −0.0325 or higher, favorably −0.0290 or higher, more favorably −0.0250 or higher, extremely favorably −0.0230 or higher, and dramatically favorably −0.0200 or higher.

Each $|\Delta h_n|$ in the illumination method according to the first embodiment of the present invention was 9.0 or lower, extremely favorably 8.4 or lower, and dramatically favorably 7.3 or lower. In addition, it is conceivable that a lower $|\Delta h_n|$ is more favorable and that each $|\Delta h_n|$ is more dramatically favorably 6.0 or lower, further dramatically favorably 5.0 or lower, and particularly dramatically favorably 4.0 or lower.

Moreover, each $|\Delta h_n|$ in the illumination method according to the first embodiment of the present invention was 0 or higher and a minimum value thereof during the visual experiments was 0.0029. Furthermore, an examination performed using actual test light during the visual experiments revealed that a favorable range of each $|\Delta h_n|$ which was the widest and within the examination range was 8.3 or lower and 0.003 or higher.

[Expression 22]

$$\frac{\sum_{n=1}^{15} \Delta C_n}{15}$$

in the illumination method according to the first embodiment of the present invention was 1.7 or higher, favorably 1.9 or higher, extremely favorably 2.3 or higher, and dramatically favorably 2.6 or higher; and 7.0 or lower, favorably 6.4 or lower, extremely favorably 5.1 or lower, and dramatically favorably 4.7 or lower.

Furthermore, an examination performed using actual test light during the visual experiments revealed that a favorable range of the above index which was the widest and within the examination range was 2.0 or higher and 6.3 or lower.

Each $\Delta C_n$ in the illumination method according to the first embodiment of the present invention was −2.7 or higher, extremely favorably −2.5 or higher, and dramatically favorably −0.7 or higher.

In addition, each $\Delta C_n$ in the illumination method according to the first embodiment of the present invention was 18.6 or lower, extremely favorably 17.0 or lower, and dramatically favorably 15.0 or lower. Moreover, an examination performed using actual test light during the visual experiments revealed that a favorable range of each $\Delta C_n$ which was the widest and within the examination range was −2.4 or higher and 16.8 or lower.

While ($|\Delta C_{max}-\Delta C_{min}|$) in the illumination method according to the first embodiment of the present invention was 19.6 or lower, ($|\Delta C_{max}-\Delta C_{min}|$) was extremely favorably 17.9 or lower, and dramatically favorably 15.2 or lower. In addition, it is conceivable that a lower ($|\Delta C_{max}-\Delta C_{min}|$) is more favorable and that ($|\Delta C_{max}-\Delta C_{min}|$) is more dramatically favorably 14.0 or lower and extremely dramatically favorably 13.0 or lower.

Moreover, ($|\Delta C_{max}-\Delta C_{min}|$) in the illumination method according to the first embodiment of the present invention was 3.0 or higher and a minimum value thereof during the visual experiments was 3.36. Moreover, an examination performed using actual test light during the visual experiments revealed that a favorable range of ($|\Delta C_{max}-\Delta C_{min}|$) which was the widest and within the examination range was 3.4 or higher and 17.8 or lower.

Meanwhile, an attempt was made using Tables 2 to 7 to have a radiometric property and a photometric property of a test light spectral power distribution represent characteristics associated with test lights which had been comprehensively judged to have favorable characteristics in the visual experiments.

Again, $D_{uv}$ was as considered heretofore and was −0.0075 or lower, more favorably −0.0100 or lower, extremely favorably −0.0120 or lower, and dramatically favorably −0.0160 or lower.

In addition, $D_{uv}$ according to the present invention was −0.0325 or higher, favorably −0.0290 or higher, more favorably −0.0250 or higher, extremely favorably −0.0230 or higher, and dramatically favorably −0.0200 or higher.

On the other hand, the following observation was made regarding the index $A_{cg}$.

From results shown in Tables 2 to 7, $A_{cg}$ in favorable spectral power distributions in the illumination method according to the first embodiment of the present invention was −26 or lower and −280 or higher. Although a precise definition of $A_{cg}$ is as described earlier, a rough physical meaning or a clear interpretation thereof is as follows. "$A_{cg}$ assumes a negative value in an appropriate range" means that there are appropriate existence of a concave and/or a convex shape in a normalized test light spectral power distribution, and radiant flux intensity of the normalized test light spectral power distribution tends to be higher than that of a mathematical normalized reference light spectral power distribution in a short wavelength range between 380 nm and 495 nm, and/or radiant flux intensity of the normalized test light spectral power distribution tends to be lower than that of a mathematical normalized reference light spectral power distribution in an intermediate wavelength range between 495 nm and 590 nm, and/or radiant flux intensity of the normalized test light spectral power distribution tends to be higher than that of a mathematical normalized reference light spectral power distribution in a long wavelength range between 590 nm and λ4. Since $A_{cg}$ is a sum of respective elements in the short wavelength range, the intermediate wavelength range, and the long wavelength range, individual elements may not necessarily exhibit the tendencies described above. Based on the above, it is understood that a favorable color appearance or a favorable object appearance was produced when $A_{cg}$ is quantitatively −26 or lower and −280 or higher.

$A_{cg}$ in the illumination method according to the first embodiment of the present invention was preferably −26 or lower, more favorably −28 or lower, extremely favorably −41 or lower, and dramatically favorably −114 or lower.

In addition, in the illumination method according to the first embodiment of the present invention, $A_{cg}$ was preferably −280 or higher, favorably −260 or higher, extremely favorably −181 or higher, and dramatically favorably −178 or higher.

Moreover, an examination performed using actual test light during the visual experiments revealed that a favorable range of $A_{cg}$ which was the widest and within the examination range was −253 or higher and −29 or lower.

Furthermore, while the illumination method according to the first embodiment of the present invention aimed for the realization of test light with favorable color appearance and high efficiency, results regarding luminous efficacy of radiation K were as follows.

The luminous efficacy of radiation of the spectral power distributions produced by the illumination method according to the first embodiment of the present invention favorably ranged from 180 (lm/W) to 320 (lm/W) and was at least higher by 20% or more than 150 (lm/W) which is a value of an ordinary incandescent bulb or the like. This is conceivably due to an appropriate concave and/or convex shape was present at an appropriate position in the spectral power distributions with respect to a relationship with V (λ). From the perspective of achieving a balance with color appearance, the luminous efficacy of radiation in the illumination method according to the present invention favorably ranged as described below.

Although the luminous efficacy of radiation K in the illumination method according to the first embodiment of the present invention was preferably 180 (lm/W) or higher, the luminous efficacy of radiation K was favorably 208 (lm/W) or higher, and extremely favorably 215 (lm/W) or higher. On the other hand, while, ideally, the higher the luminous efficacy of radiation K, the better, the luminous efficacy of radiation K in the present invention was preferably 320 (lm/W) or lower. In consideration of achieving a balance with color appearance, the luminous efficacy of radiation K was more favorably 290 (lm/W) or lower, extremely favorably 260 (lm/W) or lower, and dramatically favorably 231 (lm/W) of or lower.

Moreover, an examination performed using actual test light during the visual experiments revealed that a favorable range of K which was the widest and within the examination range was 210 (lm/W) or higher and 288 (lm/W) or lower.

Furthermore, the following findings were made regarding a CCT in the illumination method according to the first embodiment of the present invention. In order to have the various indices, namely, $|\Delta h_n|$, $$\frac{\sum_{n=1}^{15} \Delta C_n}{15},$$ [Expression 23]

$\Delta C_n$, and $(|\Delta C_{max} - \Delta C_{min}|)$ assume more appropriate values which were judged as being favorable in the comparative visual experiments, CCT favorably assumed a value near 4000 K in the illumination method according to the present invention. This is conceivably due to a spectral power distribution of light near 4000 K being hardly dependent on wavelength and is equi-energetic as also exhibited by reference light, and a test light spectral power distribution in which a concave and/or a convex shape are formed can be easily realized with respect to reference light. In other words, even in comparison to CCTs in other cases, $$\frac{\sum_{n=1}^{15} \Delta C_n}{15}$$ [Expression 24]

can be increased while keeping $|\Delta h_n|$ and $(|\Delta C_{max} - \Delta C_{min}|)$ at low levels to easily control $\Delta C_n$ with respect to a large number of color samples so that each $\Delta C_n$ assumes a desired value.

Therefore, a CCT in the illumination method according to the first embodiment of the present invention ranges normally from 1800 K to 15000 K, favorably from 2000 K to 10000 K, more favorably from 2300 K to 7000 K, extremely favorably from 2600 K to 6600 K, dramatically favorably from 2900 K to 5800 K, and most favorably from 3400 K to 5100 K.

Moreover, an examination performed using actual test light during the visual experiments revealed that a favorable range of a CCT which was the widest and within the examination result was 2550 (K) or higher and 5650 (K) or lower.

Meanwhile, with the light-emitting device according to the second embodiment of the present invention, it was shown that in order to obtain such perceptions, the indices $A_{cg}$ described in Tables 2 to 7 must be within appropriate ranges in addition to $D_{uv}$. In addition, it was revealed that the various indices, namely, the luminous efficacy of radiation K (lm/W), $|\Delta h_n|$, $$\frac{\sum_{n=1}^{15} \Delta C_n}{15},$$ [Expression 25]

$\Delta C_n$, and $(|\Delta C_{max} - \Delta C_{min}|)$ are favorably within appropriate ranges.

Firstly, results of the test lights judged to be favorable in the visual experiments revealed the following with respect to $D_{uv}$ and the index $A_{cg}$.

First, $D_{uv}$ was as considered heretofore and was −0.0075 or lower, more favorably −0.0100 or lower, extremely favorably −0.0120 or lower, and dramatically favorably −0.0160 or lower.

In addition, $D_{uv}$ according to the present invention was −0.0325 or higher, favorably −0.0290 or higher, more favorably −0.0250 or higher, extremely favorably −0.0230 or higher, and dramatically favorably −0.0200 or higher.

Furthermore, from results shown in Tables 2 to 7, $A_{cg}$ in spectral power distributions produced by the light-emitting device according to the second embodiment of the present invention was −26 or lower and −280 or higher. Although a precise definition of $A_{cg}$ is as described earlier, a rough physical meaning or a clear interpretation thereof is as follows. "$A_{cg}$ assumes a negative value in an appropriate range" means that there are appropriate existence of a concave and/or a convex shape in a normalized test light spectral power distribution, and radiant flux intensity of the normalized test light spectral power distribution tends to be higher than that of a mathematical normalized reference light spectral power distribution in a short wavelength range between 380 nm and 495 nm, and/or radiant flux intensity of the normalized test light spectral power distribution tends to be lower than that of a mathematical normalized reference light spectral power distribution in an intermediate wavelength range between 495 nm and 590 nm, and/or radiant flux intensity of the normalized test light spectral power distribution tends to be higher than that of a mathematical normalized reference light spectral power distribution in a long wavelength range between 590 nm and Λ4. Based on the above, it is understood that a favorable color appearance or a favorable object appearance was produced when $A_{cg}$ is quantitatively −26 or lower and −280 or higher.

$A_{cg}$ as derived from a spectral power distribution of light emitted in a main radiant direction from the light-emitting device according to the second embodiment of the present invention was −26 or lower, more favorably −28 or lower, extremely favorably −41 or lower, and dramatically favorably −114 or lower.

In addition, $A_{cg}$ as derived from a spectral power distribution of light emitted in a main radiant direction from the light-emitting device according to the second embodiment of the present invention was −280 or higher, favorably −260 or higher, extremely favorably −181 or higher, and dramatically favorably −178 or higher.

Moreover, an examination performed using actual test light during the visual experiments revealed that a favorable range of $A_{cg}$ within favorable experiment results under examination was −253 or higher and −29 or lower.

Secondly, while the present invention aimed for the realization of test light with favorable color appearance and high efficiency, results regarding luminous efficacy of radiation K were as follows.

The luminous efficacy of radiation of the spectral radiant flux produced by the light-emitting device according to the second embodiment of the present invention favorably ranged from 180 (lm/W) to 320 (lm/W) and was at least higher by 20% or more than 150 (lm/W) which is a value of an ordinary incandescent bulb or the like. This is conceivably due to an appropriate concave and/or convex shape was present at an appropriate position in the spectral power distributions with respect to a relationship with V (λ). From the perspective of achieving a balance with color appearance, the luminous efficacy of radiation by the light-emitting device according to the second embodiment of the present invention favorably ranged as described below.

Although the luminous efficacy of radiation K produced by the light-emitting device according to the second embodiment of the present invention was preferably 180 (lm/W) or higher, the luminous efficacy of radiation K was favorably 208 (lm/W) or higher, and extremely favorably 215 (lm/W) or higher. On the other hand, while, ideally, the higher the luminous efficacy of radiation K, the better, the luminous efficacy of radiation K in the present invention was preferably 320 (lm/W) or lower. In consideration of achieving a balance with color appearance, the luminous efficacy of radiation K was more favorably 290 (lm/W) or lower, extremely favorably 260 (lm/W) or lower, and dramatically favorably 231 (lm/W) or lower.

Moreover, an examination performed using actual test light during the visual experiments revealed that a favorable range of K within favorable experiment results under examination was 210 (lm/W) or higher and 288 (lm/W) or lower.

Thirdly, when considering the characteristics of $|\Delta h_n|$, $$\frac{\sum_{n=1}^{15} \Delta C_n}{15},$$ [Expression 26]

$\Delta C_n$, and $(|\Delta C_{max} - \Delta C_{min}|)$ it was found that the following trends exist. Specifically, test lights which produced a favorable color appearance or a favorable object appearance had the following characteristics with respect to the color appearance of the 15 color samples when illumination by calculational reference light is assumed and the color appearance of the 15 color samples when illumination by an actually measured test light spectral power distribution is assumed.

The difference in hue angles $(|\Delta h_n|)$ of the 15 color samples between illumination by test lights and illumination by calculational reference light is relatively small, and an average saturation $$\frac{\sum_{n=1}^{15} \Delta C_n}{15}$$ [Expression 27]

of the 15 color samples when illuminated by the test lights had increased in an appropriate range as compared to that when illuminated by the calculational reference light. Moreover, in addition to the average values, individual saturations $(\Delta C_n)$ of the 15 color samples also show that none of the respective $\Delta C_n$ of the 15 color samples when illuminated by the test lights was excessively lower or higher than the same values when illuminated by the calculational reference light and were all in appropriate ranges. As a result, the difference among differences between maximum and minimum degrees of saturation $(|\Delta C_{max} - \Delta C_{min}|)$ was narrow in an appropriate range. When further simplified, it is inferable that an ideal case features small differences in hue angles among the hues of all 15 color samples and a relatively uniform increase in saturation of the 15 color samples within appropriate ranges when assuming illumination by test light as compared to when assuming illumination of the 15 color samples by reference light.

A solid line in FIG. 35 represents a normalized test light spectral power distribution of the test light 3 judged to be "dramatically favorable" in the comprehensive judgment shown in Table 3. In addition, a dotted line in FIG. 35 represents a normalized spectral power distribution of calculational reference light (black-body radiator) calculated based on a CCT of the test light. On the other hand, FIG. 36 represents a CIELAB plot related to color appearances of the 15 color samples when assuming illumination by the test light 3 (solid line) and assuming illumination by the calculational reference light (black-body radiator) (dotted line). Moreover, while a direction perpendicular to the plane of paper represents lightness, only a* and b* axes were plotted for the sake of convenience.

Furthermore, FIGS. 37 and 38 summarize results of the test light 10 judged to be "dramatically favorable" in the comprehensive judgment shown in Table 5 in a similar manner to that described above, and FIGS. 39 and 40 summarize results of the test light 14 judged to be "dramatically favorable" in the comprehensive judgment shown in Table 6 in a similar manner to that described above.

In this manner, it is shown that when a favorable color appearance or a favorable object appearance is obtained in the visual experiments, differences in hue angles among the hues of all 15 color samples are small and saturation of the 15 color samples increase relatively uniformly within appropriate ranges when assuming illumination by the test light as compared to when assuming illumination of the 15 color samples by the reference light. It is also shown that, from this perspective, a CCT in a vicinity of 4000 K is favorable.

On the other hand, even if $D_{uv}$ has a negative value in an appropriate range, for example, the comparative test light 19 with $D_{uv} \approx -0.01831$ in Table 5 is judged in the visual experiments to have an unfavorable appearance created by the test lights. This is conceivably due to the fact that characteristics of the index $A_{cg}$ were not appropriate. FIGS. 41 and 42 represent a result of a CIELAB plot performed with respect to a normalized spectral power distribution and color appearances of the 15 color samples for the comparative test light 19 in a similar manner to FIGS. 35, 36, and the like. As is apparent from FIGS. 41 and 42, there is a large difference in hue angles among several hues of the 15 color samples and saturation of the 15 color samples vary in an extremely non-uniform manner when comparing a case where illumination of the 15 color samples by the reference light is assumed with a case where illumination by the test lights is assumed.

The results of the visual experiments and the consideration thereof show that the respective quantitative indices favorably fall within the following ranges.

As described earlier, $D_{uv}$ in the light-emitting device according to the second embodiment of the present invention was −0.0075 or lower, more favorably −0.0100 or lower, extremely favorably −0.0120 or lower, and dramatically favorably −0.0160 or lower.

In addition, $D_{uv}$ in the light-emitting device according to the second embodiment of the present invention was −0.0325 or higher, favorably −0.0290 or higher, more favorably −0.0250 or higher, extremely favorably −0.0230 or higher, and dramatically favorably −0.0200 or higher.

Each $|\Delta h_n|$ in the light-emitting device according to the second embodiment of the present invention was preferably 9.0 or lower, extremely favorably 8.4 or lower, and dramatically favorably 7.3 or lower. In addition, it is conceivable that a lower $|\Delta h_n|$ is more favorable and that each $|\Delta h_n|$ is more dramatically favorably 6.0 or lower, further dramatically favorably 5.0 or lower, and particularly dramatically favorably 4.0 or lower.

Moreover, each $|\Delta h_n|$ in the light-emitting device according to the second embodiment of the present invention was preferably 0 or higher and a minimum value thereof during the visual experiments was 0.0029. Furthermore, an examination performed using actual test light during the visual experiments revealed that a favorable range of each $|\Delta h_n|$ within favorable experiment results under examination was 8.3 or lower and 0.003 or higher.

$$\frac{\sum_{n=1}^{15} \Delta C_n}{15},$$ [Expression 28]

in the light-emitting device according to the second embodiment of the present invention was: preferably 1.7 or higher, favorably 1.9 or higher, extremely favorably 2.3 or higher, and dramatically favorably 2.6 or higher; and preferably 7.0 or lower, favorably 6.4 or lower, extremely favorably 5.1 or lower, and dramatically favorably 4.7 or lower.

Furthermore, an examination performed using actual test light during the visual experiments revealed that a favorable range of the above index within favorable experiment results under examination was 2.0 or higher and 6.3 or lower.

Each $\Delta C_n$ in the light-emitting device according to the second embodiment of the present invention was preferably −2.7 or higher, extremely favorably −2.5 or higher, and dramatically favorably −0.7 or higher.

In addition, each $\Delta C_n$ in the light-emitting device according to the second embodiment of the present invention was preferably 18.6 or lower, extremely favorably 17.0 or lower, and dramatically favorably 15.0 or lower.

Furthermore, an examination performed using actual test light during the visual experiments revealed that a favorable range of each $\Delta C_n$ within favorable experiment results under examination was −2.4 or higher and 16.8 or lower.

While $(|\Delta C_{max} - \Delta C_{min}|)$ in the light-emitting device according to the second embodiment of the present invention was preferably 19.6 or lower, $(|\Delta C_{max} - \Delta C_{min}|)$ was extremely favorably 17.9 or lower, and dramatically favorably 15.2 or lower. In addition, it is conceivable that a lower $(|\Delta C_{max} - \Delta C_{min}|)$ is more favorable and that $(|\Delta C_{max} - \Delta C_{min}|)$ is more dramatically favorably 14.0 or lower and extremely dramatically favorably 13.0 or lower.

Moreover, $(|\Delta C_{max} - \Delta C_{min}|)$ in the light-emitting device according to the second embodiment of the present invention was preferably 3.0 or higher and a minimum value thereof during the visual experiments was 3.36. Moreover, an examination performed using actual test light during the visual experiments revealed that a favorable range of $(|\Delta C_{max} - \Delta C_{min}|)$ within favorable experiment results under examination is 3.4 or higher and 17.8 or lower.

Fourthly, the following findings were made regarding a CCT in the light-emitting device according to the second embodiment of the present invention. In order to have the various indices, namely, $|\Delta h_n|$, $$\frac{\sum_{n=1}^{15} \Delta C_n}{15},$$ [Expression 29]

$\Delta C_n$, and $(|\Delta C_{max} - \Delta C_{min}|)$ assume more appropriate values which were judged as being favorable in the comparative visual experiments, CCT favorably assumed a value near 4000 K in the light-emitting device according to the second embodiment of the present invention. This is conceivably due to a spectral power distribution of light near 4000 K being hardly dependent on wavelength and is equi-energetic as also exhibited by reference light, and a test light spectral power distribution in which a concave and/or a convex shape is formed can be easily realized with respect to reference light. In other words, even in comparison to CCTs in other cases, $$\frac{\sum_{n=1}^{15} \Delta C_n}{15}$$ [Expression 30]

can be increased while keeping $|\Delta h_m|$ and $(|\Delta C_{max}-\Delta C_{min}|)$ at low levels to easily control $\Delta C_n$ with respect to a large number of color samples so that each $\Delta C_n$ assumes a desired value.

Therefore, a CCT in the light-emitting device according to the second embodiment of the present invention ranges normally from 1800 K to 15000 K, favorably from 2000 K to 10000 K, more favorably from 2300 K to 7000 K, extremely favorably from 2600 K to 6600 K, dramatically favorably from 2900 K to 5800 K, and most favorably from 3400 K to 5100 K.

Moreover, an examination performed using actual test light during the visual experiments revealed that a favorable range of a CCT within favorable experiment results under examination was 2550 (K) or higher and 5650 (K) or lower.

While a favorable embodiment for implementing the illumination method and the light-emitting device according to the present invention will be described below, it is to be understood that modes for implementing the illumination method and the light-emitting device according to the present invention are not limited to those used in the following description.

In the illumination method according to the present invention, no restrictions are placed on configurations, materials, and the like of the light-emitting device as long as a photometric property of test light which is irradiated on an illuminated object and which becomes a color stimulus is in an appropriate range and, at the same time, a difference between color appearances of the 15 color samples when illumination by calculational reference light is assumed and color appearances of the 15 color samples when illumination by an actually measured test light spectral power distribution is assumed is in an appropriate range.

With the light-emitting device according to the present invention, no restrictions are placed on configurations, materials, and the like of the light-emitting device as long as a radiometric property and a photometric property of test light which is irradiated from the light-emitting device in a main radiant direction and which becomes a color stimulus irradiated on an illuminated object are in appropriate ranges.

A light-emitting device for implementing the illumination method or the light-emitting device according to the present invention such as an illumination light source, a lighting fixture including the illumination light source, or a lighting system including the illumination light source or the lighting fixture preferably includes at least one semiconductor light-emitting element that is a light-emitting element. For example, the illumination light source including the semiconductor light-emitting element may be configured such that a plurality of semiconductor light-emitting elements of different types such as blue, green, and red is incorporated in one illumination light source or may be configured such that a blue semiconductor light-emitting element is included in one illumination light source, a green semiconductor light-emitting element is included in another illumination light source, and a red semiconductor light-emitting element is included in yet another illumination light source, whereby the semiconductor light-emitting elements are integrated with a lens, a reflecting mirror, a drive circuit, and the like in a light fixture and provided to a lighting system. Furthermore, in a case where one illumination light source is included in one lighting fixture and an individual semiconductor light-emitting element is incorporated in the illumination light source, even if the illumination method or the light-emitting device according to the present invention cannot be implemented as an individual illumination light source or an individual lighting fixture, a lighting system may be configured such that light radiated as the lighting system satisfies desired characteristics at a position of an illuminated object due to additive color mixing with light from a different lighting fixture that exists in the lighting system or the lighting system may be configured such that light in a main radiant direction among light radiated as the lighting system satisfies desired characteristics. In any mode, light as a color stimulus which is ultimately irradiated on an illuminated object or light in a main radiant direction among light emitted from the light-emitting device need only satisfy appropriate conditions according to the present invention.

Hereinafter, characteristics will be described which are favorably attained by a light-emitting device for implementing the illumination method according to the first embodiment of the present invention or the light-emitting device according to the second embodiment of the present invention on the basis of satisfying the appropriate conditions described above.

A light-emitting device for implementing the illumination method according to the first embodiment of the present invention or the light-emitting device according to the second embodiment of the present invention favorably includes a light-emitting element (light-emitting material) which has a peak within a short wavelength range from $\Lambda 1$ (380 nm) to $\Lambda 2$ (495 nm), another light-emitting element (light-emitting material) which has a peak within an intermediate wavelength range from $\Lambda 2$ (495 nm) to $\Lambda 3$ (590 nm), and yet another light-emitting element (light-emitting material) which has a peak within a long wavelength range from $\Lambda 3$ (590 nm) to 780 nm. This is because favorable color appearance can be readily achieved if intensity of each of the light-emitting elements can be individually set or controlled.

Therefore, a light-emitting device for implementing the illumination method according to the first embodiment of the present invention or the light-emitting device according to the second embodiment of the present invention favorably includes at least one each of light-emitting elements (light-emitting materials) which have emission peaks in the three respective wavelength ranges described above, more favorably includes one light-emitting element (light-emitting material) in each of two wavelength ranges among the three wavelength ranges and a plurality of light-emitting elements (light-emitting materials) in the one remaining wavelength range, extremely favorably includes one light-emitting element (light-emitting material) in one wavelength range among the three wavelength ranges and a plurality of light-emitting elements (light-emitting materials) in each of the two remaining wavelength ranges, and dramatically favorably includes a plurality of light-emitting elements (light-emitting materials) in all three wavelength ranges. This is because by incorporating light-emitting elements such that two or more peak wavelengths exist in one range, controllability of a spectral power distribution dramatically increases and, mathematically, a color appearance of an illuminated object can be more easily controlled as desired.

Therefore, in an actual light-emitting device that uses a semiconductor light-emitting element as a phosphor excitation light source, favorably, there are two types of phosphors in one light-emitting device and there are peak wavelengths in each of the three wavelength ranges including the wavelength of the semiconductor light-emitting element. In addition, it is even more favorable to have three types of phosphors and have two light-emitting elements incorporated in at least one range among the three wavelength regions including the wavelength of the semiconductor light-emitting element. From this perspective, it is extremely favorable to have four or more types of phosphors and dramatically favorable to have five types of phosphors. In particular, if there are six or more types of phosphors in one light source, spectrum controllability inversely declines due to mutual absorption among the phosphors and therefore becomes unfavorable. Furthermore, from a different perspective of realizing a simple light-emitting device, only one type of phosphor may be used and a light-emitting device may be configured with a total of two types of light-emitting elements including an emission peak of the semiconductor light-emitting element.

This also applies to a case where an actual light-emitting device is configured using only semiconductor light-emitting elements with different peak wavelengths. In other words, from the perspective of realizing a favorable spectral power distribution, the number of different types of semiconductor light-emitting elements in one light source is favorably three or more, more favorably four or more, extremely favorably five or more, and dramatically favorably six or more. Having seven or more different types creates a hassle when mounting on a light source or the like and therefore becomes unfavorable. Furthermore, from a different perspective of realizing a simple light-emitting device, a light-emitting device may be configured with two types of semiconductor light-emitting elements.

Moreover, semiconductor light-emitting elements and phosphors can be mixed and mounted at will. For example, a blue light-emitting element and two types of phosphors (green and red) may be mounted in one light source, or a blue light-emitting element and three types of phosphors (green, red 1, and red 2) may be mounted in one light source. Furthermore, a purple light-emitting element and four types of phosphors (blue, green, red 1, and red 2) may be mounted in one light source. Moreover, one light source may incorporate a portion mounted with a blue light-emitting element and two types of phosphors (green and red) and a portion mounted with a purple light-emitting element and three types of phosphors (blue, green, and red).

From the perspective of controlling intensity of peak portions or intensity of valleys between peaks or, in other words, the perspective of forming an appropriate concave and/or convex shape in a spectral power distribution, light-emitting elements (light-emitting materials) in each of the three wavelength ranges favorably include at least one light-emitting element with a relatively narrow band. Conversely, it is difficult to form an appropriate concave and/or convex shape in a spectral power distribution using only light-emitting elements with widths comparable to widths of the three respective wavelength ranges. Therefore, in the present invention, it is favorable to include at least one relatively narrow band light-emitting element. However, more favorably, two ranges among the three respective wavelength ranges include a relatively narrow band light-emitting element and, even more favorably, all of the three respective wavelength ranges include a relatively narrow band light-emitting element. In this case, while a relatively narrow band light-emitting element may itself individually constitute a light-emitting element in a given wavelength region, more favorably, a plurality of types of relatively narrow band light-emitting elements exist in the wavelength region and, equally more favorably, a relatively narrow band light-emitting element and a relatively broadband light-emitting element coexist in the wavelength region.

Moreover, a "relatively narrow band" as used herein refers to a full-width at half-maximum of a light-emitting element (light-emitting material) being equal to or less than ⅔ of 115 nm, 95 nm, and 190 nm which are respective range widths of the short wavelength range (380 nm to 495 nm), the intermediate wavelength range (495 nm to 590 nm), and the long wavelength range (590 nm to 780 nm). In addition, among a relatively narrow band light-emitting element, a full-width at half-maximum of the light-emitting element with respect to the respective range widths is favorably ½ or less, more favorably ⅓ or less, extremely favorably ¼ or less, and dramatically favorably ⅕ or less. Furthermore, since a narrow band spectrum that is excessively narrow may result in a case where desired characteristics cannot be realized unless a large number of different types of light-emitting elements are mounted in a light-emitting device, the full-width at half-maximum is favorably 2 nm or more, more favorably 4 nm or more, extremely favorably 6 nm or more, and dramatically favorably 8 nm or more.

From the perspective of realizing a desired spectral power distribution, combining relatively narrow band light-emitting elements (light-emitting materials) is favorable since a concave and/or a convex shape can be more easily formed in the spectral power distribution and the index $A_{cg}$, the luminous efficacy of radiation K (lm/W), and the like whose appropriate ranges have become apparent through the visual experiments can be more easily set to desired values. In addition, it is favorable to treat light as a color stimulus and incorporate a relatively narrow band light-emitting element among the light-emitting elements since a difference between color appearances of the 15 color samples when illumination by the light-emitting device is assumed and color appearances when illumination by calculational reference light is assumed can be more conveniently used to perform saturation control and, in particular, to set $|\Delta h_n|$, $$\frac{\sum_{n=1}^{15} \Delta C_n}{15},$$ [Expression 31]

$\Delta C_n$, ($|\Delta C_{max} - \Delta C_{min}|$), and the like whose appropriate ranges have become apparent through the visual experiments within appropriate numerical value ranges. Furthermore, it is favorable to use a relatively narrow band phosphor since $D_{uv}$ control can be performed more easily than when using a broad band phosphor.

In the illumination method and the light-emitting device according to the present invention, the following light-emitting materials, phosphor materials, and semiconductor light-emitting elements are favorably incorporated in the light-emitting device as light-emitting elements.

First, in the short wavelength range from Λ1 (380 nm) to Λ2 (495 nm) among the three wavelength ranges, light emitted from all light sources can be included, such as thermal emission light from a hot filament or the like, electric discharge emission light from a fluorescent tube, a high-pressure sodium lamp, or the like, stimulated emission light from a laser or the like, spontaneous emission light from a semiconductor light-emitting element, and spontaneous emission light from a phosphor. Among the above, emission of light from a photoexcited phosphor, emission of light from a photoexcited semiconductor light-emitting element, and emission of light from a photoexcited semiconductor laser are favorable due to their small sizes, high energy efficiency, and their ability to emit light in a relatively narrow band.

Specifically, the following is favorable.

Favorable examples of a semiconductor light-emitting element include a purple light-emitting element (with a peak wavelength of around 395 nm to 420 nm), a bluish purple light-emitting element (with a peak wavelength of around 420 nm to 455 nm), or a blue light-emitting element (with a peak wavelength of around 455 nm to 485 nm) in which an In(Al)GaN material formed on a sapphire substrate or a GaN substrate is included in an active layer structure. Furthermore, a blue light-emitting element (with a peak wavelength of around 455 nm to 485 nm) in which a Zn(Cd)(S)Se material formed on a GaAs substrate is included in an active layer structure is also favorable.

Moreover, a spectral power distribution or a peak wavelength of a radiant flux produced by a light-emitting element (light-emitting material) such as a semiconductor light-emitting element or a phosphor normally fluctuates slightly depending on ambient temperature, a heat dissipation environment of the light-emitting device including a package and a fixture, injected current, circuit architecture and, in some cases, deterioration or the like. Therefore, a semiconductor light-emitting element with a peak wavelength of 418 nm under a certain drive condition may exhibit a peak wavelength of, for example, 421 nm when temperature of ambient environment rises.

The same applies to a spectral power distribution or a peak wavelength of a radiant flux produced by light-emitting elements (light-emitting materials) such as the semiconductor light-emitting elements and phosphors described below.

The active layer structure may be any of a multiple quantum well structure in which a quantum well layer and a barrier layer are laminated, a single or a double heterostructure including a relatively thick active layer and a barrier layer (or a clad layer), and a homo junction constituted by a single pn junction.

In particular, when the active layer includes an In(Al)GaN material, a bluish purple light-emitting element and a purple light-emitting element in which In concentration decreases in the active layer structure as compared to a blue light-emitting element are favorable since emission wavelength fluctuation due to segregation by In decreases and a full-width at half-maximum of the emission spectrum becomes narrower. In addition, a bluish purple light-emitting element and a purple light-emitting element are favorable because wavelengths are positioned closer to a relatively outer side (short wavelength-side) of the wavelength range from 380 nm to 495 nm and $D_{uv}$ can be readily controlled. In other words, a semiconductor light-emitting element having an emission peak in the short wavelength range from $\Lambda 1$ (380 nm) to $\Lambda 2$ (495 nm) in the present invention is favorably a blue light-emitting element (with a peak wavelength of around 455 nm to 485 nm), more favorably a bluish purple light-emitting element (with a peak wavelength of around 420 nm to 455 nm) with a shorter wavelength, and extremely favorably a purple light-emitting element (with a peak wavelength of around 395 nm to 420 nm) with a shorter wavelength. Furthermore, it is also favorable to use a plurality of types of these light-emitting elements.

Moreover, a semiconductor laser is also favorably used as the light-emitting element and, for the same reasons as described above, the semiconductor laser is favorably a blue semiconductor laser (with an emission wavelength of around 455 nm to 485 nm), more favorably a bluish purple semiconductor laser (with an emission wavelength of around 420 nm to 455 nm) with a longer wavelength, and extremely favorably a purple semiconductor laser (with an emission wavelength of around 395 nm to 420 nm) with a longer wavelength.

With a short wavelength range semiconductor light-emitting element that is used in the illumination method or the light-emitting device according to the present invention, a full-width at half-maximum of an emission spectrum of the semiconductor light-emitting element is favorably narrow. From this perspective, the full-width at half-maximum of the semiconductor light-emitting element used in the short wavelength range is favorably 45 nm or less, more favorably 40 nm or less, extremely favorably 35 nm or less, and dramatically favorably 30 nm or less. On the other hand, since an excessively narrow band spectrum may result in a case where desired characteristics cannot be realized unless a large number of different types of light-emitting elements are mounted in a light-emitting device, the full-width at half-maximum of the semiconductor light-emitting element used in the short wavelength range is favorably 2 nm or more, more favorably 4 nm or more, extremely favorably 6 nm or more, and dramatically favorably 8 nm or more.

Since the short wavelength range semiconductor light-emitting element that is used in the illumination method or the light-emitting device according to the present invention favorably includes an In(Al)GaN material in an active layer structure, the semiconductor light-emitting element is favorably a light-emitting element formed on a sapphire substrate or a GaN substrate. In particular, the degree of In segregation in the active layer of a light-emitting element formed on a GaN substrate is more favorable than when formed on a sapphire substrate. This is dependent on the degree of lattice matching between the substrate and active layer structure material. Therefore, since the full-width at half-maximum of an In(Al)GaN emission spectrum on a GaN substrate can be set narrower, a dramatic synergistic effect with the present invention can be expected and is therefore extremely favorable. Furthermore, even among light-emitting elements on a GaN substrate, elements formed on a semi-polar surface or a non-polar surface are particularly favorable. This is because a decrease in a piezoelectric polarization effect in a crystal growth direction causes an increase in spatial overlapping of electrons' and holes' wave function in a quantum well layer and, in principle, an increase in radiation efficiency and a narrower band spectrum can be achieved. Therefore, by using a semiconductor light-emitting element on a semi-polar or non-polar GaN substrate, a dramatic synergistic effect with the present invention can be expected and is therefore extremely favorable.

In addition, as far as substrate thickness is concerned, the substrate is favorably either thick or completely separated from the semiconductor light-emitting element. In particular, when creating a short wavelength range semiconductor light-emitting element on a GaN substrate, in order to facilitate light extraction from side walls of the GaN substrate, the substrate is favorably thick and is 100 µm or more, more favorably 200 µm or more, extremely favorably 400 µm or more, and dramatically favorably 600 µm or more. On the other hand, for convenience of creating elements, the substrate thickness is favorably 2 mm or less, more favorably 1.8 mm or less, extremely favorably 1.6 mm or less, and dramatically favorably 1.4 mm or less.

Meanwhile, when creating a light-emitting element on a sapphire substrate or the like, the substrate is favorably separated using a method such as laser lift-off. Such a configuration reduces stress acting on the quantum well layer which facilitates widening of bandwidth due to an extreme lattice mismatch with the substrate and, as a result, a narrower band spectrum of the light-emitting element can be achieved. Therefore, with a light-emitting element separated from a sapphire substrate or the like, a dramatic synergistic effect with the present invention can be expected and is therefore extremely favorable.

With a short wavelength range phosphor material that is used in the illumination method or the light-emitting device according to the present invention, a full-width at half-maximum of the phosphor material is favorably narrow. From this perspective, the full-width at half-maximum of an emission spectrum of the phosphor material used in the short wavelength range when photoexcited at room temperature is favorably 90 nm or less, more favorably 80 nm or less, extremely favorably 70 nm or less, and dramatically favorably 60 nm or less. On the other hand, since an excessively narrow band spectrum may result in a case where desired characteristics cannot be realized unless a large number of different types of light-emitting elements are mounted in a light-emitting device, the full-width at half-maximum of the phosphor material used in the short wavelength range is favorably 2 nm or more, more favorably 4 nm or more, extremely favorably 6 nm or more, and dramatically favorably 8 nm or more.

With a short wavelength range phosphor material, in consideration of exciting the phosphor material and $D_{uv}$ controllability, the phosphor material favorably has a peak wavelength in the following ranges. In a case of light excitation, the peak wavelength favorably ranges from 455 nm to 485 nm and more favorably has a shorter wavelength from 420 nm to 455 nm. On the other hand, in a case of electron beam excitation, the peak wavelength favorably ranges from 455 nm to 485 nm, more favorably has a shorter wavelength from 420 nm to 455 nm, and extremely favorably has a shorter wavelength from 395 nm to 420 nm.

As for specific examples of the short wavelength range phosphor material used in the illumination method or the light-emitting device according to the present invention, while any phosphor material satisfying the full-width at half-maximum described above can be favorably used, one specific example is a blue phosphor which uses $Eu^{2+}$ as an activator and a crystal constituted by alkaline-earth aluminate or alkaline-earth halophosphate as a host. More specifically, examples include a phosphor represented by the following general formula (5), a phosphor represented by the following general formula (5)', $(Sr,Ba)_3MgSi_2O_8:Eu^{2+}$, and $(Ba,Sr,Ca,Mg)Si_2O_2N_2:Eu$.

$(Ba,Sr,Ca)MgAl_{10}O_{17}:Mn,Eu$ (5)

(An alkaline-earth aluminate phosphor represented by the general formula (5) is referred to as a BAM phosphor).

$Sr_aBa_bEu_x(PO_4)_cX_d$ (5)'

(In the general formula (5)', X is Cl. In addition, c, d, and x are numbers satisfying $2.7 \leq c \leq 3.3$, $0.9 \leq d \leq 1.1$, and $0.3 \leq x \leq 1.2$. Furthermore, a and b satisfy conditions represented by $a+b=5-x$ and $0 \leq b/(a+b) \leq 0.6$). (Among alkaline-earth halophosphate phosphors represented by general formula (5)', those containing Ba is referred to as SBCA phosphors and those not containing Ba is referred to as SCA phosphors).

Favorable examples include a BAM phosphor, a SBCA phosphor, and a SCA phosphor, which are the phosphors described above, as well as a Ba-SION phosphor ($(Ba,Sr,Ca,Mg)Si_2O_2N_2:Eu$) and a $(Sr,Ba)_3MgSi_2O_8:Eu^{2+}$ phosphor.

Next, in the intermediate wavelength range from Λ2 (495 nm) to Λ3 (590 nm) among the three wavelength ranges, light emitted from all light sources can be included, such as thermal emission light from a hot filament or the like, electric discharge emission light from a fluorescent tube, a high-pressure sodium lamp, or the like, stimulated emission light from a laser or the like including second-order harmonic generation (SHG) using a non-linear optical effect or the like, spontaneous emission light from a semiconductor light-emitting element, and spontaneous emission light from a phosphor. Among the above, emission of light from a photoexcited phosphor, emission of light from a photoexcited semiconductor light-emitting element, emission of light from a photoexcited semiconductor laser, and emission of light from a photoexcited SHG laser are favorable due to their small sizes, high energy efficiency, and their ability to emit light in a relatively narrow band.

Specifically, the following is favorable.

Favorable examples of a semiconductor light-emitting element include a greenish blue light-emitting element (with a peak wavelength of around 495 nm to 500 nm), a green light-emitting element (with a peak wavelength of around 500 nm to 530 nm), a yellowish green light-emitting element (with a peak wavelength of around 530 nm to 570 nm), or a yellow light-emitting element (with a peak wavelength of around 570 nm to 580 nm) in which an In(Al)GaN material on a sapphire substrate or a GaN substrate is included in an active layer structure. In addition, a yellowish green light-emitting element (with a peak wavelength of around 530 nm to 570 nm) due to GaP on a GaP substrate or a yellow light-emitting element (with a peak wavelength of around 570 nm to 580 nm) due to GaAsP on a GaP substrate is also favorable. Furthermore, a yellow light-emitting element (with a peak wavelength of around 570 nm to 580 nm) due to AlInGaP on a GaAs substrate is also favorable.

The active layer structure may be any of a multiple quantum well structure in which a quantum well layer and a barrier layer are laminated, a single or a double heterostructure including a relatively thick active layer and a barrier layer (or a clad layer), and a homo junction constituted by a single pn junction.

In particular, when using an In(Al)GaN material, a yellowish green light-emitting element, a green light-emitting element, and a greenish blue light-emitting element in which In concentration decreases in the active layer structure as compared to a yellow light-emitting element are favorable since emission wavelength fluctuation due to segregation by In decreases and a full-width at half-maximum of the emission spectrum becomes narrower. In other words, a semiconductor light-emitting element having an emission peak in the intermediate wavelength range from Λ2 (495 nm) to Λ3 (590 nm) in the present invention is favorably a yellow light-emitting element (with a peak wavelength of around 570 nm to 580 nm), more favorably a yellowish green light-emitting element (with a peak wavelength of around 530 nm to 570 nm) with a shorter wavelength, extremely favorably a green light-emitting element (with a peak wavelength of around 500 nm to 530 nm) with a shorter wavelength, and dramatically favorably a greenish blue light-emitting element (with a peak wavelength of around 495 nm to 500 nm).

Furthermore, a semiconductor laser, an SHG laser which converts an emission wavelength of a semiconductor laser using a non-linear optical effect, and the like are also favorably used as a light-emitting element. For the same reasons as described above, an emission wavelength is favorably within a yellow range (with a peak wavelength of around 570 nm to 580 nm), more favorably within a yellowish green range (with a peak wavelength of around 530 nm to 570 nm) with a shorter wavelength, extremely favorably within a green range (with a peak wavelength of around 500 nm to 530 nm) with a shorter wavelength, and dramatically favorably within a greenish blue range (with a peak wavelength of around 495 nm to 500 nm).

With an intermediate wavelength range semiconductor light-emitting element that is used in the illumination method or the light-emitting device according to the present invention, a full-width at half-maximum of an emission spectrum of the semiconductor light-emitting element is favorably narrow. From this perspective, the full-width at half-maximum of the semiconductor light-emitting element used in the intermediate wavelength range is favorably 75 nm or less, more favorably 60 nm or less, extremely favorably 50 nm or less, and dramatically favorably 40 nm or less. On the other hand, since an excessively narrow band spectrum may result in a case where desired characteristics cannot be realized unless a large number of different types of light-emitting elements are mounted in a light-emitting device, the full-width at half-maximum of the semiconductor light-emitting element used in the intermediate wavelength range is favorably 2 nm or more, more favorably 4 nm or more, extremely favorably 6 nm or more, and dramatically favorably 8 nm or more.

When the intermediate wavelength range semiconductor light-emitting element that is used in the present invention includes an In(Al)GaN material in an active layer structure, the semiconductor light-emitting element is favorably a light-emitting element formed on a sapphire substrate or a GaN substrate. In addition, a light-emitting element formed on a GaN substrate is particularly favorable. This is due to the fact that while In must be introduced into the active layer structure in a relatively large amount when creating an InAlGaN element in the intermediate wavelength range, an InAlGaN element formed on a GaN substrate reduces a piezoelectric effect attributable to a difference in lattice constants from the substrate and enables suppression of spatial separation of electrons/holes when injecting a carrier into a quantum well layer as compared to an InAlGaN element formed on a sapphire substrate. As a result, a full-width at half-maximum of the emission wavelength can be narrowed. Therefore, in the present invention, with an intermediate wavelength range semiconductor light-emitting element on a GaN substrate, a dramatic synergistic effect can be expected and is therefore favorable. Furthermore, even among light-emitting elements on a GaN substrate, elements formed on a semi-polar surface or a non-polar surface are particularly favorable. This is because a decrease in a piezoelectric polarization effect in a crystal growth direction causes an increase in spatial overlapping of electrons' and holes' wave function in a quantum well layer and, in principle, an increase in luminous efficiency and a narrower band spectrum can be achieved. Therefore, by using a semiconductor light-emitting element on a semi-polar or non-polar GaN substrate, a dramatic synergistic effect with the present invention can be expected and is therefore extremely favorable.

With all semiconductor light-emitting elements, regardless of the type of substrate on which the semiconductor light-emitting element is formed, the substrate is favorably either thick or completely removed.

In particular, when creating an intermediate wavelength range semiconductor light-emitting element on a GaN substrate, in order to facilitate light extraction from side walls of the GaN substrate, the substrate is favorably thick and is 100 µm or more, more favorably 200 µm or more, extremely favorably 400 µm or more, and dramatically favorably 600 µm or more. On the other hand, for convenience of creating elements, the substrate thickness is favorably 2 mm or less, more favorably 1.8 mm or less, extremely favorably 1.6 mm or less, and dramatically favorably 1.4 mm or less.

In addition, the same applies when creating an intermediate wavelength range semiconductor light-emitting element on a GaP substrate and, in order to facilitate light extraction from side walls of the GaP substrate, the substrate is favorably thick and is 100 µm or more, more favorably 200 µm or more, extremely favorably 400 µm or more, and dramatically favorably 600 µm or more. On the other hand, for convenience of creating elements, the substrate thickness is favorably 2 mm or less, more favorably 1.8 mm or less, extremely favorably 1.6 mm or less, and dramatically favorably 1.4 mm or less.

Meanwhile, in a case of an AlInGaP material formed on a GaAs substrate, light in the emission wavelength range is absorbed due to a bandgap of the substrate being smaller than a bandgap of the material constituting the active layer structure. Therefore, as far as substrate thickness is concerned, the substrate is favorably thin or completely separated from the semiconductor light-emitting element.

In addition, when creating a light-emitting element on a sapphire substrate or the like, the substrate is favorably separated using a method such as laser lift-off. Such a configuration reduces stress acting on the quantum well layer which causes widening of bandwidth due to an extreme lattice mismatch with the substrate and, as a result, a narrower band spectrum of the light-emitting element can be achieved. Therefore, with a semiconductor light-emitting element separated from a sapphire substrate or the like, a dramatic synergistic effect with the present invention can be expected and is therefore extremely favorable.

With an intermediate wavelength range phosphor material that is used in the illumination method or the light-emitting device according to the present invention, a full-width at half-maximum of the phosphor material is favorably narrow. From this perspective, the full-width at half-maximum of an emission spectrum of the phosphor material used in the intermediate wavelength range when photoexcited at room temperature is favorably 130 nm or less, more favorably 110 nm or less, extremely favorably 90 nm or less, and dramatically favorably 70 nm or less. On the other hand, since an excessively narrow band spectrum may result in a case where desired characteristics cannot be realized unless a large number of different types of light-emitting elements are mounted in a light-emitting device, the full-width at half-maximum of the phosphor material used in the intermediate wavelength range is favorably 2 nm or more, more favorably 4 nm or more, extremely favorably 6 nm or more, and dramatically favorably 8 nm or more.

With an intermediate wavelength range phosphor material, in consideration of $D_{uv}$ controllability, a peak wavelength of the phosphor material favorably ranges from 495 nm to 500 nm. A peak wavelength ranging from 500 nm to 530 nm and a peak wavelength ranging from 570 nm to 580 nm are both more favorable to similar degrees, and a peak wavelength ranging from 530 nm to 570 nm is extremely favorable.

As for specific examples of the intermediate wavelength range phosphor material used in the illumination method or the light-emitting device according to the present invention, any phosphor material satisfying the full-width at half-maximum described above can be favorably used, and such specific examples include a green phosphor containing $Eu^{2+}$, $Ce^{3+}$, or the like as an activator. A preferable green phosphor using $Eu^{2+}$ as an activator is a green phosphor which uses a crystal constituted by alkaline-earth silicate, alkaline-earth nitride silicate, or SiAlON as a host. A green phosphor of this type can normally be excited using a semiconductor light-emitting element ranging from ultraviolet to blue.

Specific examples of those using an alkaline-earth silicate crystal as a host include a phosphor represented by the following general formula (6) and a phosphor represented by the following general formula (6)'.

$$(Ba_aCa_bSr_cMg_dEu_x)SiO_4 \quad (6)$$

(In the general formula (6), a, b, c, d, and x satisfy a+b+c+d+x=2, $1.0 \le a \le 2.0$, $0 \le b < 0.2$, $0.2 \le c \le 0.8$, $0 \le d < 0.2$, and $0 < x \le 0.5$). (Alkaline-earth silicate represented by the general formula (6) is referred to as a BSS phosphor).

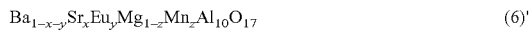
$$Ba_{1-x-y}Sr_xEu_yMg_{1-z}Mn_zAl_{10}O_{17} \quad (6)'$$

(In the general formula (6)', x, y, and z respectively satisfy $0.1 \le x \le 0.4$, $0.25 \le y \le 0.6$, and $0.05 \le z \le 0.5$). (An alkaline-earth aluminate phosphor represented by general formula (6)' is referred to as a G-BAM phosphor).

Specific examples having a SiAlON crystal as a host include a phosphor represented by $Si_{6-z}Al_zO_zN_{8-z}$:Eu (where $0 < z < 4.2$) (this phosphor is referred to as a β-SiAlON phosphor). Preferable green phosphors using $Ce^{3+}$ as an activator include a green phosphor with a garnet-type oxide crystal as a host such as $Ca_3(Sc,Mg)_2Si_3O_{12}$:Ce or a green phosphor with an alkaline-earth scandate crystal as a host such as $CaSc_2O_4$:Ce. Other examples include $SrGaS_4$:$Eu^{2+}$.

Still other examples include an oxynitride phosphor represented by $(Ba,Ca,Sr,Mg,Zn,Eu)_3Si_6O_{12}N_2$ (this phosphor is referred to as a BSON phosphor).

Yet other examples include a yttrium aluminum garnet phosphor represented by $(Y_{1-u}Gd_u)_3(Al_{1-v}Ga_v)_5O_{12}$:Ce,Eu (where u and v respectively satisfy $0 \le u \le 0.3$ and $0 \le v \le 0.5$) (this phosphor is referred to as a YAG phosphor) and a lanthanum silicon nitride phosphor represented by $Ca_{1.5x}La_{3-x}Si_6N_{11}$:Ce (where x satisfies $0 \le x \le 1$) (this phosphor is referred to as an LSN phosphor).

Among the phosphors described above, favorable examples include a BSS phosphor, a β-SiAlON phosphor, a BSON phosphor, a G-BAM phosphor, a YAG phosphor, and a $SrGaS_4$:$Eu^{2+}$ phosphor.

Next, in the long wavelength range from Λ3 (590 nm) to 780 nm among the three wavelength ranges, light emitted from all light sources can be included, such as thermal emission light from a hot filament or the like, electric discharge emission light from a fluorescent tube, a high-pressure sodium lamp, or the like, stimulated emission light from a laser or the like, spontaneous emission light from a semiconductor light-emitting element, and spontaneous emission light from a phosphor. Among the above, emission of light from a photoexcited phosphor, emission of light from a photoexcited semiconductor light-emitting element, and emission of light from a photoexcited semiconductor laser are favorable due to their small sizes, high energy efficiency, and their ability to emit light in a relatively narrow band.

Specifically, the following is favorable.

As the semiconductor light-emitting element, an orange light-emitting element (with a peak wavelength of around 590 nm to 600 nm) or a red light-emitting element (from 600 nm to 780 nm) in which an AlGaAs material formed on a GaAs substrate or an (Al)InGaP material formed on a GaAs substrate is included in an active layer structure is favorable. In addition, a red light-emitting element (from 600 nm to 780 nm) in which an GaAsP material formed on a GaP substrate is included in an active layer structure is favorable.

The active layer structure may be any of a multiple quantum well structure in which a quantum well layer and a barrier layer are laminated, a single or a double hetero-structure including a relatively thick active layer and a barrier layer (or a clad layer), and a homo junction constituted by a single pn junction.

In particular, in this wavelength range, a peak wavelength is favorably close to a vicinity of 630 nm in consideration of achieving a balance between $D_{uv}$ controllability and luminous efficacy of radiation. From this perspective, a red light-emitting element is more favorable than an orange light-emitting element. In other words, a semiconductor light-emitting element having an emission peak in the long wavelength range from Λ3 (590 nm) to 780 nm in the present invention is favorably an orange light-emitting element (with a peak wavelength of around 590 nm to 600 nm), more favorably a red light-emitting element (with a peak wavelength of around 600 nm to 780 nm), and extremely favorably a red light-emitting element with a peak wavelength that is close to around 630 nm. In particular, a red light-emitting element with a peak wavelength ranging from 615 nm to 645 nm is extremely favorable.

In addition, a semiconductor laser is also favorably used as a light-emitting element. For the same reasons as described above, an emission wavelength is favorably within an orange range (with a peak wavelength of around 590 nm to 600 nm), more favorably within a red range (with a peak wavelength of around 600 nm to 780 nm), and extremely favorably within a red range in which a peak wavelength is close to around 630 nm. In particular, a red semiconductor laser with a peak wavelength ranging from 615 nm to 645 nm is extremely favorable.

With a long wavelength range semiconductor light-emitting element that is used in the illumination method or the light-emitting device according to the present invention, a full-width at half-maximum of an emission spectrum of the semiconductor light-emitting element is favorably narrow. From this perspective, the full-width at half-maximum of the semiconductor light-emitting element used in the long wavelength range is favorably 30 nm or less, more favorably 25 nm or less, extremely favorably 20 nm or less, and dramatically favorably 15 nm or less. On the other hand, since an excessively narrow band spectrum may result in a case where desired characteristics cannot be realized unless a large number of different types of light-emitting elements are mounted in a light-emitting device, the full-width at half-maximum of the semiconductor light-emitting element used in the long wavelength range is favorably 2 nm or more, more favorably 4 nm or more, extremely favorably 6 nm or more, and dramatically favorably 8 nm or more.

In the long wavelength range, light in the emission wavelength range is absorbed due to a bandgap of the GaAs substrate being smaller than a bandgap of the material constituting the active layer structure. Therefore, as far as substrate thickness is concerned, the substrate is favorably thin or completely removed.

With a long wavelength range phosphor material that is used in the illumination method or the light-emitting device according to the present invention, a full-width at half-maximum of the phosphor material is favorably narrow. From this perspective, the full-width at half-maximum of an emission spectrum of the phosphor material used in the long wavelength range when photoexcited at room temperature is favorably 130 nm or less, more favorably 110 nm or less, extremely favorably 90 nm or less, and dramatically favorably 70 nm or less. On the other hand, since an excessively narrow band spectrum may result in a case where desired characteristics cannot be realized unless a large number of different types of light-emitting elements are mounted in a light-emitting device, the full-width at half-maximum of the phosphor material used in the long wavelength range is favorably 2 nm or more, more favorably 4 nm or more, extremely favorably 6 nm or more, and dramatically favorably 8 nm or more.

With a long wavelength range phosphor material, when creating a light-emitting device by integrating the phosphor material with other materials, a peak wavelength is extremely favorably close to 630 nm in consideration of achieving a balance between $D_{uv}$ controllability and luminous efficacy of radiation. In other words, a phosphor material having an emission peak in a long wavelength range from Λ3 (590 nm) to 780 nm in the present invention has a peak that is favorably between 590 nm and 600 nm and more favorably around 600 nm to 780 nm, and a peak wavelength is extremely favorably close to 630 nm. In particular, a phosphor material with a peak wavelength ranging from 620 nm to 655 nm is extremely favorable.

As for specific examples of the long wavelength range phosphor material used in the illumination method or the light-emitting device according to the present invention, any phosphor material satisfying the full-width at half-maximum described above can be favorably used. In addition, such specific examples include phosphors using $Eu^{2+}$ as an activator and a crystal constituted by alkaline-earth silicon-nitride, α SiAlON, or alkaline-earth silicate as a host. A red phosphor of this type can normally be excited using a semiconductor light-emitting element ranging from ultraviolet to blue. Specific examples of phosphors using an alkaline-earth silicon-nitride crystal as a host include a phosphor represented by $(Ca,Sr,Ba,Mg)AlSiN_3$:Eu and/or $(Ca,Sr,Ba)AlSiN_3$:Eu (this phosphor is referred to as a SCASN phosphor), a phosphor represented by $(CaAlSiN_3)_{1-x}(Si_2N_2O)_x$:Eu (where x satisfies 0<x<0.5) (this phosphor is referred to as a CASON phosphor), a phosphor represented by $(Sr,Ca,Ba)_2Al_xSi_{5-x}O_xN_{8-x}$:Eu (where 0≤x≤2) and a phosphor represented by $Eu_y(Sr,Ca,Ba)_{1-y}:Al_{1+x}Si_{4-x}O_xN_{7-x}$ (where 0≤x<4, 0≤y<0.2).

Other examples include a $Mn^{4+}$-activated fluoride complex phosphor. A $Mn^{4+}$-activated fluoride complex phosphor is a phosphor which uses $Mn^{4+}$ as an activator and a fluoride complex salt of an alkali metal, amine, or an alkaline-earth metal as a host crystal. Fluoride complex salts which form the host crystal include those whose coordination center is a trivalent metal (B, Al, Ga, In, Y, Sc, or a lanthanoid), a tetravalent metal (Si, Ge, Sn, Ti, Zr, Re, or Hf), and a pentavalent metal (V, P, Nb, or Ta), and the number of fluorine atoms coordinated around the center ranges from 5 to 7.

A favorable $Mn^{4+}$-activated fluoride complex phosphor is $A_{2+x}M_yMn_zF_n$ (where A is Na and/or K; M is Si and Al; and −1≤x≤1 and 0.9≤y+z≤1.1 and 0.001≤z≤0.4 and 5≤n≤7) which uses a hexafluoro complex of an alkali metal as a host crystal. Among the above, particularly favorable are phosphors in which A is one or more types selected from K (potassium) or Na (sodium) and M is Si (silicon) or Ti (titanium), such as $K_2SiF_6$:Mn (this phosphor is referred to as a KSF phosphor) or $K_2Si_{1-x}Na_xAl_xF_6$:Mn,$K_2TiF_6$:Mn (this phosphor is referred to as a KSNAF phosphor) that is obtained by replacing a part (favorably, 10 mol % or less) of the components of $K_2SiF_6$:Mn with Al and Na.

Other examples include a phosphor represented by the following general formula (7) and a phosphor represented by the following general formula (7)'.

$(La_{1-x-y},Eu_x,Ln_y)_2O_2S$ (7)

(In the general formula (7), x and y denote numbers respectively satisfying 0.02≤x≤0.50 and 0≤y≤0.50, and Ln denotes at least one trivalent rare-earth element among Y, Gd, Lu, Sc, Sm, and Er). (A lanthanum oxysulfide phosphor represented by the general formula (7) is referred to as an LOS phosphor).

$(k-x)MgO.xAF_2.GeO_2:yMn^{4+}$ (7)'

(In the general formula (7)', k, x, and y denote numbers respectively satisfying 2.8≤k≤5, 0.1≤x≤0.7, and 0.005≤y≤0.015, and A is any of calcium (Ca), strontium (Sr), barium (Ba), zinc (Zn), and a mixture consisted of these elements). (A germanate phosphor represented by the general formula (7)' is referred to as an MGOF phosphor).

Favorable examples include a LOS phosphor, an MGOF phosphor, a KSF phosphor, a KSNAF phosphor, a SCASN phosphor, and a CASON phosphor, which are the phosphors described above, as well as a $(Sr,Ca,Ba)_2Si_5N_8$:Eu phosphor and a $(Sr,Ca,Ba)AlSi_4N_7$ phosphor.

In the illumination method or the light-emitting device according to the present invention, no particular restrictions are applied to materials for appropriately controlling a spectral power distribution of the light-emitting device. However, it is extremely favorable to realize a light-emitting device such as those described below.

It is favorable to use a purple LED (with a peak wavelength of around 395 nm to 420 nm) as a short wavelength range light-emitting element, and further incorporate at least one or more phosphors selected from a group of relatively narrow band phosphors consisting of SBCA, SCA, and BAM in a light source as a light-emitting element in the short wavelength range, incorporate at least one or more phosphors selected from a group of relatively narrow band phosphors consisting of β-SiAlON, BSS, BSON, and G-BAM in the light source as a light-emitting element in the intermediate wavelength range, and incorporate at least one or more phosphors selected from the group consisting of CASON, SCASN, LOS, KSF, and KSNAF in the light source as a light-emitting element in the long wavelength range.

A further description is given below.

It is extremely favorable to use a purple LED (with a peak wavelength of around 395 nm to 420 nm) as a first light-emitting element in the short wavelength range, further incorporate SBCA that is a relatively narrow band phosphor in a light source as a second light-emitting element in the short wavelength range, use β-SiAlON that is a relatively narrow band phosphor as a first light-emitting element in the intermediate wavelength range, and use CASON as a first light-emitting element in the long wavelength range.

In addition, it is extremely favorable to use a purple LED (with a peak wavelength of around 395 nm to 420 nm) as a first light-emitting element in the short wavelength range, further incorporate SCA that is a relatively narrow band phosphor in a light source as a second light-emitting element in the short wavelength range, include β-SiAlON that is a relatively narrow band phosphor as a first light-emitting element in the intermediate wavelength range, and use CASON as a first light-emitting element in the long wavelength range.

Furthermore, it is extremely favorable to use a purple LED (with a peak wavelength of around 395 nm to 420 nm) as a first light-emitting element in the short wavelength range, further incorporate BAM that is a relatively narrow band phosphor in a light source as a second light-emitting element in the short wavelength range, use BSS that is a relatively narrow band phosphor as a first light-emitting element in the intermediate wavelength range, and use CASON as a first light-emitting element in the long wavelength range.

Meanwhile, it is favorable to use a bluish purple LED (with a peak wavelength of around 420 nm to 455 nm) and/or a blue LED (with a peak wavelength of around 455 nm to 485 nm) as a short wavelength range light-emitting element, incorporate at least one or more phosphors selected from a group of relatively narrow band phosphors consisting of β-SiAlON, BSS, BSON, and G-BAM in a light source as a light-emitting element in the intermediate wavelength range, and incorporate at least one or more phosphors selected from the group consisting of CASON, SCASN, LOS, KSF, and KSNAF in the light source as a light-emitting element in the long wavelength range.

A further description is given below.

It is extremely favorable to use a bluish purple LED (with a peak wavelength of around 420 nm to 455 nm) and/or a blue LED (with a peak wavelength of around 455 nm to 485 nm) as a light-emitting element in the short wavelength range, further use BSON that is a relatively narrow band phosphor as a first light-emitting element in the intermediate wavelength range, and use SCASN as a first light-emitting element in the long wavelength range.

It is extremely favorable to use a bluish purple LED (with a peak wavelength of around 420 nm to 455 nm) and/or a blue LED (with a peak wavelength of around 455 nm to 485 nm) as a light-emitting element in the short wavelength range, further use β-SiAlON that is a relatively narrow band phosphor as a first light-emitting element in the intermediate wavelength range, and use CASON as a first light-emitting element in the long wavelength range.

It is extremely favorable to use a bluish purple LED (with a peak wavelength of around 420 nm to 455 nm) and/or a blue LED (with a peak wavelength of around 455 nm to 485 nm) as a light-emitting element in the short wavelength range, further use β-SiAlON that is a relatively narrow band phosphor as a first light-emitting element in the intermediate wavelength range, use CASON as a first light-emitting element in the long wavelength range, and use KSF or KSNAF as a second light-emitting element in the long wavelength range.

It is extremely favorable to use a bluish purple LED (with a peak wavelength of around 420 nm to 455 nm) and/or a blue LED (with a peak wavelength of around 455 nm to 485 nm) as a light-emitting element in the short wavelength range, further use β-SiAlON that is a relatively narrow band phosphor as a first light-emitting element in the intermediate wavelength range, and use SCASN as a first light-emitting element in the long wavelength range.

It is extremely favorable to use a bluish purple LED (with a peak wavelength of around 420 nm to 455 nm) and/or a blue LED (with a peak wavelength of around 455 nm to 985 nm) as a light-emitting element in the short wavelength range, further use β-SiAlON that is a relatively narrow band phosphor as a first light-emitting element in the intermediate wavelength range, use SCASN as a first light-emitting element in the long wavelength range, and use KSF or KSNAF as a second light-emitting element in the long wavelength range.

With the combinations of light-emitting elements described above, peak wavelength positions, full-widths at half-maximum, and the like of the respective light-emitting elements are extremely advantageous in realizing a color appearance or an object appearance perceived as favorable by the subjects in the visual experiments.

In the illumination method or the light-emitting device according to the present invention, it is favorable to use the light-emitting elements (light-emitting materials) heretofore described because the index $A_{cg}$, the luminous efficacy of radiation K (lm/W), $D_{uv}$, and the like can be more readily set to desired values. Using the light-emitting elements described above is also favorable because $|\Delta h_n|$, $$\frac{\sum_{n=1}^{15} \Delta C_n}{15},$$ [Expression 32]

$\Delta C_n$, and $(|\Delta C_{max} - \Delta C_{min}|)$ which are related, when light is treated as a color stimulus, to a difference between color appearances of the 15 color samples when illumination by the light-emitting device is assumed and color appearances when illumination by calculational reference light is assumed can also be more readily set to desired values.

Various means are conceivable for lowering $D_{uv}$ from zero to set $D_{uv}$ to an appropriate negative value. For example, when a light-emitting device having one light-emitting element in each of the three wavelength ranges is assumed, an emission position of the light-emitting element in the short wavelength range can be moved toward a shorter wavelength side, an emission position of the light-emitting element in the long wavelength range can be moved toward a longer wavelength side, an emission position of the light-emitting element in the intermediate wavelength range can be displaced from 555 nm. Furthermore, a relative emission intensity of the light-emitting element in the short wavelength range can be increased, a relative emission intensity of the light-emitting element in the long wavelength range can be increased, a relative emission intensity of the light-emitting element in the intermediate wavelength range can be decreased, or the like. In doing so, in order to vary $D_{uv}$ without varying the CCT, the emission position of the light-emitting element in the short wavelength range may be moved toward a shorter wavelength side and, at the same time, the emission position of the light-emitting element in the long wavelength range may be moved toward a longer wavelength side, or the like. Moreover, operations opposite to those described above may be performed to vary $D_{uv}$ toward a positive side.

In addition, when a light-emitting device respectively having two light-emitting elements in each of the three wavelength ranges is assumed, $D_{uv}$ can be lowered by, for example, increasing a relative intensity of a light-emitting element on a relatively shorter wavelength side among the two light-emitting elements in the short wavelength range, increasing a relative intensity of a light-emitting element on a relatively longer wavelength side among the two light-emitting elements in the long wavelength range, or the like. In doing so, in order to vary $D_{uv}$ without varying the CCT, the relative intensity of the light-emitting element on a relatively shorter wavelength side among the two light-emitting elements in the short wavelength range is increased and, at the same time, the relative intensity of the light-emitting element on a relatively longer wavelength side among the two light-emitting elements in the long wavelength range is increased. Moreover, operations opposite to those described above may be performed to vary $D_{uv}$ toward a positive side.

Meanwhile, as means for varying $|\Delta h_n|$, $$\frac{\sum_{n=1}^{15} \Delta C_n}{15},$$ [Expression 33]

$\Delta C_n$, and ($|\Delta C_{max}-\Delta C_{min}|$) which are related to a difference between color appearances of the 15 color samples when illumination by the light-emitting device is assumed and color appearances when illumination by calculational reference light is assumed and, in particular, as means for increasing $\Delta C_n$, operations such as described below can be performed after adjusting an entire spectral power distribution so that $D_{uv}$ assumes a desired value. Operations which may be performed include replacing each light-emitting element with a material having a narrow full-width at half-maximum, forming a spectrum shape in which light-emitting elements are appropriately separated from each other, installing a filter that absorbs a desired wavelength in an illumination light source, a lighting fixture, or the like in order to form a concave and/or a convex shape in a spectrum of each light-emitting element, and additionally mounting a light-emitting element which performs emission at a narrower band in a light-emitting element.

As described above, the present invention reveals a primary illumination method or a primary light-emitting device for producing, with respect to a wide variety of illuminated objects with various hues, a color appearance or an object appearance which is as natural, vivid, highly visible, and comfortable as though perceived in a high-illuminance environment such as outdoors where illuminance exceeds 10000 lx, within an illuminance range of approximately 150 lx to approximately 5000 lx for which visual experiments have been carried out. In particular, the illumination method or the light-emitting device according to the present invention provides respective hues with natural vividness and, at the same time, enables white objects to be perceived more whiter as compared to experimental reference light.

Means according to the illumination method of the present invention for producing a color appearance or an object appearance which is as natural, vivid, highly visible, and comfortable as perceived in a high-illuminance environment involve providing a light-emitting device setting $D_{uv}$ of light at a position of an illuminated object to within an appropriate range and, at the same time, setting indices related to a difference between color appearances of the 15 color samples when illumination by the light is assumed and color appearances when illumination by calculational reference light is assumed such as $|\Delta h_n|$, $$\frac{\sum_{n=1}^{15}\Delta C_n}{15},$$ [Expression 34]

$\Delta C_n$, and ($|\Delta C_{max}-\Delta C_{min}|$) to within appropriate ranges.

In other words, the illumination method according to the present invention is an illumination method of illuminating light in which $|\Delta h_n|$, $$\frac{\sum_{n=1}^{15}\Delta C_n}{15},$$ [Expression 35]

$\Delta C_n(|\Delta C_{max}-\Delta C_{min}|)$, $D_{uvSSL}$, and the like are within appropriate ranges to an illuminated object, and a light-emitting device used in the illumination method according to the present invention can be configured in anyway as long as the device is capable of providing such illumination. For example, the device may be any of an individual illumination light source, an illuminating module in which at least one or more of the light sources is mounted on a heatsink or the like, and a lighting fixture in which a lens, a light-reflecting mechanism, a driving electric circuit, and the like are added to the light source or the module. Furthermore, the device may be a lighting system which is a collection of individual light sources, individual modules, individual fixtures, and the like and which at least has a mechanism for supporting such components.

In addition, the light-emitting device according to the present invention is a light-emitting device in which means for producing a color appearance or an object appearance which is as natural, vivid, highly visible, and comfortable as perceived in a high-illuminance environment involve setting $D_{uv}$ as obtained from a spectral power distribution of light emitted in a main radiant direction to within an appropriate range and, at the same time, setting the index $A_{cg}$ to within an appropriate range.

In other words, the light-emitting device according to the present invention may be configured in any way as long as the light-emitting device includes light emitted from various light-emitting elements as a spectral component in a spectral power distribution in a main radiant direction and in which $D_{uv}$ derived from a spectral power distribution of light which is in the radiant direction and the index $A_{cg}$ are in appropriate ranges. For example, the device may be any of an individual illumination light source, an illuminating module in which at least one or more of the light sources is mounted on a heatsink or the like, and a lighting fixture in which a lens, a light-reflecting mechanism, a driving electric circuit, and the like are added to the light source or the module. Furthermore, the device may be a lighting system which is a collection of individual light sources, individual modules, individual fixtures, and the like and which at least has a mechanism for supporting such components.

INDUSTRIAL APPLICABILITY

The illumination method or the light-emitting device such as an illumination light source, a lighting fixture, a lighting system, and the like according to the present invention has an extremely wide field of application and may be used without being limited to particular uses. However, in consideration of the features of the illumination method or the light-emitting device according to the present invention, the illumination method or the light-emitting device according to the present invention is favorably applied to the following fields.

For example, when illuminated by the illumination method or the light-emitting device according to the present invention, white may be perceived as being whiter, more natural, and more comfortable as compared to a conventional illumination method or a conventional light-emitting device even at a similar CCT and a similar illuminance. Furthermore, differences in lightness among achromatic colors such as white, gray, and black become more visible.

As a result, for example, black letters or the like on an ordinary sheet of white paper become more legible. To utilize such features, favorable applications include a reading light, lighting for a writing desk, and work lighting such as office lighting. In addition, while work may conceivably involve performing a visual external examination of fine parts, distinguishing between near colors of cloth or the like, checking color in order to verify freshness of meat, performing a product inspection by comparing with a criteria sample, and the like at a factory or the like, illumination by the illumination method according to the present invention makes color identification among close hues easier and realizes a work environment that is as comfortable as though in a high-illuminance environment. Even from such a perspective, applications to work lighting are favorable.

Furthermore, since color discrimination ability increases, for example, applications to medical lighting such as a light source for surgical operations and a light source used in a gastroscope or the like are also favorable. While arterial blood is vivid red due to its high oxygen content, venous blood is dark red due to its high carbon dioxide content. Although arterial blood and venous blood are both red, chromas of the colors differ from each other. Therefore, with the illumination method or device according to the present invention which achieves favorable color appearance (chroma), it is expected that arterial blood and venous blood can be readily distinguished from each other. In addition, since it is obvious that favorable color representation in color image information such as an endoscope has a significant effect on diagnosis, it is expected that a normal location and a lesion location can be readily distinguished from each other. Due to similar reasons, the illumination method can be favorably applied to an illumination method inside industrial devices such as a product image judgment device.

When illuminated by the illumination method or the light-emitting device according to the present invention, a truly natural color appearance as though viewed under several tens of thousands of lx such as outdoor illuminance on a sunny day is achieved for a majority of, and in some cases, all colors such as purple, bluish purple, blue, greenish blue, green, yellowish green, yellow, reddish yellow, red, and reddish purple even when illuminance only ranges from around several thousand lx to several hundred lx. In addition, the skin color of the subjects (Japanese), various foods, clothing, wood colors, and the like which have intermediate chroma also acquire natural color appearances which many of the subjects feel more favorable.

Therefore, by applying the illumination method or the light-emitting device according to the present invention to ordinary lighting for homes and the like, it is conceivable that food may appear fresher and more appetizing, newspapers, magazines, and the like may become more legible, and visibility of differences in level in the house may increase, thereby contributing to improving home safety. Accordingly, the present invention is favorably applied to home lighting. In addition, the present invention is also favorable as exhibit lighting for clothing, food, vehicles, suitcases, shoes, ornaments, furniture, and the like, and enables lighting which makes such items stand out from their surroundings. The present invention is also favorable as lighting for goods such as cosmetics in which slight differences in color are the decisive factor when purchasing the goods. When used as exhibit lighting for white dresses and the like, since subtle differences in color become more visible such as a difference between bluish white and creamy white among similar whites, a person can select a color that is exactly according to his or her desire. Furthermore, the present invention is also favorable as presentation lighting at a wedding center, a theater, and the like, and enables a pure white dress or the like to be perceived as being pure white and kimonos, makeup, in kabuki or the like to appear vividly. The present invention also favorably highlights skin tones. In addition, by using the present invention as lighting in a hair salon, colors that are no different than those perceived outdoors can be obtained during hair coloring and excessive dyeing or insufficient dyeing can be prevented.

Furthermore, since white appears more white, achromatic colors can be readily distinguished, and chromatic colors attain their natural vividness, the present invention is also favorable as a light source in a location where a wide variety of activities are conducted in a given limited space. For example, passengers in an airplane read, work, and eat at their seats, Similar situations take place on a train, a long-distance bus, and the like. The present invention is favorably applicable as interior lighting in such public transport.

In addition, since white appears more white, achromatic colors can be readily distinguished, and chromatic colors attain their natural vividness, the present invention enables paintings and the like in an art museum or the like to be illuminated in a natural tone as though viewed outdoors and is therefore also favorable as lighting for works of art.

On the other hand, the present invention is also favorably applicable as lighting for aged persons. In other words, even in case where small characters are hard to read and difference in steps or the like are hard to see under normal illuminance, by applying the illumination method or the light-emitting device according to the present invention, such problems can be solved since achromatic colors and chromatic colors can be readily distinguished from one another. Therefore, the present invention is also favorably applicable to lighting in public facilities or the like which are used by the general public such as a waiting room in a retirement house or a hospital, a book store, and a library.

Furthermore, the illumination method or the light-emitting device according to the present invention can be favorably used in applications for securing visibility by adapting to an illumination environment in which illuminance is often at a relatively low level due to various circumstances.

For example, the illumination method or the light-emitting device according to the present invention is favorably applied to street lamps, head lights of vehicles, and foot lamps to increase visibility as compared to using conventional light sources.

While the invention has been described in detail and with reference to specific embodiments thereof, it will be apparent to one skilled in the art that various changes and modifications can be made therein without departing from the spirit and scope thereof.

The invention claimed is:

1. A light-emitting device incorporating a light-emitting element, wherein
   the light-emitting device includes a light-emitting element which has a peak within a short wavelength range from 380 nm to 495 nm, a light-emitting element which has a peak within an intermediate wavelength range from 495 nm to 590 nm, and a light-emitting element which has a peak within a long wavelength range from 590 nm to 780 nm,
   the light-emitting device includes at least one each of the light-emitting elements in said respective wavelength ranges, the light-emitting device includes two or more of the light-emitting elements in at least one selected from said wavelength ranges, the light emitted from the light-emitting device in the radiant direction satisfies (1)' and (2) below:

(1)' if an a* value and a b* value in CIE 1976 L*a*b* color space of 15 Munsell renotation color samples from #01 to #15 listed below when mathematically assuming illumination by the light emitted from the light-emitting device in the radiant direction are respectively denoted by $a^*_{nSSL}$ and $b^*_{nSSL}$ (where n is a natural number from 1 to 15), and an a* value and a b* value in CIE 1976 L*a*b* color space of the 15 Munsell renotation color samples when mathematically assuming illumination by a reference light that is selected according to a correlated color temperature $T_{SSL}$ (K) of the light emitted from the light-emitting device in the radiant direction are respectively denoted by $a^*_{nref}$ and $b^*_{nref}$ (where n is a natural number from 1 to 15), then each saturation difference $\Delta C_n$ satisfies $-2.7 \leq \Delta C_n \leq 18.6$ (where n is a natural number from 1 to 15), if a maximum saturation difference value is denoted by $\Delta C_{max}$ and a minimum saturation difference value is denoted by $\Delta C_{min}$, then a difference $|\Delta C_{max} - \Delta C_{min}|$ between the maximum saturation difference value and the minimum saturation difference value satisfies $3.0 \leq |\Delta C_{max} - \Delta C_{min}| \leq 19.6$, where $\Delta C_n = \sqrt{\{(a^*_{nSSL})^2 + (b^*_{nSSL})^2\}} - \sqrt{\{(a^*_{nref})^2 + (b^*_{nref})^2\}}$
with the 15 Munsell renotation color samples being:
01 7.5P 4/10
02 10PB 4/10
03 5PB 4/12
04 7.5B 5/10
05 10BG 6/8
06 2.5BG 6/10
07 2.5G 6/12
08 7.5GY 7/10
09 2.5GY 8/10
10 5Y 8.5/12
11 10YR 7/12
12 5YR 7/12
13 10R 6/12
14 5R 4/14
15 7.5RP 4/12; and (2) if hue angles in a CIE 1976 L*a*b* color space of the 15 Munsell renotation color samples when mathematically assuming illumination by the light emitted from the light-emitting device in the radiant direction are denoted by $\theta_{nSSL}$ (degrees) (where n is a natural number from 1 to 15), and hue angles in a CIE 1976 L*a*b* color space of the 15 Munsell renotation color samples when mathematically assuming illumination by a reference light that is selected according to the correlated color temperature $T_{SSL}$ (K) of the light emitted in the radiant direction are denoted by $\theta_{nref}$ (degrees) (where n is a natural number from 1 to 15), then an absolute value of each difference in hue angles $|\Delta h_n|$ satisfies $0 \leq |\Delta h_n| \leq 9.0$ (degrees)

(where n is a natural number from 1 to 15), where $\Delta h_n = \theta_{nSSL} - \theta_{nref}$.

2. The light-emitting device according to claim 1, wherein the light emitted from the light-emitting device in the radiant direction satisfies (1)" below:

(1)" an average saturation difference represented by formula (3) below satisfies formula (4) below $$\frac{\sum_{n=1}^{15} \Delta C_n}{15} \quad (3)$$

$$1.7 \leq \frac{\sum_{n=1}^{15} \Delta C_n}{15} \leq 7.0. \quad (4)$$

3. The light-emitting device according to claim 1, wherein a luminous efficacy of radiation K (lm/W) in a wavelength range from to 380 nm to 780 nm as derived from the spectral power distribution $\varphi_{SSL}(\lambda)$ of light emitted from the light-emitting device in the radiant direction satisfies $180(\text{lm/W}) \leq K(\text{lm/W}) \leq 320(\text{lm/W})$.

4. The light-emitting device according to claim 1, wherein a distance $D_{uvSSL}$ from a black-body radiation locus of the light emitted from the light-emitting device in the radiant direction satisfies $-0.0325 \leq D_{uvSSL} < 0$.

5. The light-emitting device according to claim 1, wherein the correlated color temperature $T_{SSL}$ (K) satisfies $2550(K) \leq T_{SSL}(K) \leq 5650(K)$.

6. A light-emitting device incorporating a light-emitting element, wherein the light-emitting device includes a light-emitting element which has a peak within a short wavelength range from 380 nm to 495 nm, a light-emitting element which has a peak within an intermediate wavelength range from 495 nm to 590 nm, and a light-emitting element which has a peak within a long wavelength range from 590 nm to 780 nm, the light-emitting device includes at least one each of the light-emitting elements in said respective wavelength ranges, the light-emitting device includes two or more of the light-emitting elements in at least one selected from said wavelength ranges, if a spectral power distribution of light emitted from the light-emitting device in a radiant direction is denoted by $\varphi_{SSL}(\lambda)$, a spectral power distribution of a reference light that is selected according to a correlated color temperature $T_{SSL}$ (K) of the light emitted from the light-emitting device in the radiant direction is denoted by $\varphi_{ref}(\lambda)$, tristimulus values of the light emitted from the light-emitting device in the radiant direction are denoted by $(X_{SSL}, Y_{SSL}, Z_{SSL})$, and tristimulus values of the reference light that is selected according to the correlated color temperature $T_{SSL}$ (K) of the light emitted from the light-emitting device in the radiant direction are denoted by $(X_{ref}, Y_{ref}, Z_{ref})$, and if a normalized spectral power distribution $S_{SSL}(\lambda)$ of light emitted from the light-emitting device in the radiant direction, a normalized spectral power distribution $S_{ref}(\lambda)$ of a reference light that is selected according to the correlated color temperature $T_{SSL}$ (K)

of the light emitted from the light-emitting device in the radiant direction, and a difference ΔS (λ) between these normalized spectral power distributions are respectively defined as $$S_{SSL}(\lambda)=\varphi_{SSL}(\lambda)/Y_{SSL},$$

$$S_{ref}(\lambda)=\varphi_{ref}(\lambda)/Y_{ref}$$

and $$\Delta S(\lambda)=S_{ref}(\lambda)-S_{SSL}(\lambda),$$

and in a case where a wavelength that produces a longest wavelength local maximum value of $S_{SSL}$ (λ) in a wavelength range of 380 nm to 780 nm is denoted by $\lambda_R$ (nm), then a wavelength Λ4 that assumes $S_{SSL}$ ($\lambda_R$)/2 exists on a longer wavelength-side of $\lambda_R$, an index $A_{cg}$ represented by formula (1) below satisfies $$-280 \leq A_{cg} \leq -26,$$

$$A_{cg}=\int_{380}^{495}\Delta S(\lambda)d\lambda+\int_{495}^{590}(-\Delta S(\lambda))d\lambda+\int_{590}^{\Lambda 4}\Delta S(\lambda)d\lambda \quad (1)$$

in a case where a wavelength that produces a longest wavelength local maximum value of $S_{SSL}$ (λ) in a wavelength range of 380 nm to 780 nm is denoted by $\lambda_R$ (nm), then a wavelength Λ4 that assumes $S_{SSL}$, ($\lambda_R$)/2 does not exist on a longer wavelength-side of $\lambda_R$, an index $A_{cg}$ represented by formula (2) below satisfies $$-280 \leq A_{cg} \leq -26$$

$$A_{cg}=\int_{380}^{495}\Delta S(\lambda)d\lambda+\int_{495}^{590}(-\Delta S(\lambda))d\lambda+\int_{590}^{780}\Delta S(\lambda)d\lambda \quad (2).$$

7. The light-emitting device according to claim 6, wherein
a. luminous efficacy of radiation K (lm/W) in a wavelength range from 380 nm to 780 nm as derived from the spectral power distribution $\varphi_{SSL}$ (λ) of light emitted from the light-emitting device in the radiant direction satisfies $$180(\text{lm/W}) \leq K(\text{lm/W}) \leq 320(\text{lm/W}).$$

8. The light-emitting device according to claim 6, wherein a distance $D_{uvSSL}$ from a black-body radiation locus of the light emitted from the light-emitting device in the radiant direction satisfies $$-0.0325 \leq D_{uvSSL} < 0.$$

9. The light-emitting device according to claim 6, wherein the correlated color temperature $T_{SSL}$ (K) satisfies $$2550(K) \leq T_{SSL}(K) \leq 5650(K).$$

10. An illumination method comprising: illuminated objects preparation step of preparing illuminated objects; and an illumination step of illuminating the objects by light emitted from light-emitting devices, wherein
the light-emitting device includes a light-emitting element which has a peak within a short wavelength range from 380 nm to 495 nm, a light-emitting element which has a peak within an intermediate wavelength range from 495 nm to 590 nm, and a light-emitting element which has a peak within a long wavelength range from 590 nm to 780 nm,
the light-emitting device includes at least one each of the light-emitting elements in said respective wavelength ranges,
the light-emitting device includes two or more of the light-emitting elements in at least one selected from said wavelength ranges,
in the illumination step, when light emitted from the light-emitting devices illuminate the objects, the objects are illuminated so that the light measured at a position of the objects satisfies (2)' and (3) below:
(2)' if an a* value and a b* value in CIE 1976 L*a*b* color space of 15 Munsell renotation color samples from #01 to #15 listed below when mathematically assuming illumination by the light measured at the position of the objects are respectively denoted by $a^*_{nSSL}$ and $b^*_{nSSL}$ (where n is a natural number from 1 to 15), and
if an a* value and a b* value in CIE 1976 L*a*b* color space of the 15 Munsell renotation color samples when mathematically assuming illumination by a reference light that is selected according to a correlated color temperature $T_{SSL}$ (K) of the light measured at the position of the objects are respectively denoted by $a^*_{nref}$ and $b^*_{nref}$ (where n is a natural number from 1 to 15), then each saturation difference $\Delta C_n$ satisfies $$-2.7 \leq \Delta C^n \leq 18.6$$

(where n is a natural number from 1 to 15),
if a maximum saturation difference value is denoted by $\Delta C_{max}$ and a minimum saturation difference value is denoted by $\Delta C_{min}$, then a difference $|\Delta C_{max}-\Delta C_{min}|$ between the maximum saturation difference value and the minimum saturation difference value satisfies $$3.0 \leq |\Delta C_{max}-\Delta C_{min}| \leq 19.6,$$

where $\Delta C_n = \sqrt{\{(a^*_{nSSL})^2+(b^*_{nSSL})^2\}} - \sqrt{\{(a^*_{nref})^2+(b^*_{nref})^2\}}$
with the 15 Munsell renotation color samples being:
01 7.5P 4/10
02 10PB 4/10
03 5PB 4/12
04 7.5B 5/10
05 10BG 6/8
06 2.5BG 6/10
07 2.5G 6/12
08 7.5GY 7/10
09 2.5GY 8/10
10 5Y 8.5/12
11 10YR 7/12
12 5YR 7/12
13 10R 6/12
14 5R 4/14
15 7.5RP 4/12
(3) if hue angles in CIE 1976 L*a*b* color space of the 15 Munsell renotation color samples when mathematically assuming illumination by the light measured at the position of the objects are denoted by $\theta_{nSSL}$ (degrees) (where n is a natural number from 1 to 15), and
if hue angle in CIE 1976 L*a*b* color space of the 15 Munsell renotation color samples when mathematically assuming illumination by a reference light that is selected according to the correlated color temperature $T_{SSL}$ (K) of the light measured at the position of the objects are denoted by $\theta_{nref}$ (degrees) (where n is a natural number from 1 to 15), then an absolute value of each difference in hue angles $|\Delta h_n|$ satisfies $$0 \leq |\Delta h_n| \leq 9.0 \text{ (degrees)}$$

(where n is a natural number from 1 to 15),
where $\Delta h_n = \theta_{nSSL} - \theta_{nref}$.
11. The illumination method according to claim 10, wherein in the illumination step, when the light emitted from the light-emitting devices illuminate the objects, the objects are illuminated so that the light measured at a position of the objects satisfies (2)" below:

(2)" an average saturation difference represented by formula (1) below satisfies formula (2) below $$\frac{\sum_{n=1}^{15} \Delta C_n}{15} \quad (1)$$

$$1.7 \leq \frac{\sum_{n=1}^{15} \Delta C_n}{15} \leq 7.0. \quad (2)$$

* * * * *

UNITED STATES PATENT AND TRADEMARK OFFICE
CERTIFICATE OF CORRECTION

PATENT NO. : 9,997,677 B2
APPLICATION NO. : 15/582783
DATED : June 12, 2018
INVENTOR(S) : Hideyoshi Horie Page 1 of 1

It is certified that error appears in the above-identified patent and that said Letters Patent is hereby corrected as shown below:

Column 83, Line 22,

"$$A_{cg} = \int_{380}^{495} \Delta S(\lambda) d\lambda + \int_{495}^{590} (-\Delta S(\lambda)) d\lambda + \int_{590}^{\wedge 4} \Delta S(\lambda) d\lambda \quad (1)\text{"}$$

should read --

$$A_{cg} = \int_{380}^{495} \Delta S(\lambda) d\lambda + \int_{495}^{590} (-\Delta S(\lambda)) d\lambda + \int_{590}^{\wedge 4} \Delta S(\lambda) d\lambda \quad (1). --$$

Column 83, Line 34,

"$$A_{cg} = \int_{380}^{495} \Delta S(\lambda) d\lambda + \int_{495}^{590} (-\Delta S(\lambda) d\lambda + \int_{590}^{780} \Delta S(\lambda) d\lambda \quad (2)\text{"}$$

should read --

$$A_{cg} = \int_{380}^{495} \Delta S(\lambda) d\lambda + \int_{495}^{590} (-\Delta S(\lambda)) d\lambda + \int_{590}^{780} \Delta S(\lambda) d\lambda \quad (2). --$$

Signed and Sealed this
Eleventh Day of December, 2018

Andrei Iancu
*Director of the United States Patent and Trademark Office*